(12) United States Patent
Caveney et al.

(10) Patent No.: US 8,628,154 B2
(45) Date of Patent: Jan. 14, 2014

(54) AISLE CONTAINMENT SYSTEM

(75) Inventors: Jack E. Caveney, North Palm Beach, FL (US); Mark Shurhay, Westchester, IL (US); Darren J. Reigle, Frankfort, IL (US); William A. Bernard, Darien, IL (US); Max W. Hibner, Glenview, IL (US)

(73) Assignee: Panduit Corp., Tinley Park, IL (US)

( * ) Notice: Subject to any disclaimer, the term of this patent is extended or adjusted under 35 U.S.C. 154(b) by 222 days.

(21) Appl. No.: 13/105,169

(22) Filed: May 11, 2011

(65) Prior Publication Data

US 2011/0278998 A1 Nov. 17, 2011

Related U.S. Application Data

(60) Provisional application No. 61/334,220, filed on May 13, 2010, provisional application No. 61/366,797, filed on Jul. 22, 2010, provisional application No. 61/428,509, filed on Dec. 30, 2010, provisional application No. 61/432,010, filed on Jan. 12, 2011.

(51) Int. Cl.
*A47B 55/00* (2006.01)

(52) U.S. Cl.
USPC .................. 312/198; 52/36.2; 52/67; 52/460

(58) Field of Classification Search
USPC ........... 52/67, 36.1, 36.2, 460, 461, 762, 764, 52/173.1; 361/688; 312/198
See application file for complete search history.

(56) References Cited

U.S. PATENT DOCUMENTS

| | | | | |
|---|---|---|---|---|
| 1,984,028 A | | 12/1934 | Macleod | |
| 2,066,205 A | | 12/1936 | Keating | |
| RE22,431 E | * | 2/1944 | Sloan, Jr. | 52/67 |
| 2,520,499 A | * | 8/1950 | Golaz | 52/460 |
| 2,924,856 A | | 2/1960 | Price | |
| 3,355,206 A | | 11/1967 | Valsvik | |
| 3,475,869 A | | 11/1969 | Jahn | |
| 3,602,473 A | | 8/1971 | Van Riet et al. | |
| 3,889,435 A | | 6/1975 | Ollinger | |
| 3,945,157 A | * | 3/1976 | Borys | 52/36.2 |

(Continued)

FOREIGN PATENT DOCUMENTS

| DE | 202008010718 U1 | 2/2009 |
|---|---|---|
| DE | 102008024973 B3 | 9/2009 |

(Continued)

OTHER PUBLICATIONS

Electrorack "Contain-It Aisle Containment System", www.electrorack.com/contain-It, printed Mar. 8, 2010, 5 pages.

(Continued)

*Primary Examiner* — Joshua J Michener
*Assistant Examiner* — Matthew Gitlin
(74) *Attorney, Agent, or Firm* — Christopher S. Clancy; Aimee E. McVady

(57) ABSTRACT

The aisle containment system is mounted to two rows of equal width cabinets or cabinets varying in width between 600 mm, 700 mm and 800 mm. The aisle containment system includes door assemblies on both ends of the cabinet rows, vertical panels that mount to the cabinets and door frames to support the ceiling, cross tees that span the aisle, and ceiling panels. Additional cabinets of equal or varying width may be added to an aisle containment installation.

19 Claims, 68 Drawing Sheets

(56) References Cited

U.S. PATENT DOCUMENTS

| | | | |
|---|---|---|---|
| 3,986,314 | A | 10/1976 | Moeller |
| 3,988,871 | A | 11/1976 | Moomey |
| 4,802,321 | A | 2/1989 | Menchetti |
| 5,469,681 | A | 11/1995 | Wu |
| 6,034,873 | A | 3/2000 | Ståhl et al. |
| 6,138,416 | A | 10/2000 | Platt |
| 6,205,733 | B1 | 3/2001 | LaLonde |
| 6,672,955 | B2 | 1/2004 | Charron |
| 6,745,536 | B2 | 6/2004 | Tallman et al. |
| 6,851,238 | B2 | 2/2005 | Rebman |
| 6,859,366 | B2 | 2/2005 | Fink |
| 6,867,967 | B2 | 3/2005 | Mok |
| 6,980,433 | B2 | 12/2005 | Fink |
| 7,046,514 | B2 | 5/2006 | Fink et al. |
| 7,085,133 | B2 | 8/2006 | Hall |
| 7,145,772 | B2 | 12/2006 | Fink |
| 7,173,820 | B2 | 2/2007 | Fink et al. |
| 7,259,963 | B2 | 8/2007 | Germagian et al. |
| 7,430,118 | B1 | 9/2008 | Noteboom et al. |
| 7,500,911 | B2 | 3/2009 | Johnson et al. |
| 7,529,086 | B2 | 5/2009 | Fink et al. |
| 7,534,167 | B2 | 5/2009 | Day |
| 7,551,971 | B2 | 6/2009 | Hillis |
| 7,656,660 | B2 | 2/2010 | Hoeft et al. |
| 7,672,128 | B2 | 3/2010 | Noteboom et al. |
| 7,684,193 | B2 | 3/2010 | Fink et al. |
| 7,712,274 | B2 | 5/2010 | Wendt et al. |
| 7,724,513 | B2 | 5/2010 | Coglitore et al. |
| 7,738,251 | B2 | 6/2010 | Clidaras et al. |
| 7,800,900 | B1* | 9/2010 | Noteboom et al. ...... 361/679.47 |
| 7,841,199 | B2 | 11/2010 | VanGilder et al. |
| 7,856,838 | B2* | 12/2010 | Hillis et al. .................. 62/259.2 |
| 7,878,889 | B2 | 2/2011 | Day |
| 7,881,057 | B2 | 2/2011 | Fink et al. |
| 7,944,692 | B2* | 5/2011 | Grantham et al. ............ 361/688 |
| 8,031,468 | B2* | 10/2011 | Bean et al. .................... 361/696 |
| 8,072,780 | B1* | 12/2011 | Roy ............................... 361/825 |
| 8,184,435 | B2* | 5/2012 | Bean et al. .................... 361/696 |
| 2003/0050003 | A1 | 3/2003 | Charron |
| 2009/0107652 | A1 | 4/2009 | VanGilder et al. |
| 2009/0129000 | A1 | 5/2009 | Hoeft et al. |
| 2009/0138313 | A1 | 5/2009 | Morgan et al. |
| 2009/0151910 | A1 | 6/2009 | Kwon et al. |
| 2009/0168345 | A1 | 7/2009 | Martini |
| 2009/0173017 | A1 | 7/2009 | Hall |
| 2009/0210096 | A1 | 8/2009 | Stack et al. |
| 2009/0277605 | A1 | 11/2009 | VanGilder et al. |
| 2009/0319650 | A1 | 12/2009 | Collins et al. |
| 2010/0048119 | A1* | 2/2010 | Tashiro .......................... 454/184 |
| 2010/0061057 | A1 | 3/2010 | Dersch et al. |
| 2010/0064714 | A1* | 3/2010 | Tashiro .......................... 62/259.2 |
| 2010/0144265 | A1 | 6/2010 | Bednarcik et al. |
| 2010/0188816 | A1 | 7/2010 | Bean, Jr. et al. |
| 2010/0216388 | A1 | 8/2010 | Tresh et al. |
| 2010/0248609 | A1* | 9/2010 | Tresh et al. ................... 454/184 |
| 2010/0263830 | A1* | 10/2010 | Noteboom et al. ........... 165/80.2 |
| 2010/0300648 | A1* | 12/2010 | Grantham ........................ 165/55 |
| 2010/0307716 | A1* | 12/2010 | Bean et al. .................... 165/80.2 |
| 2010/0315775 | A1* | 12/2010 | Grantham et al. ............ 361/688 |
| 2011/0103014 | A1 | 5/2011 | Fink et al. |
| 2011/0108207 | A1* | 5/2011 | Mainers et al. .................. 160/87 |
| 2011/0122561 | A1* | 5/2011 | Pierson et al. ............ 361/679.02 |
| 2011/0271610 | A1* | 11/2011 | Cottuli et al. ................. 52/173.1 |
| 2011/0278999 | A1* | 11/2011 | Caveney et al. ............... 312/198 |
| 2011/0299242 | A1* | 12/2011 | Grantham et al. ............ 361/688 |
| 2012/0012283 | A1* | 1/2012 | Bean et al. ................. 165/104.33 |
| 2012/0181906 | A1* | 7/2012 | Caveney ........................ 312/237 |
| 2012/0229972 | A1* | 9/2012 | Bean et al. ............... 361/679.46 |

FOREIGN PATENT DOCUMENTS

| | | |
|---|---|---|
| DE | 102009003652 A1 | 9/2010 |
| EP | 2059105 A1 | 5/2009 |
| JP | 57068100 A2 | 4/1982 |
| JP | 11223358 A | 8/1999 |
| JP | 2002016136 A | 1/2002 |
| JP | 2002156136 A | 5/2002 |
| JP | 2003166729 A | 6/2003 |
| JP | 2004184070 | 2/2004 |
| WO | 2009059649 A1 | 5/2009 |
| WO | 2009059795 A1 | 5/2009 |
| WO | 2009059796 A1 | 5/2009 |
| WO | 2009141029 A1 | 11/2009 |

OTHER PUBLICATIONS

Wright Line "Independent Containment System", undated, 1 page.
Press Release "Wright Line to Feature Independent Containment System at AFCOM Event", www.prweb.com/releases/datacenter/thermalmanagement/rpweb3695044, Mar. 8, 2010, 4 pages.
Wright Line "Aisle Containment Ceiling", 2009, 3 pages.
Minkels "Cold Corridor Solution", undated, 5 pages.
ProSource Technical Services "PolarPlex™ Cold Aisle Containment", undated 1 page.
Polargy "Hot and Cold Aisle Containment Systems", www.polargy.com/products/polarplex/containment.php, printed Dec. 23, 2009, 6 pages.
APC "Hot Aisle Containment System Retrofittable Ceiling Assembly", Jul. 31, 2008, 1 page.
Rittal "Cold Aisle Containment", www.42u.com/cooling/cold-aisle-containment/rittal-cold-aisle-containment.htm, printed Dec. 17, 2009, 4 pages.
Liebert "Cold Aisle Containment", www.42u.com/cooling/cold-aisle-containment/liebert-cold-aisle-containment.htm, printed Dec. 17, 2009, 5 pages.
Knürr "CoolFlex-Cold Aisle Containment", www.knurr.com/web/en/products/coolflex/coolflex-cold-aisle-containmnet.html, printed Mar. 1, 2010, 4 pages.
Emerson Electric Co. "Knürr CoolFlex® Cold Aisle Containment", 2008, 6 pages.

* cited by examiner

AISLE CONTAINMENT SYSTEM

CROSS REFERENCE TO RELATED APPLICATIONS

This application claims priority to U.S. Provisional Application No. 61/334,220, filed May 13, 2010; U.S. Provisional Application No. 61/366,797, filed Jul. 22, 2010; U.S. Provisional Application No. 61/428,509, filed Dec. 30, 2010; and U.S. Provisional Application No. 61/432,010, filed Jan. 12, 2011, the subject matter of which is hereby incorporated by reference in its entirety.

BACKGROUND OF THE INVENTION

The present invention relates to an aisle containment system. More particularly, the present invention relates to an aisle containment system that mounts to two rows of equal width cabinets or cabinets varying in width between 600 mm, 700 mm and 800 mm.

SUMMARY OF THE INVENTION

The present invention is directed to an aisle containment system. The aisle containment system includes a plurality of cabinets, a ceiling structure and a door assembly. The ceiling structure and the door assembly are adjustable for placement with cabinets having varying widths. The cabinets have a front, a back, sides, a bottom and a top. The cabinets are arranged in a first row and a second row across from the first row defining an aisle therebetween. The ceiling structure includes a plurality of vertical panels. Each vertical panel has a top flange and a bottom flange. The bottom flange is secured to a front edge of the top of one of the cabinets. The top flange has a plurality of slots that extend the length of the vertical panel. The slots are positioned to accommodate opposing cabinets that have different widths. The door assembly includes a frame secured to the sides of the cabinets at the end of the aisle, a transom secured to the ceiling structure at the end of the aisle and doors secured to the frame for sealing the end of the aisle.

DETAILED DESCRIPTION

Figure 1:
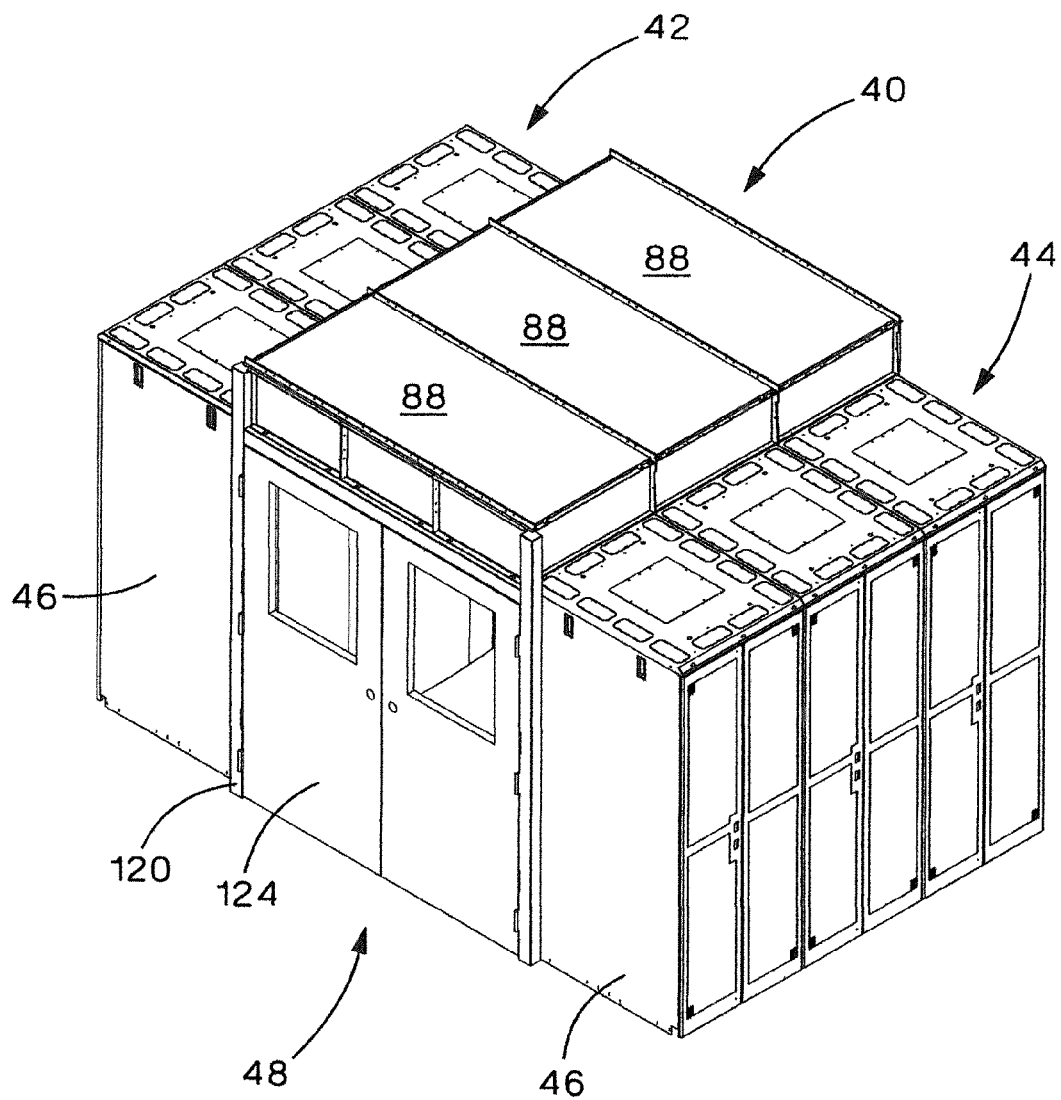
FIG. 1 is a perspective view of an aisle containment system according to an embodiment of the present invention.
Figure 2:
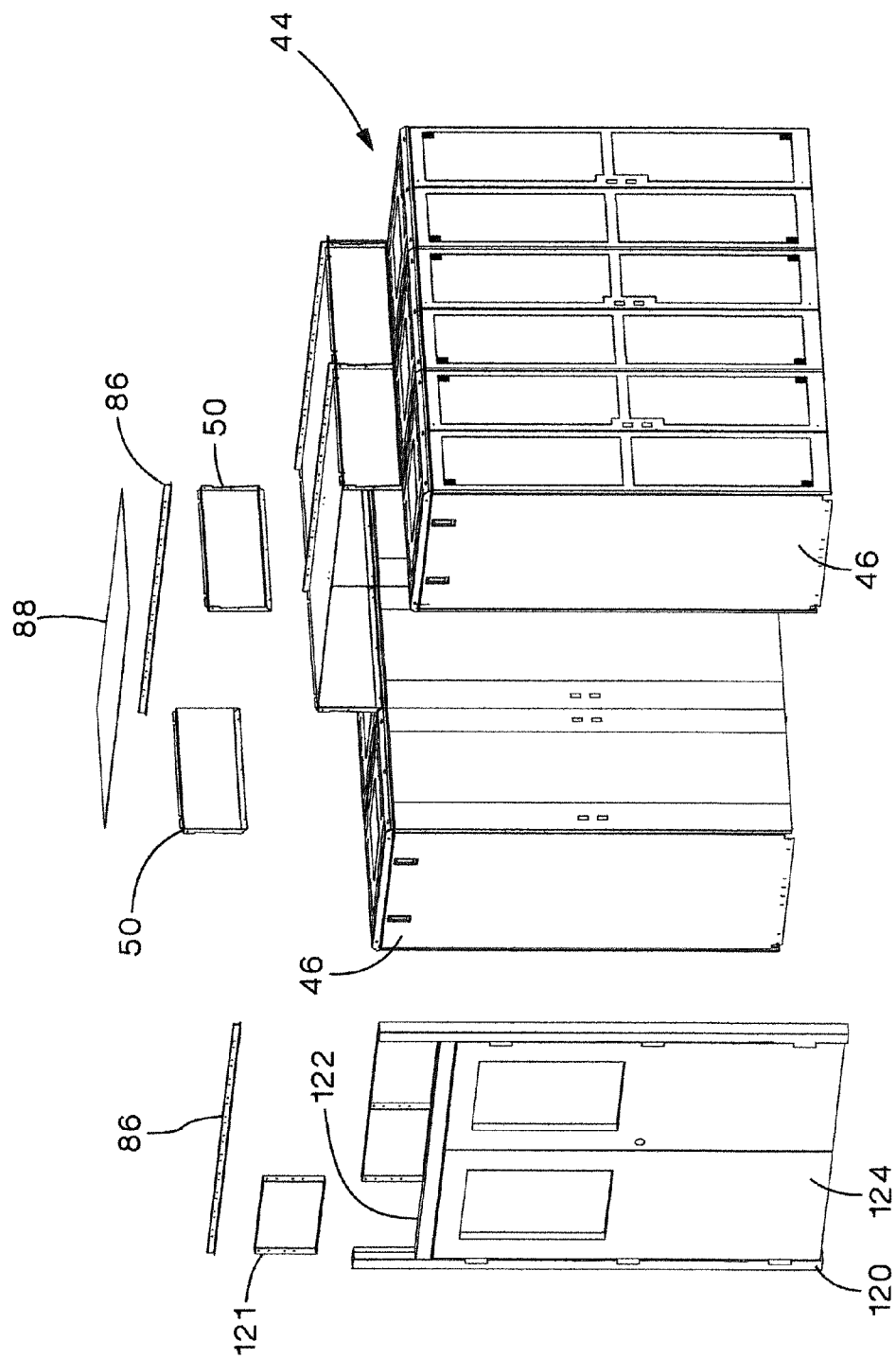
FIG. 2 is a partially exploded perspective view of the aisle containment system of FIG. 1.

FIGS. 1-33 illustrate an aisle containment system 40 according to an embodiment of the present invention. As shown in FIG. 1, aisle containment system 40 is mounted to two rows 42, 44 of three equal width cabinets 46 (800 mm shown). However, the cabinet widths may be any combination of 600 mm, 700 mm and 800 mm. Preferably, the aisle width is 6 feet. Aisle containment system 40 includes a door assembly 48 on each end of each row 42, 44, cabinet vertical panels, door frame vertical panels, cross tees and ceiling panels.

Figure 3:
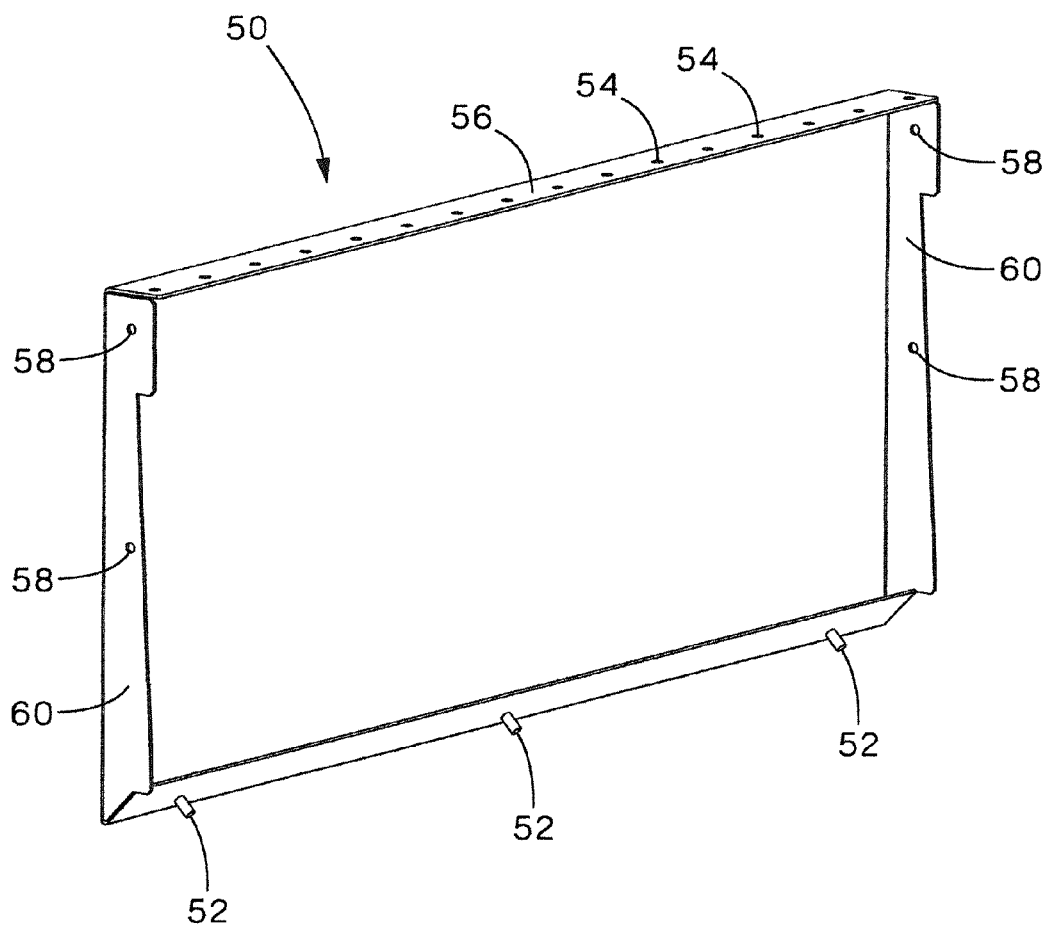
FIG. 3 is a perspective view of a cabinet vertical panel for the aisle containment system of FIG. 1.

FIG. 3 shows vertical panel 50 that attaches to the top of a cabinet, such as Panduit Corp.'s Net-Access™ cabinet. Vertical panel 50 includes three mounting studs 52 on the bottom surface that match the standard mounting holes on top of the cabinet. Pairs of extruded tapped holes 54 are spaced at 100 mm increments on top flange 56 of vertical panel 50 for securing cross tees to top flange 56, because 100 mm is the largest common multiple of the cabinet widths of 600 mm, 700 mm and 800 mm. In one configuration, the spacing between each tapped hole 54 is 50 mm. Vertical panel 50 may also include extruded tapped holes 58 on its side flanges 60 for securing adjacent vertical panels 50.

Figure 4:
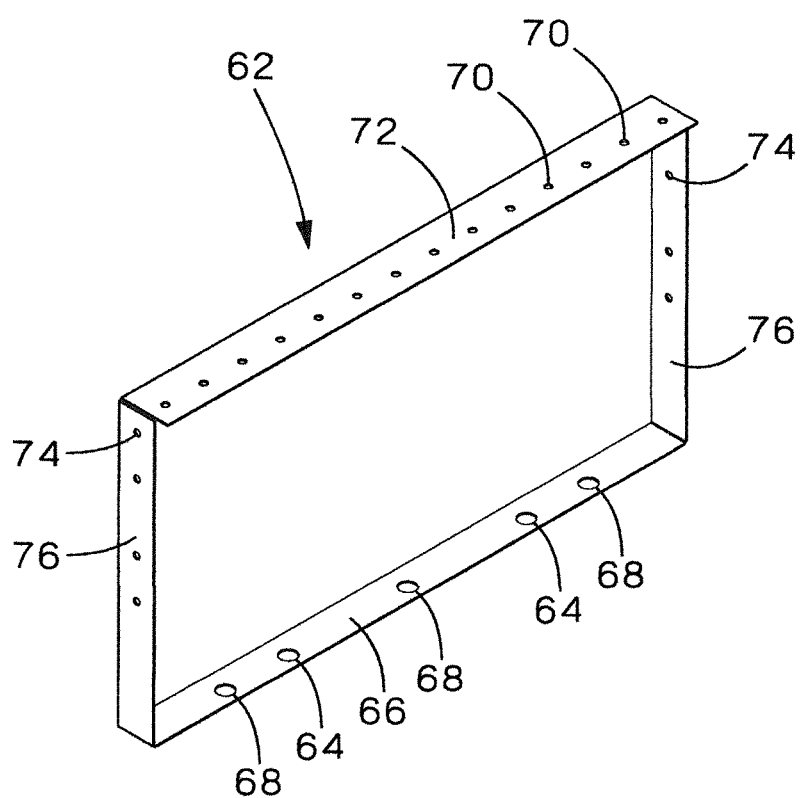
FIG. 4 is a perspective view of an alternate cabinet vertical panel for the aisle containment system of FIG. 1.

FIG. 4 shows vertical panel 62 that attaches to the top of a cabinet, such as Panduit Corp.'s Net-Serv™ cabinet. Vertical panel 62 includes two mounting holes 64 on bottom flange 66 that are used to bolt vertical panel 62 to the top of the cabinet of corresponding width. Bottom flange 66 also includes three clearance holes 68 that allow for clearance around the head of fasteners that attach the top of the cabinet to the frame. Specifically, Panduit Corp.'s Net-Serv™ cabinet has bolts with washers that stand about 3/16 inches above the top of the cabinet. Pairs of extruded tapped holes 70 are spaced at 100 mm increments on top flange 72 of vertical panel 62 for securing cross tees to top flange 72, because 100 mm is the largest common multiple of the cabinet widths of 600 mm, 700 mm and 800 mm. In one configuration, the spacing between each tapped hole 70 is 50 mm. Vertical panel 62 may also include extruded tapped holes 74 on its side flanges 76 for securing adjacent vertical panels 62.

Figure 5:
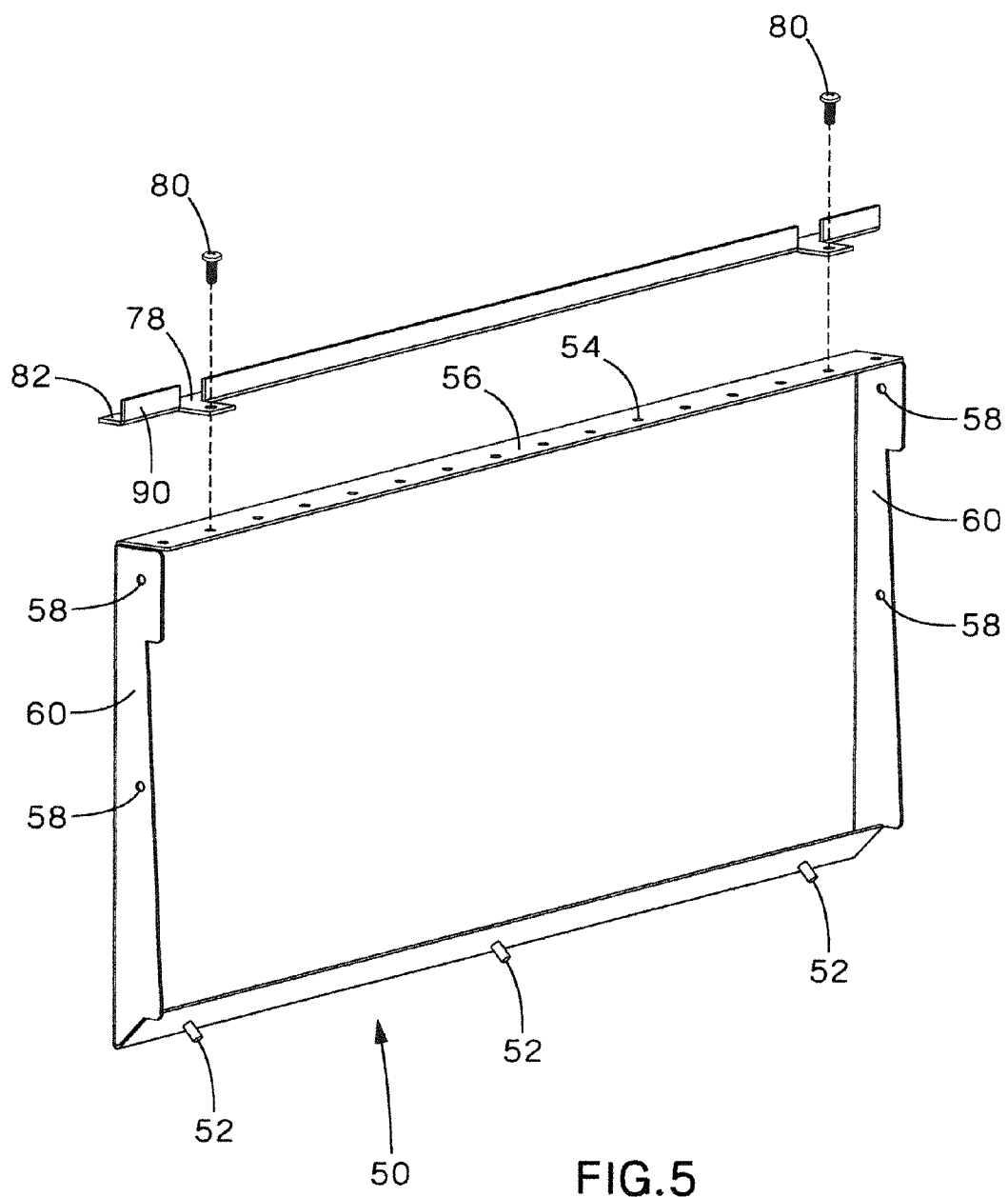
FIG. 5 is a perspective view of the cabinet vertical panel of FIG. 3, before a right angle spacer bar is mounted to the cabinet vertical panel.
Figure 6:
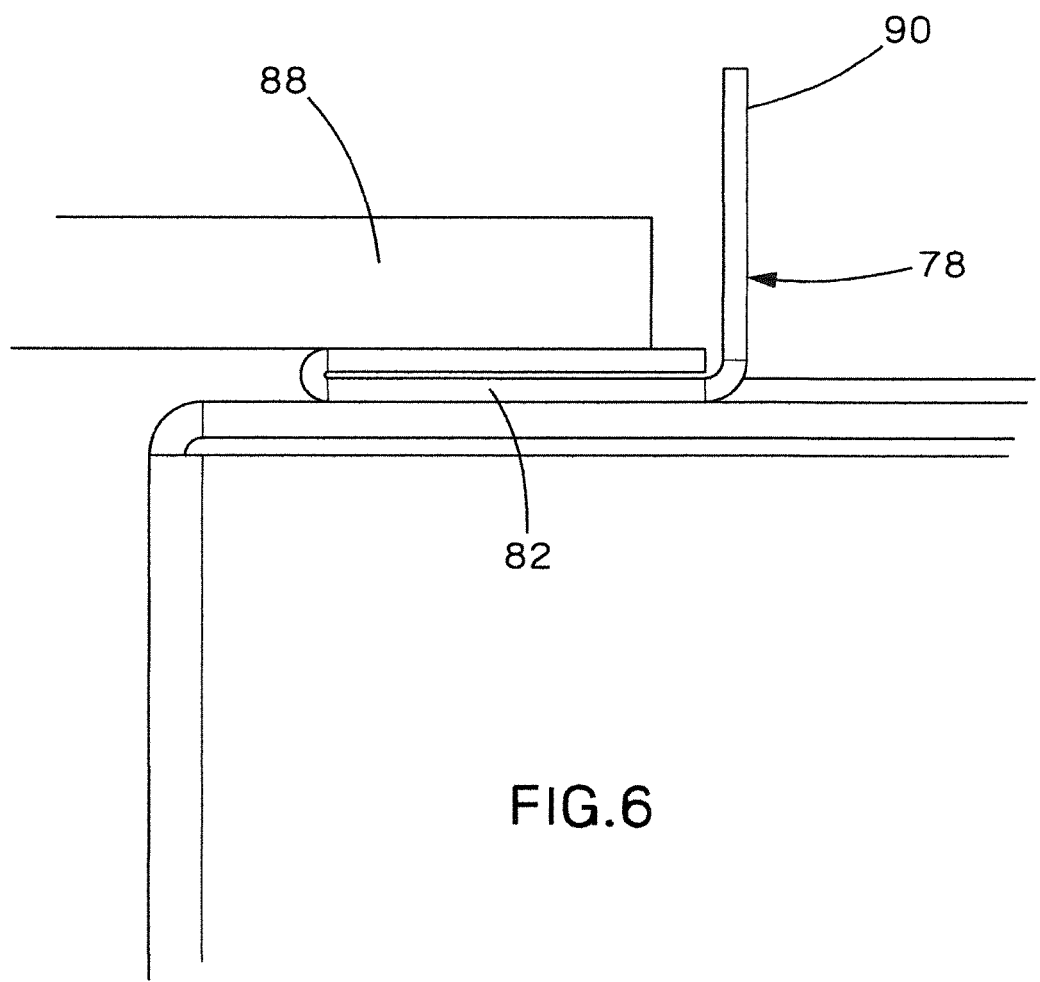
FIG. 6 is a cross-sectional view of the cabinet vertical panel of FIG. 3, after the right angle spacer bar is mounted to the cabinet vertical panel.

As shown in FIGS. 5 and 6, vertical panels 50 have a right angle spacer bar 78 mounted to top flange 56 with screws 80. Right angle spacer bar 78 may vary in size to accommodate 600 mm, 700 mm and 800 mm vertical panels. The thickness of flange 82 is the same thickness as flange 84 of cross tee 86, which creates a flat plane for sealing the perimeter of ceiling panel 88. Right angle spacer bar 78 also provides stop 90 that contains ceiling panel 88 in the proper position.

Figure 9:
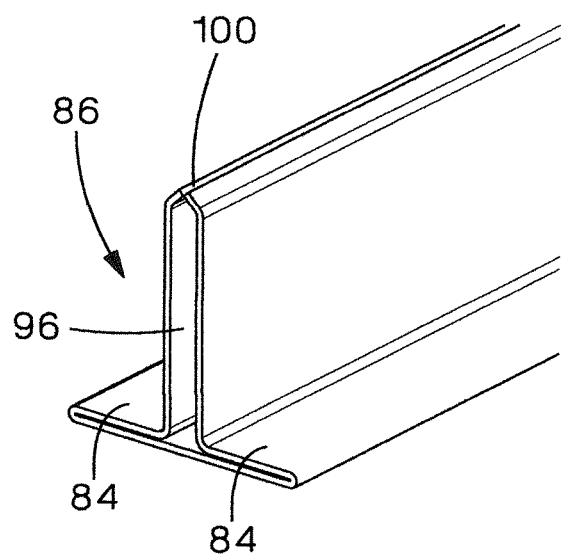
FIG. 9 is an enlarged perspective view of an end portion of the cross tee of FIG. 7.
Figure 10:
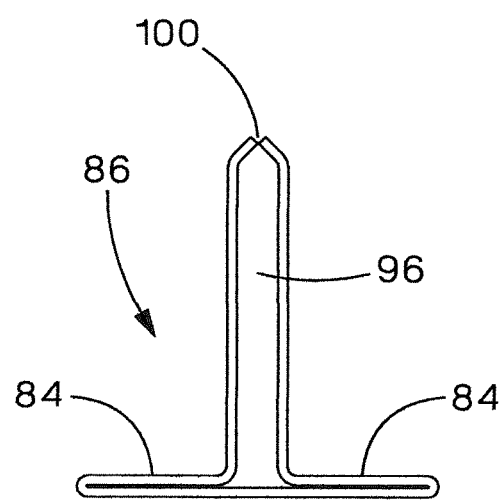
FIG. 10 is an end view of the cross tee of FIG. 9.
Figure 11:
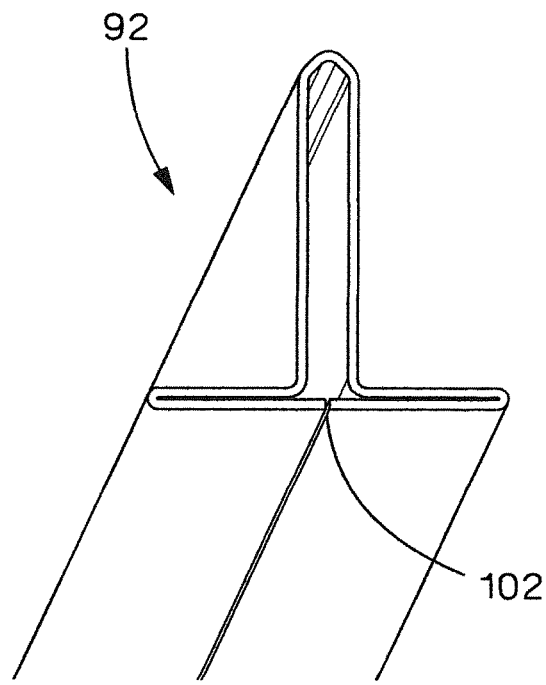
FIG. 11 is a perspective view of an end portion of an alternate cross tee for the aisle containment system of FIG. 1.
Figure 12:
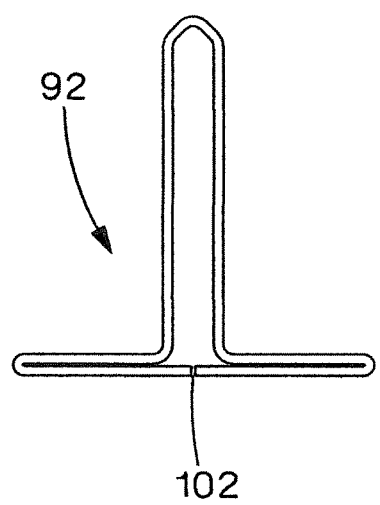
FIG. 12 is an end view of the cross tee of FIG. 11.
Figure 13:
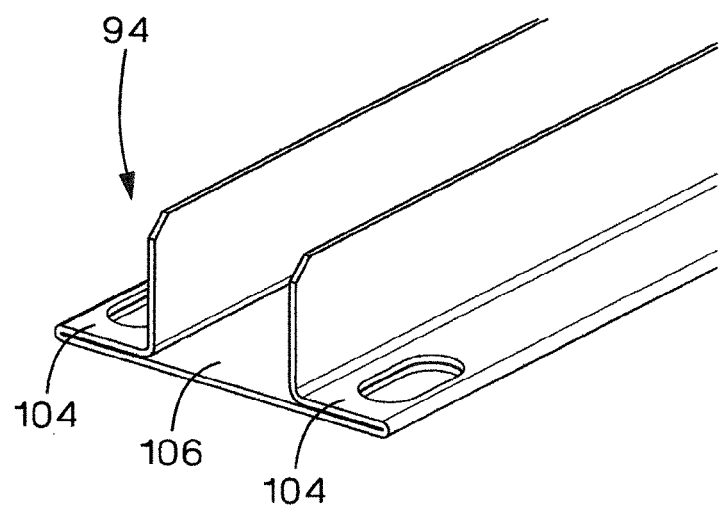
FIG. 13 is a perspective view of an end portion of an alternate cross beam for the aisle containment system of FIG. 1.
Figure 14:
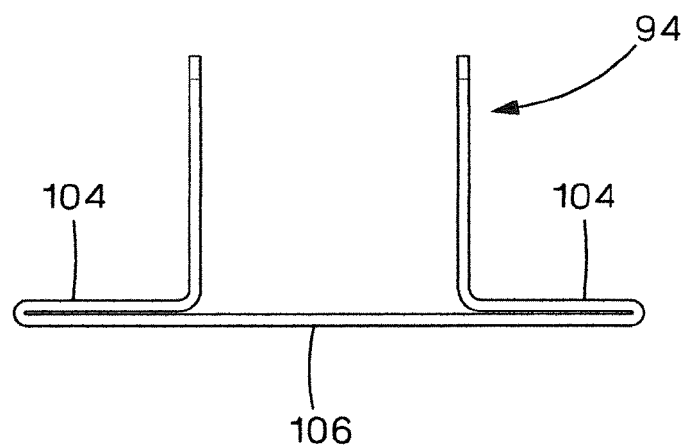
FIG. 14 is an end view of the cross beam of FIG. 13

FIGS. 7-14 show two cross tees and a cross beam. FIGS. 7-10 show cross tee 86; FIGS. 11 and 12 show cross tee 92; and FIGS. 13 and 14 show cross beam 94.

Figure 7:
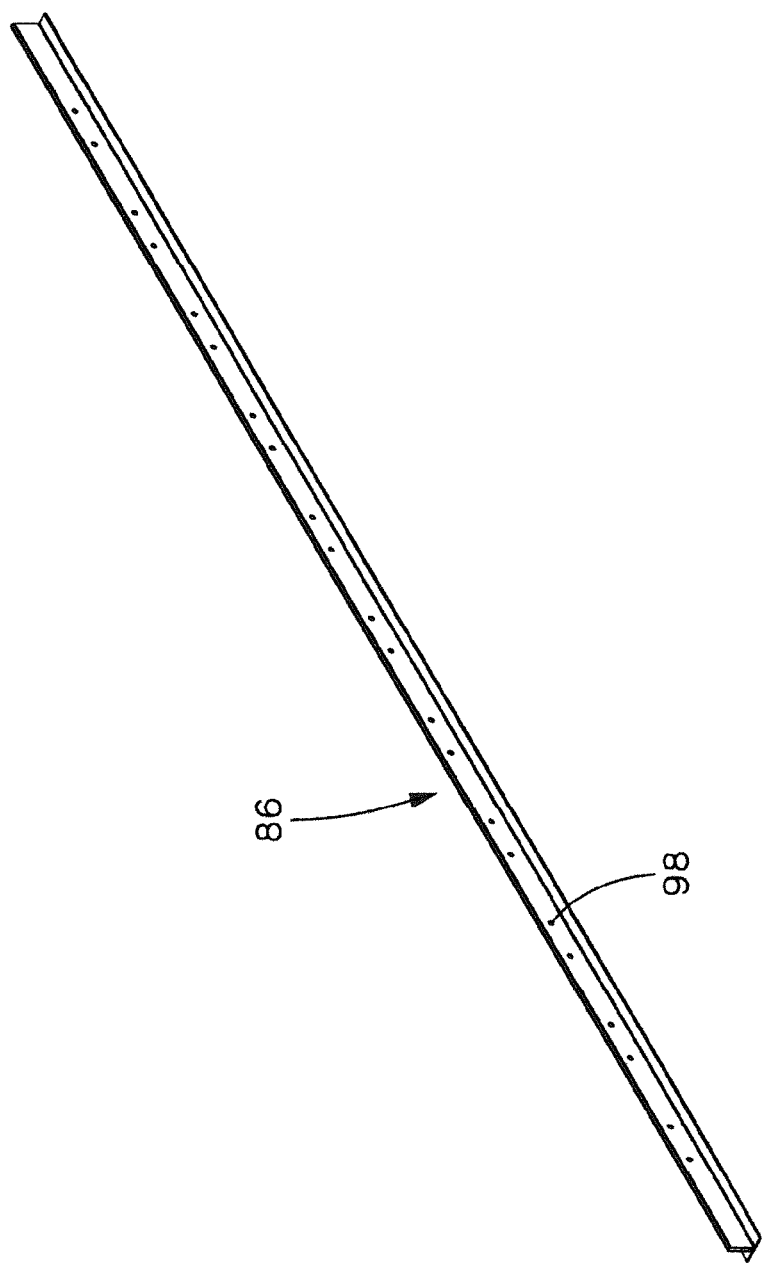
FIG. 7 is a perspective view of a cross tee for the aisle containment system of FIG. 1.
Figure 8:
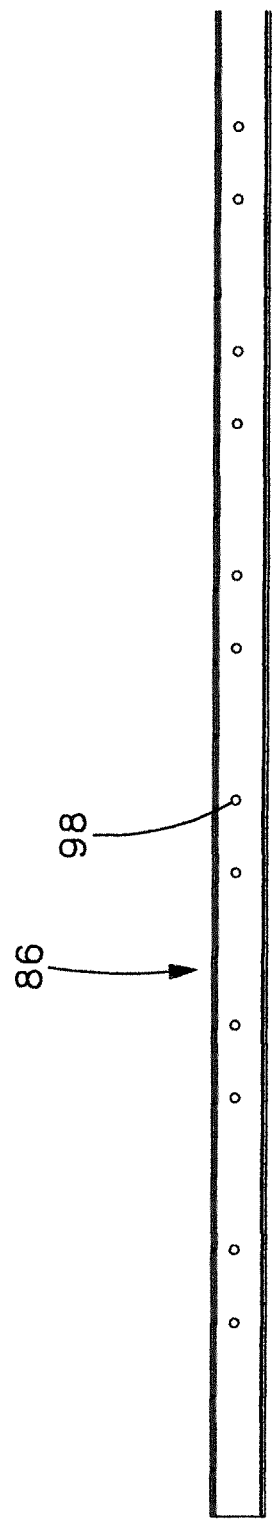
FIG. 8 is a side view of a portion of the cross tee of FIG. 7.

FIGS. 9 and 10 show cross tee 86 having a flange 84 on each side of center vertical web 96. Center vertical web 96 provides strength and stiffness to minimize deflection of cross tee 86 under load, and flanges 84 support ceiling panels 88. As shown in FIGS. 7 and 8, center vertical web 96 may include mounting holes 98 for securing secondary cross tees to cross tee 86. Preferably, cross tee 86 is 1.5 inches wide, with each flange 84 being 0.625 inches wide and center vertical web 96 being 0.25 inches wide. Also, cross tee 86 is preferably 1.55 inches in height. As best seen in FIG. 10, seam 100 is located at the apex of center vertical web 96.

FIGS. 11 and 12 show cross tee 92. Cross tee 92 is identical to cross tee 86, except seam 102 is located on the flange side of cross tee 92.

FIGS. 13 and 14 show cross beam 94. Cross beam 94 is wider than cross tees 86 and 92. Preferably, cross beam 94 is 2.39 inches wide, with each flange 104 being 0.625 inches wide and center vertical web 106 being 1.14 inches wide.

Figure 15:
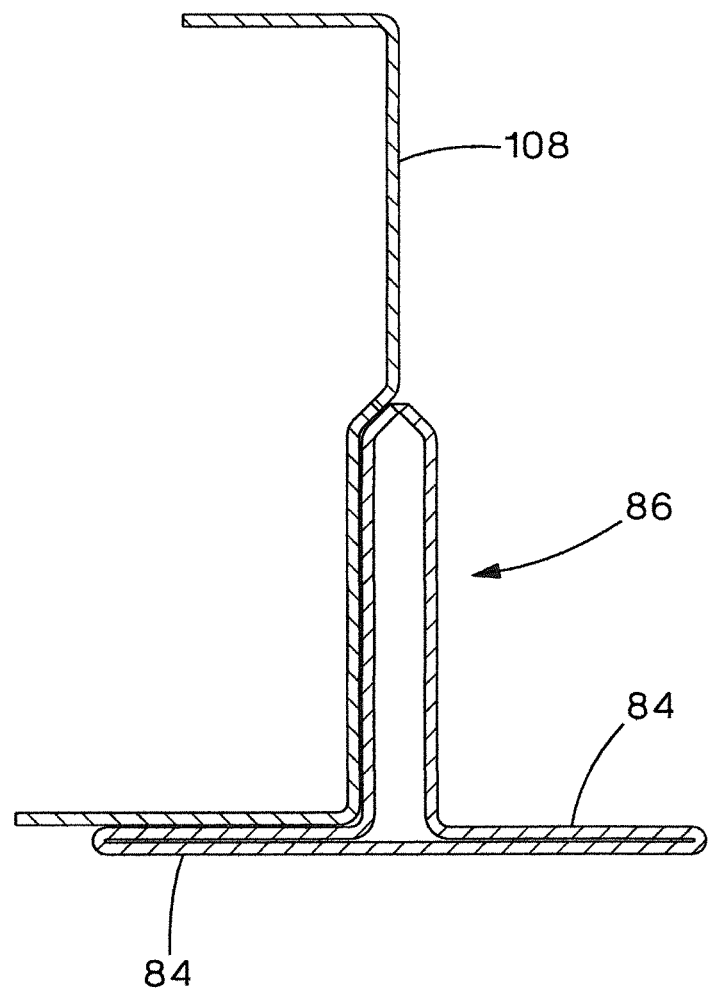
FIG. 15 is an end view of the cross tee of FIG. 10 supporting a ceiling light fixture box frame.

In a raised floor environment, no ceiling ducts or grates are required for an aisle containment installation. However, in a slab floor environment, ducts are required and light fixtures in the ceiling may be required. FIG. 15 shows that the profile of cross tee 86 is compatible with a standard suspended ceiling light fixture frame 108, which accommodates standard fluorescent fixtures.

Figure 16:
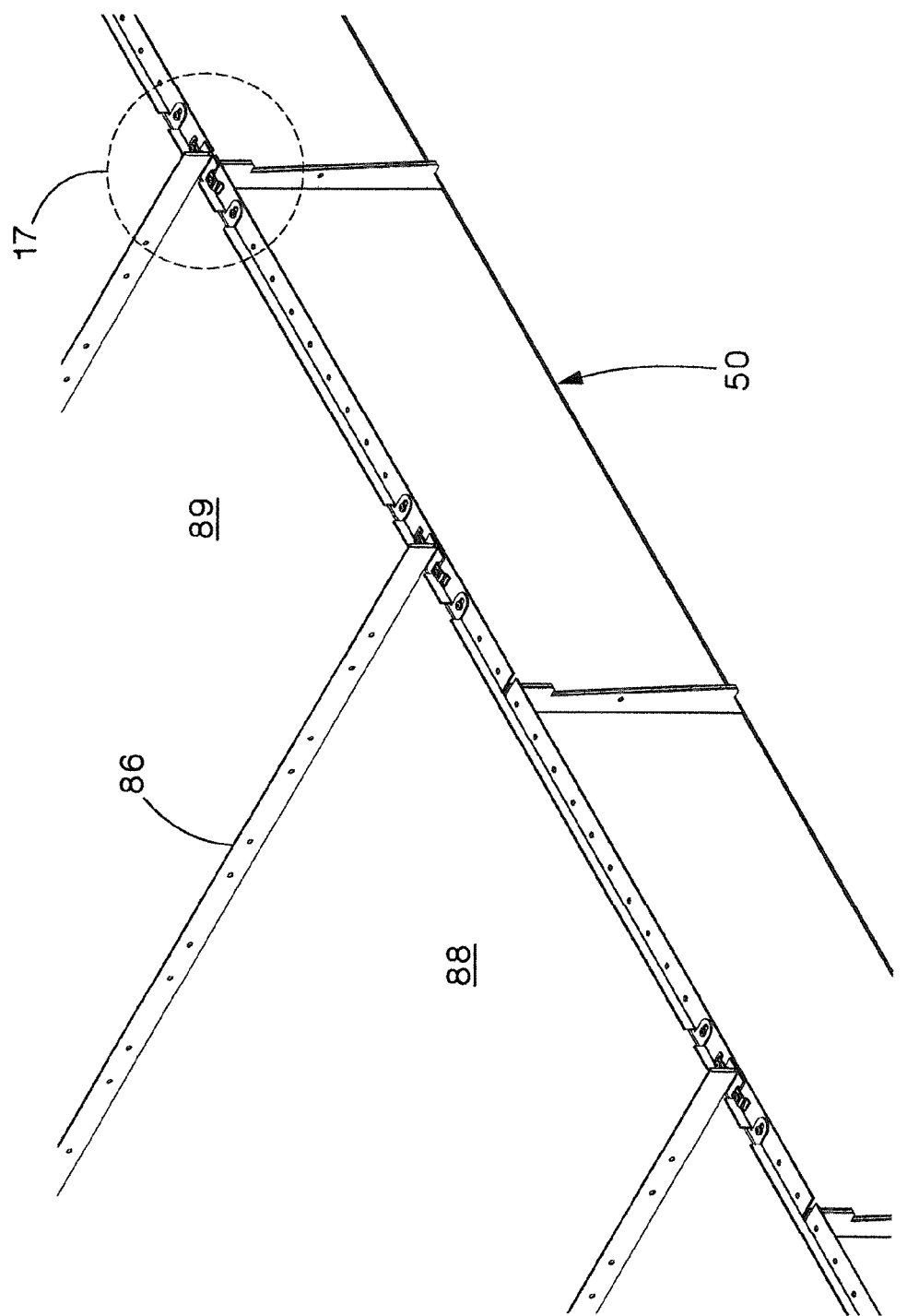
FIG. 16 is a perspective view of portions of the cross tees of FIG. 7 positioned on the cabinet vertical panels of FIG. 3.

Aisle containment system 40 shown in FIG. 1 includes two rows 42 and 44 of three equal width cabinets 46 (800 mm). Vertical panels 50 or 62 allow the use of any cabinet width which is a multiple of 100 mm in combination with any ceiling tile width which is a multiple of 100 mm. As best seen in FIG. 16, an 800 mm right angle spacer bar is utilized with an 800 mm ceiling panel 88, and a 600 mm right angle spacer bar is utilized with a 600 mm ceiling panel 89.

Figure 17:
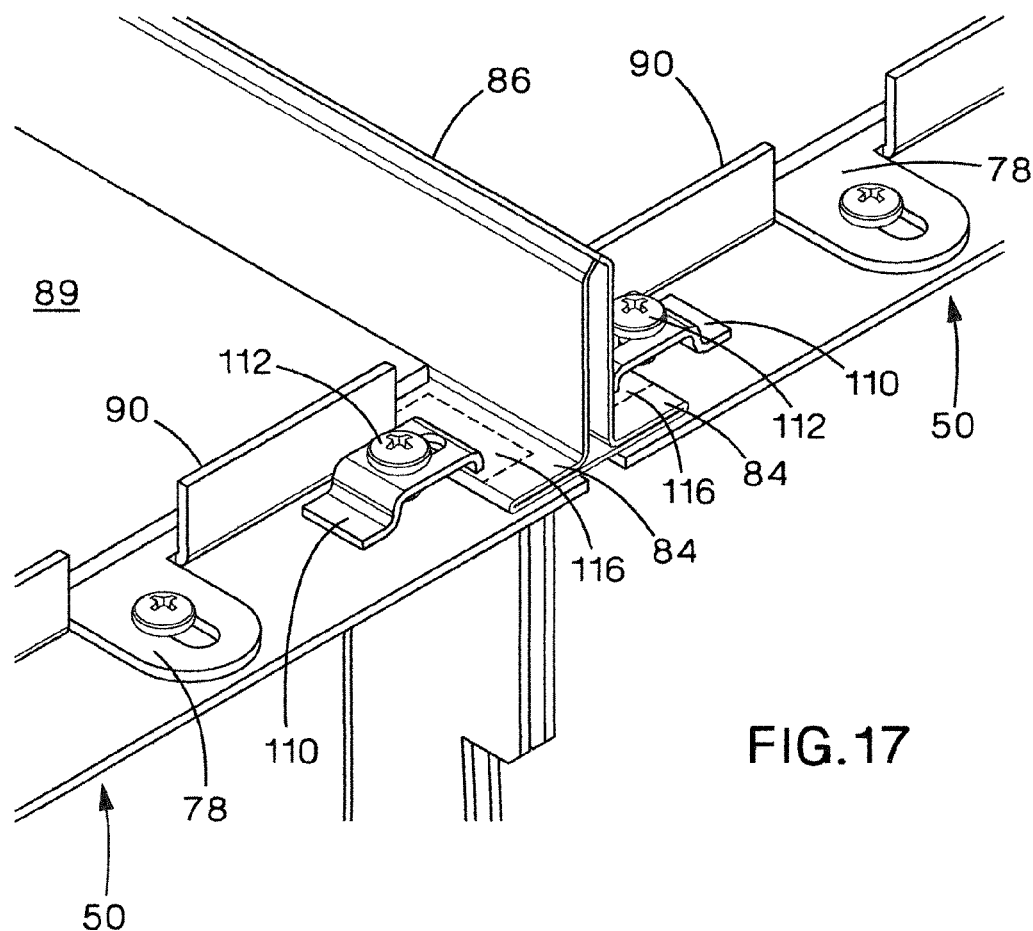
FIG. 17 is an enlarged perspective view of detail 17 in FIG. 16.
Figure 18:
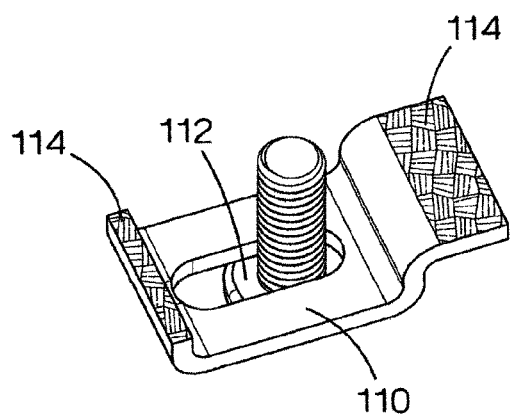
FIG. 18 is a bottom perspective view of the clamp and screw of FIG. 17.

There are some large tolerances involved when installing cabinets in an aisle containment system. Examples include levelness of floor, perpendicularity of cabinet to floor, allowable manufacturing tolerances, and material variances. In order to account for these tolerances, clamp 110 and screw 112 may be used to secure cross tee 86 to vertical panels 50 as shown in FIG. 17. When clamps 110 are loose, cross tee 86 may be properly positioned relative to other cross tees. When cross tee 86 is positioned properly, screws 112 may be tightened to secure cross tee 86 to vertical panels 50. As best seen in FIG. 18, contact surface 114 may be grooved or textured to provide additional clamping strength and ground connection. Also, flange 84 may include uncoated areas 116 to improve grounding between clamp 110 and cross tee 86.

Figure 20:
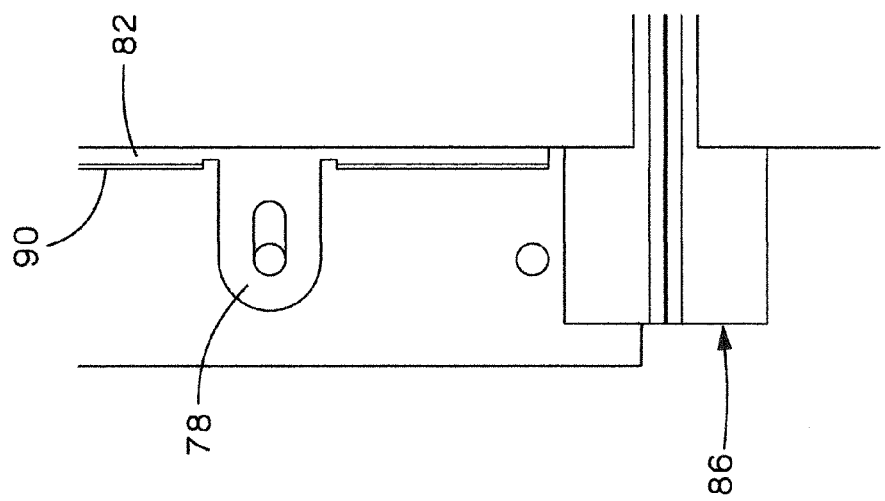
FIG. 20 is a top view of a portion of the right angle spacer bar of FIG. 6, showing a mounting hole location for a maximum aisle width.
Figure 19:
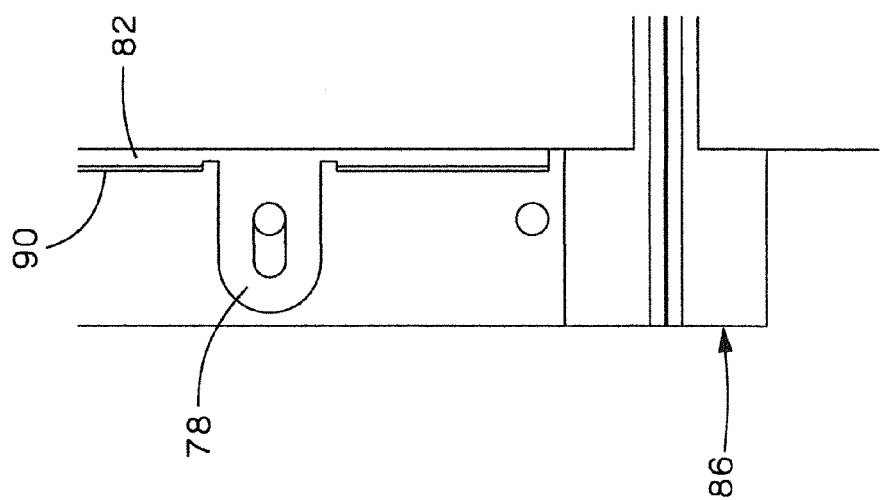
FIG. 19 is a top view of a portion of the right angle spacer bar of FIG. 6, showing a mounting hole location for a minimum aisle width.

FIGS. 19 and 20 show the minimum and maximum positions of aisle width, respectively. The tolerance of the aisle width is 0.625 inches, approximately 0.313 inches on each side. Thus, in the minimum position, the aisle width is approximately 71.687 inches. In the maximum position, the aisle width is approximately 72.313 inches.

Figure 21:
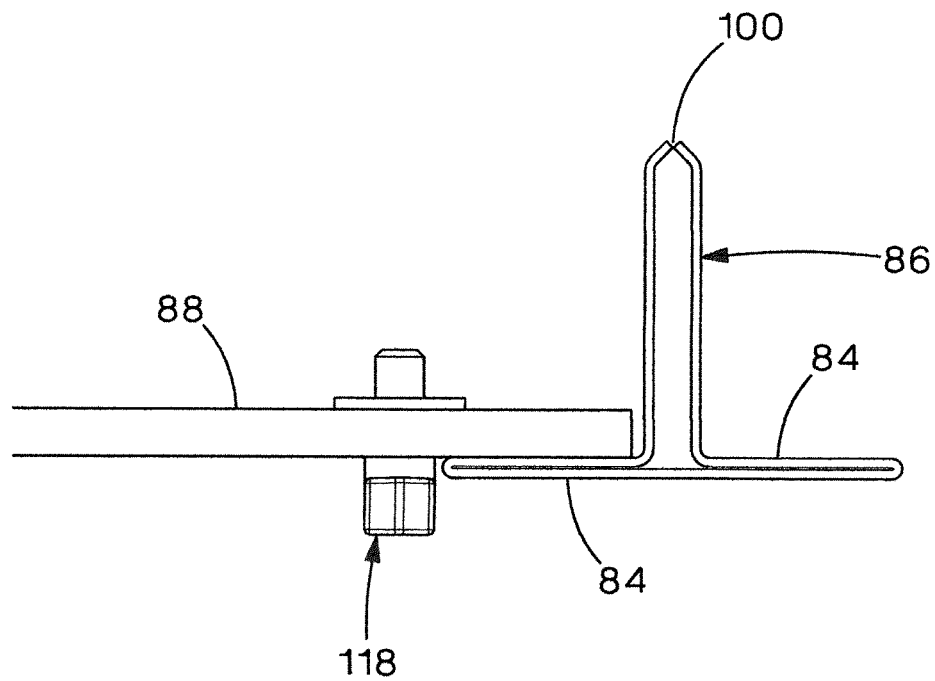
FIG. 21 is an end view of the cross tee of FIG. 10 supporting a ceiling panel with a clamp in the unlocked position.
Figure 22:
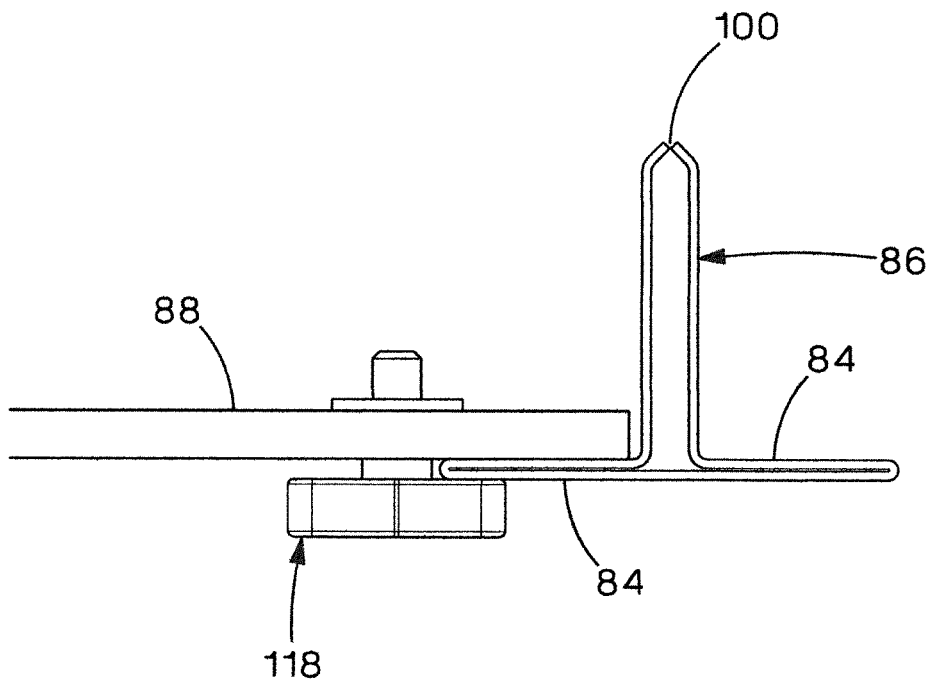
FIG. 22 is an end view of the cross tee of FIG. 10 supporting a ceiling panel with a clamp in the locked position.

FIGS. 21 and 22 show ceiling panels 88 being secured to cross tee 86. Ceiling panel 88 has holes at each corner, and ceiling panel 88 is positioned on either flange 84 of cross tee 86. A quarter turn hold-down clamp 118 is mounted in the corners of ceiling panel 88, and clamp 118 is rotated 90 degrees from the unlocked to the locked position.

Figure 23:
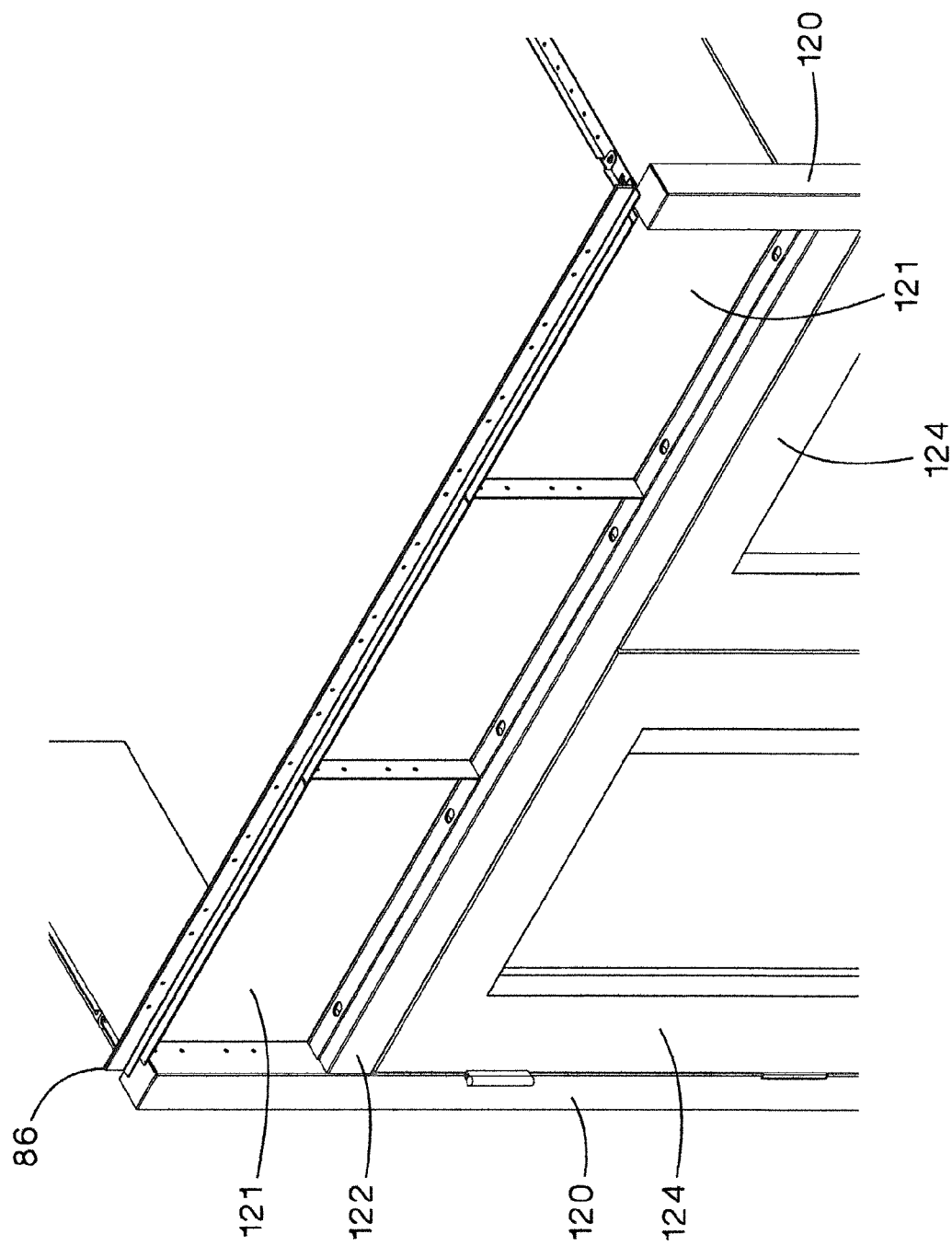
FIG. 23 is an enlarged perspective view of a portion of the door assembly of FIG. 1.

FIG. 23 shows door assembly 48. Two support posts 120 extend from the floor to the top of vertical panels 121. Beam 122 is positioned on top of doors 124 and between support posts 120. Vertical panels 121 are bolted to the top of beam 122, and vertical panels 121 are bolted to support posts 120. Cross tee 86 is clamped to the top of vertical panels 121.

Figure 24:
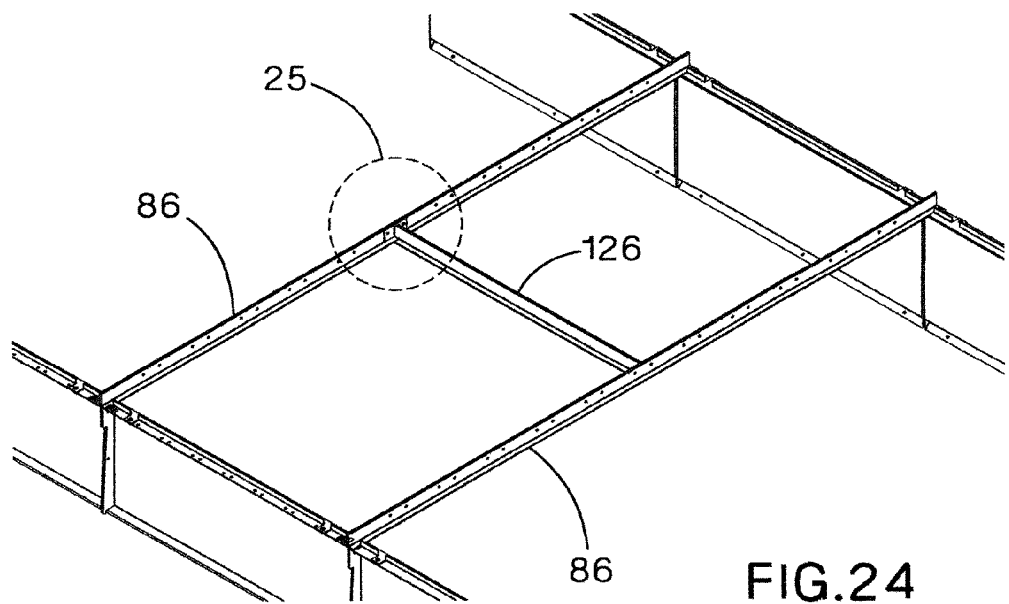
FIG. 24 is an enlarged perspective view of a portion of the aisle containment system of FIG. 1, showing a secondary cross tee mounted between two cross tees of FIG. 7.
Figure 25:
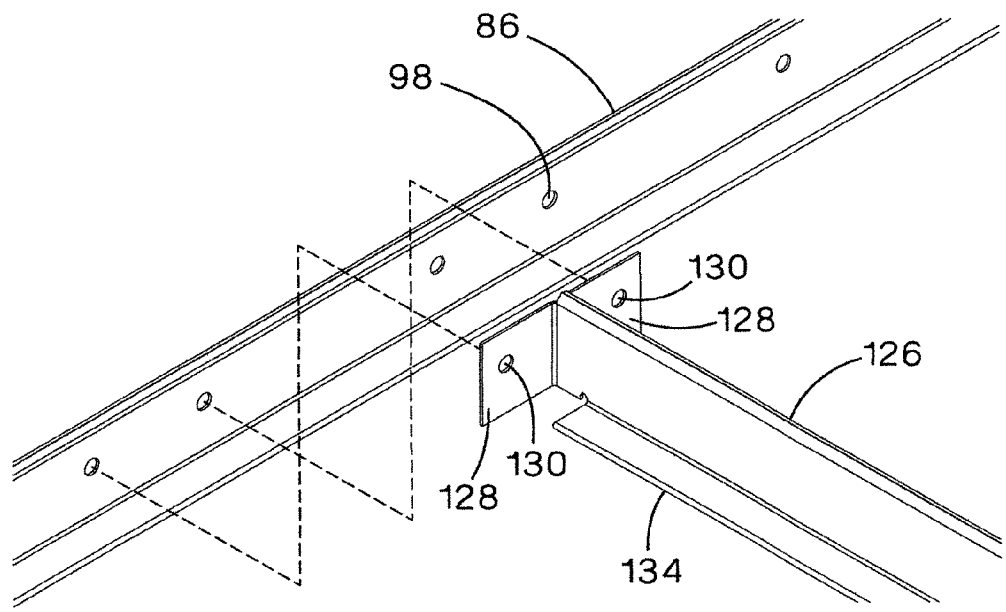
FIG. 25 is an exploded perspective view of detail 25 in FIG. 24, showing the secondary cross tee before mounting between two cross tees of FIG. 7.

FIGS. 24 and 25 show secondary cross tee 126 mounted between two cross tees 86 to divide ceiling panel 88 into two smaller panels for easier handling. Cross tee 126 has end flanges 128 including holes 130 to secure cross tee 86. Cross tee 86 has a plurality of holes 98 for mounting cross tee 126 in multiple locations, and cross tee 126 has a lower flange 134 cut back to drop down between two cross tees 86 so that all the flanges are in the same plane. Ceiling panels 88 can be cut to various sizes depending on the location of cross tee 126.

Figure 26:
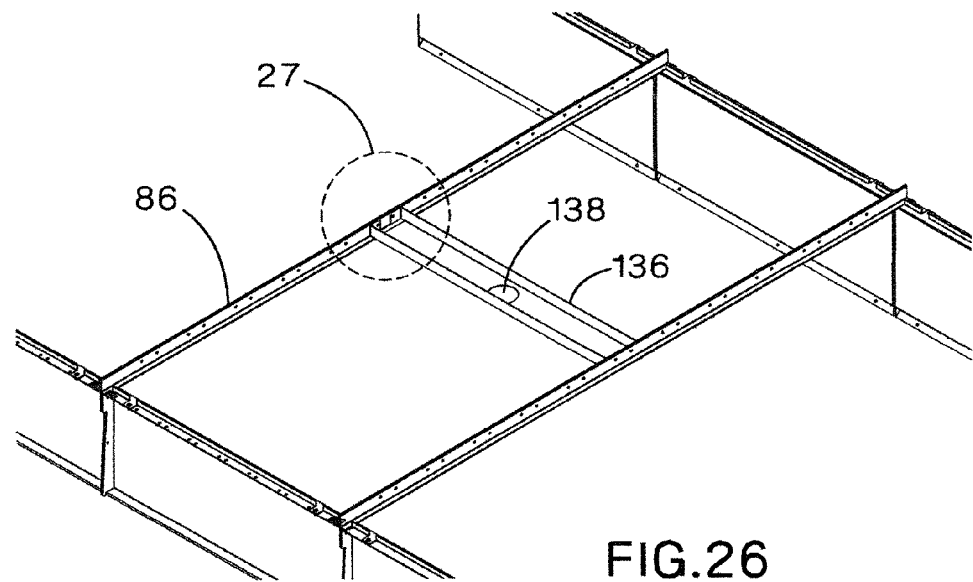
FIG. 26 is an enlarged perspective view of a portion of the aisle containment system of FIG. 1, showing a fire suppression cross tee mounted between two cross tees of FIG. 7.
Figure 27:
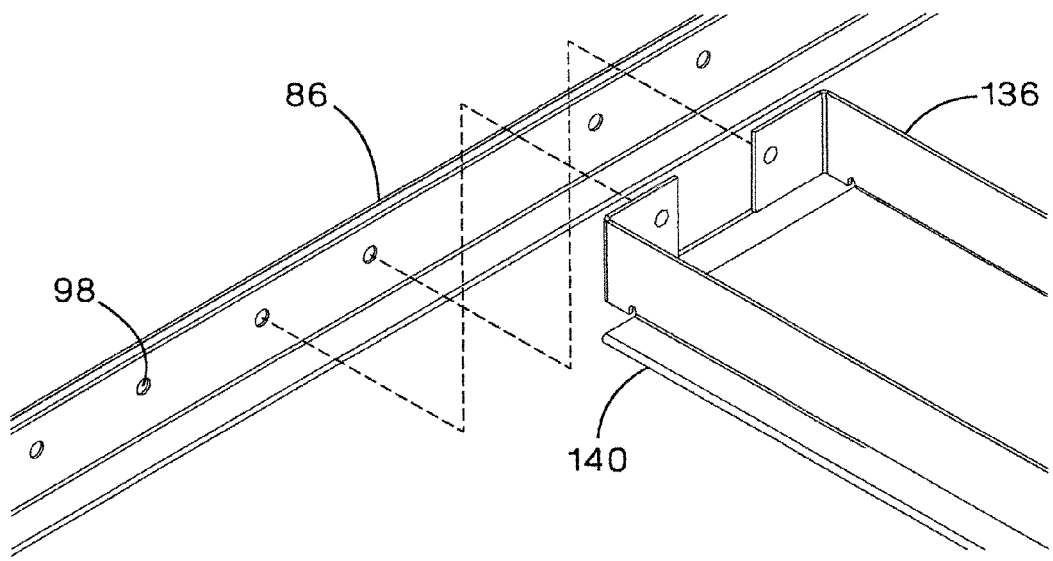
FIG. 27 is an exploded perspective view of detail 27 in FIG. 26, showing the fire suppression cross tee before mounting between two cross tees of FIG. 7.

FIGS. 26 and 27 show fire suppression cross tee 136 mounted between two cross tees 86. Cross tee 136 has an access hole 138 that allows fire suppression components to penetrate from overhead into the aisle containment area. Preferably, access hole 138 has a three inch diameter. Cross tee 136 can be bolted into cross tees 86 in the same holes 98 as secondary cross tee 126 described in FIGS. 24 and 25. Cross tee 136 has a lower flange 140 cut back to drop down between two cross tees 86 so that all the flanges are in the same plane. Ceiling panels 88 can be cut to various sizes depending on the location of cross tee 136.

Figure 28:
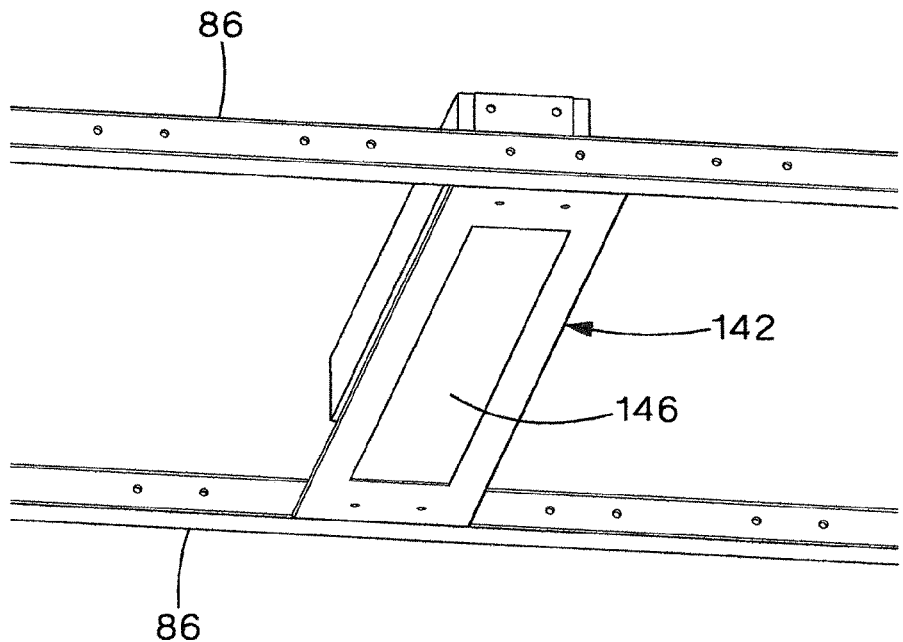
FIG. 28 is an enlarged bottom perspective view of a portion of the aisle containment system of FIG. 1, showing a light fixture cross tee mounted between two cross tees of FIG. 7.
Figure 29:
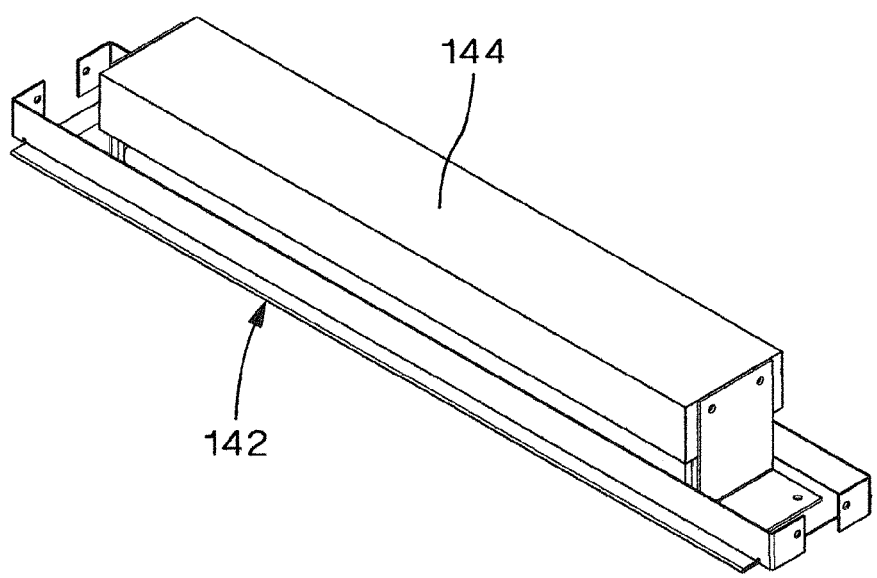
FIG. 29 is a top perspective view of the light fixture cross tee of FIG. 28.

FIGS. 28 and 29 show light fixture cross tee 142 mounted between two cross tees 86. Cross tee 142 has an integral light fixture 144 that spans the entire distance between cross tees 86 to maximize the light in the aisle. Lens 146 is flush with the aisle containment ceiling, as shown in FIG. 28.

Figure 30:
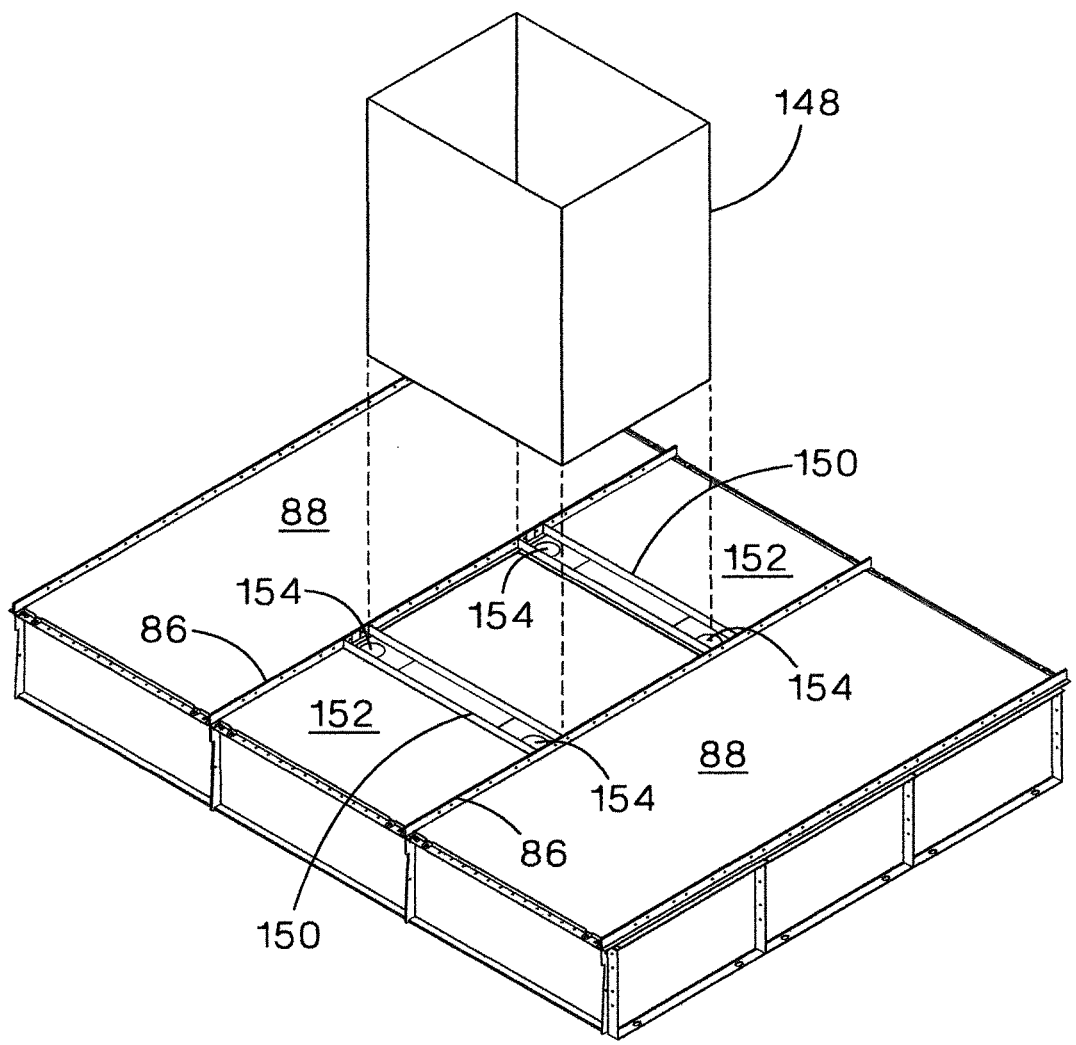
FIG. 30 is a perspective view of a portion of the aisle containment system of FIG. 1, showing two fire suppression cross tees with integral light fixtures mounted between two cross tees of FIG. 7 and before an air duct is installed between the secondary cross tees.

FIG. 30 shows air duct 148 mounted between cross tees 86. Two fire suppression cross tees 150 with integral light fixtures are bolted to cross tees 86 on the sides of air duct 148 for sealing and additional support. Ceiling panels 152 can be installed to seal the remainder of the section and provide access above the ceiling area. Cross tee 150 is a combination of cross tee 136 and cross tee 142, except cross tee 150 has two access holes 154 that allow fire suppression components to penetrate from overhead into the aisle containment area. Light fixtures are positioned between the fire suppression components to illuminate the aisle.

Figure 31:
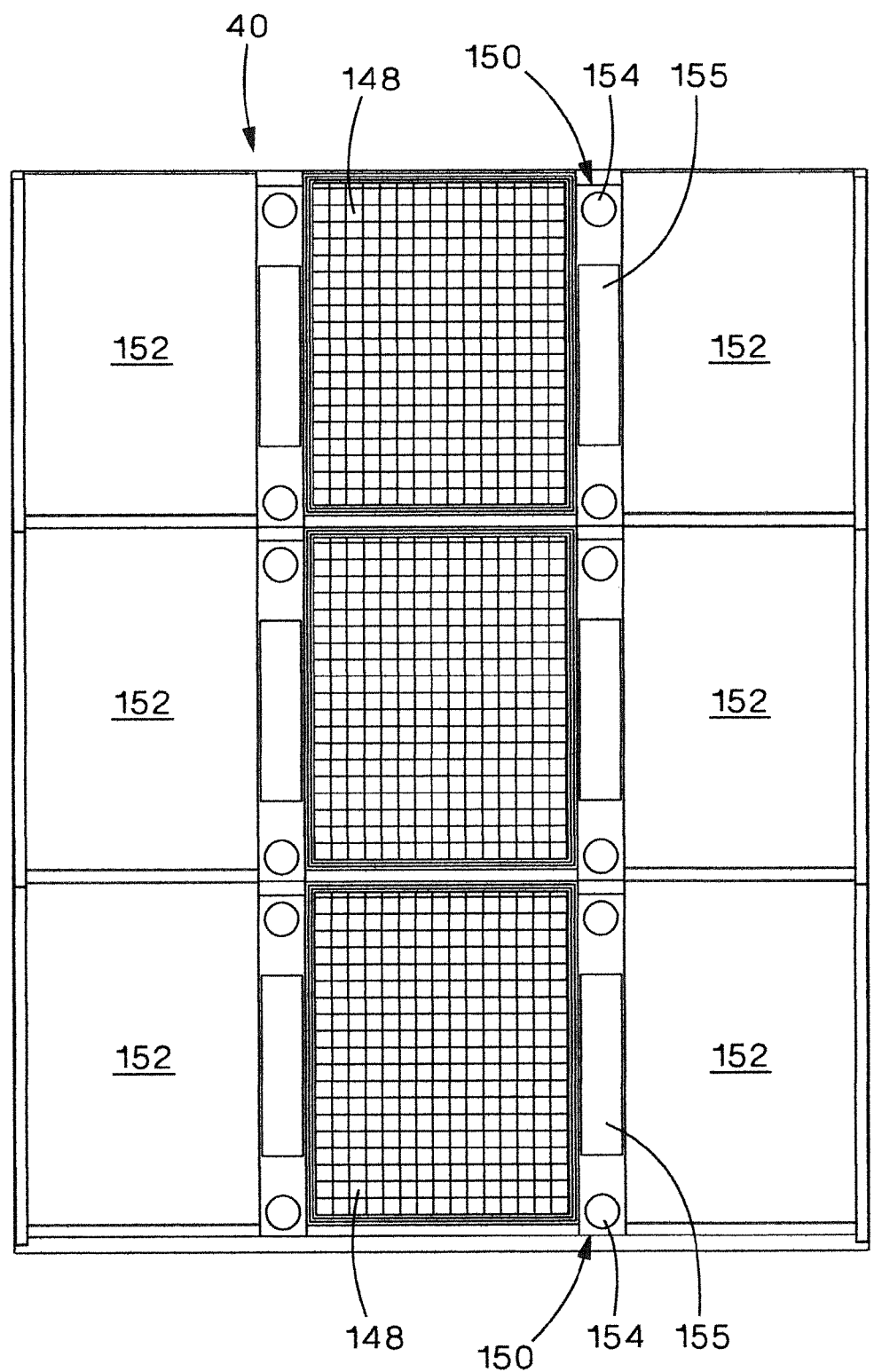
FIG. 31 is a top view of the aisle containment system of FIG. 30, showing three air ducts installed between secondary cross tees.
Figure 32:
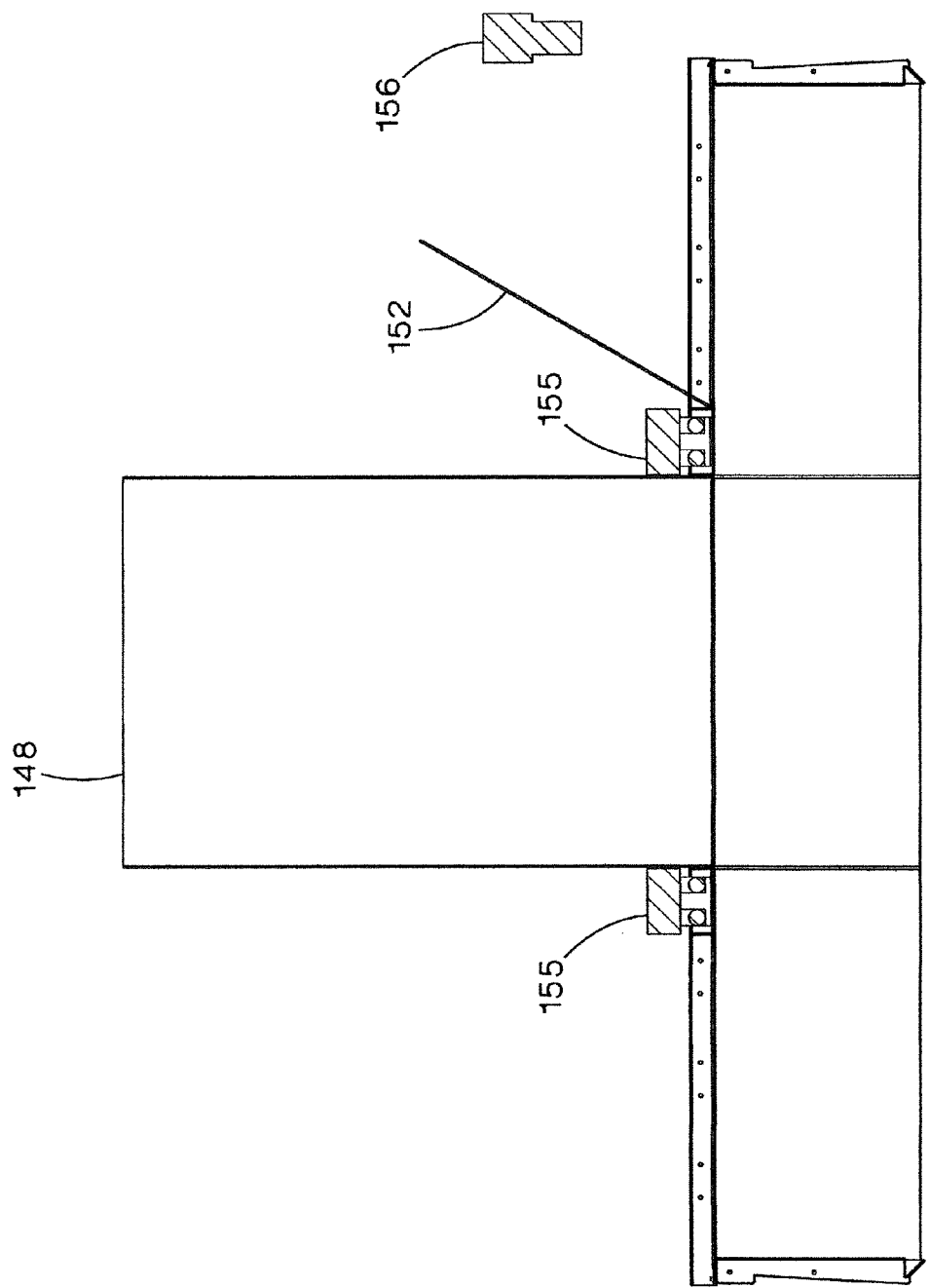
FIG. 32 is an end view of the aisle containment system of FIG. 31, showing one ceiling panel in the open position.

FIG. 31 shows multiple air ducts 148 installed in aisle containment system 40. Air ducts 148 can be various dimensions depending on the air handling requirements. Unused access holes 154 will be sealed, and light fixtures 155 provide additional lighting within the aisle. As best seen in FIG. 32, ceiling panels 152 can be lifted to provide access to the area above the aisle containment, which may include power bus 156.

Figure 33:
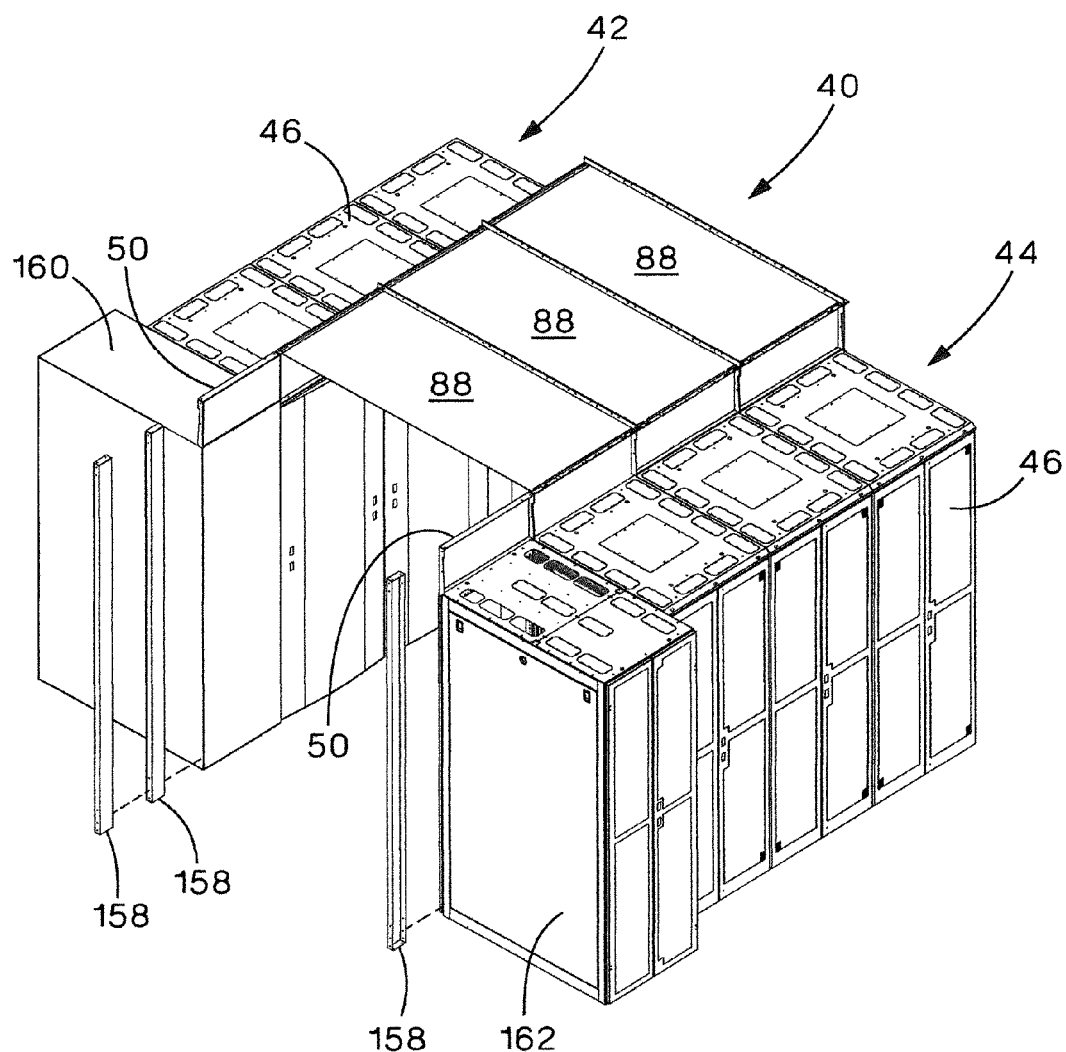
FIG. 33 is a perspective view of the aisle containment system of FIG. 1, after the cabinet vertical panels have been secured to the additional cabinets and prior to vertical blank panels being secured to the cabinet vertical panels and cabinets.

If multiple width cabinets exist in the aisle containment system, there may be a need for vertical blank panels 158. Preferably, vertical blank panel 158 is 100 mm wide. FIG. 33 shows a 600 mm wide cabinet 160 being added to row 42, and a 700 mm wide cabinet 162 being added to row 44. Thus, vertical blank panel 158 is secured to cabinet 160 to equalize the lengths of the two rows at 700 mm. However, each row 42, 44 consists of three 800 mm wide cabinets 46. In order to maintain the same ceiling panel width (800 mm) throughout the aisle containment system, one vertical blank panel 158 is secured to cabinet 162, and one vertical blank panel 158 is secured to vertical blank panel 158.

Figure 34:
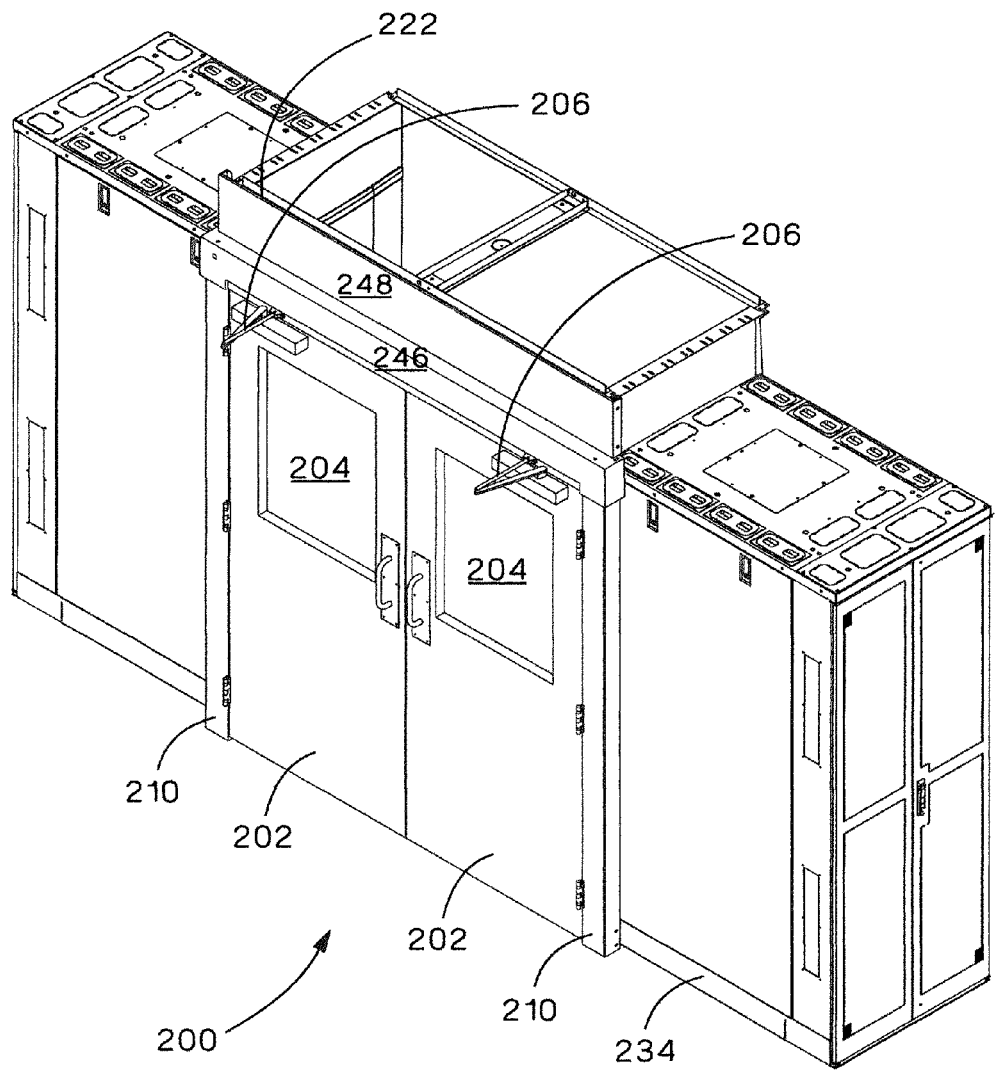
FIG. 34 is a perspective view of an alternate door assembly for the aisle containment system of FIG. 1.

FIGS. 34-46 show door assembly 200. Preferably, each door 202 is a standard 36" steel door with half windows 204. Doors 202 have closers 206 with hold-open features and do not latch or lock. However, latching and locking features can be added to doors 202. Although only one pair of network cabinets is shown in FIG. 34, more cabinets are typically used and another door assembly 200 is positioned at the other end of the containment aisle. Door assembly 200 is mounted to two rows of cabinets spaced 6 feet apart. However, the two rows of cabinets may be spaced only 4 feet apart, using the same door posts, but shorter header, transom and covers along with narrower doors.

Figure 35:
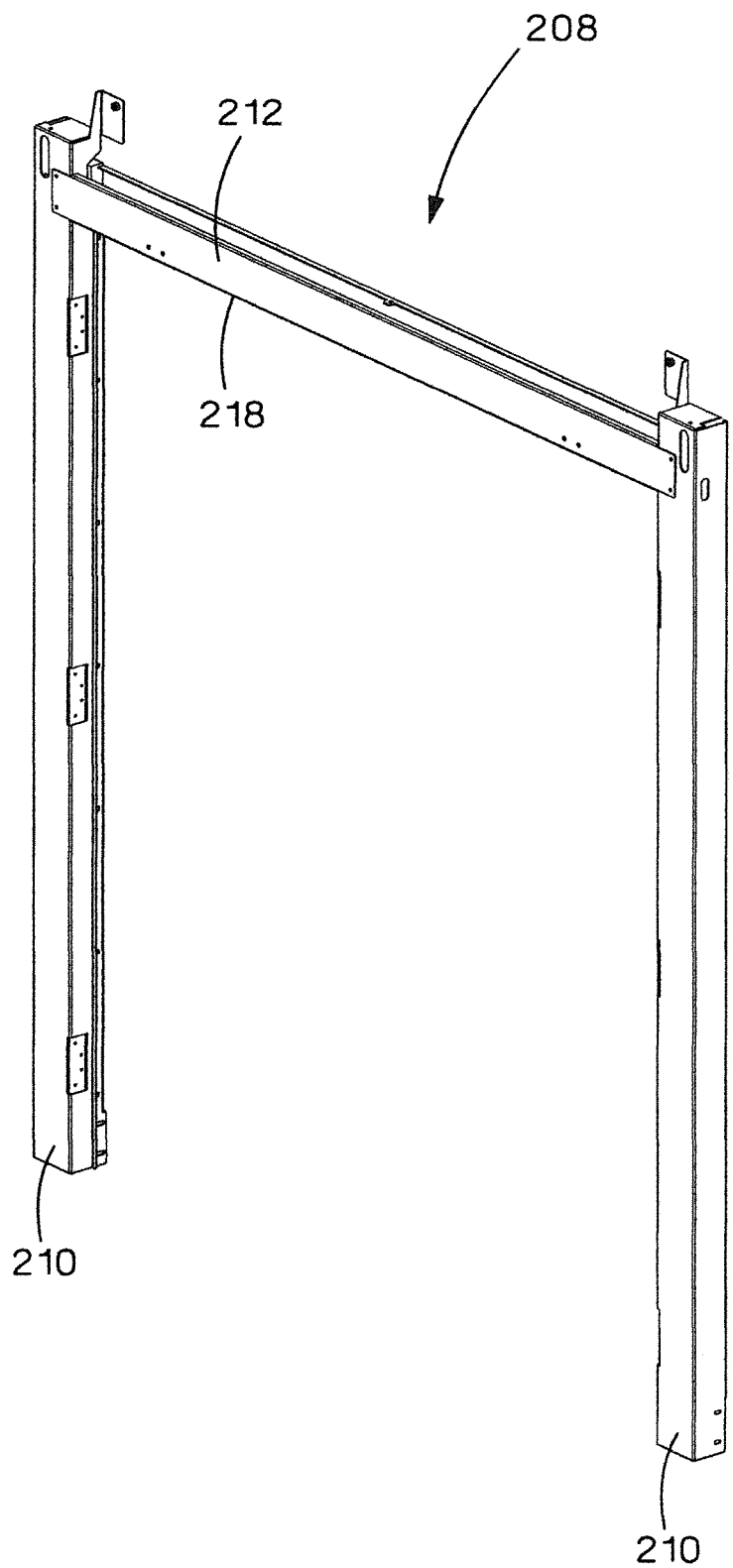
FIG. 35 is a perspective view of a door frame for the door assembly of FIG. 34.
Figure 36:
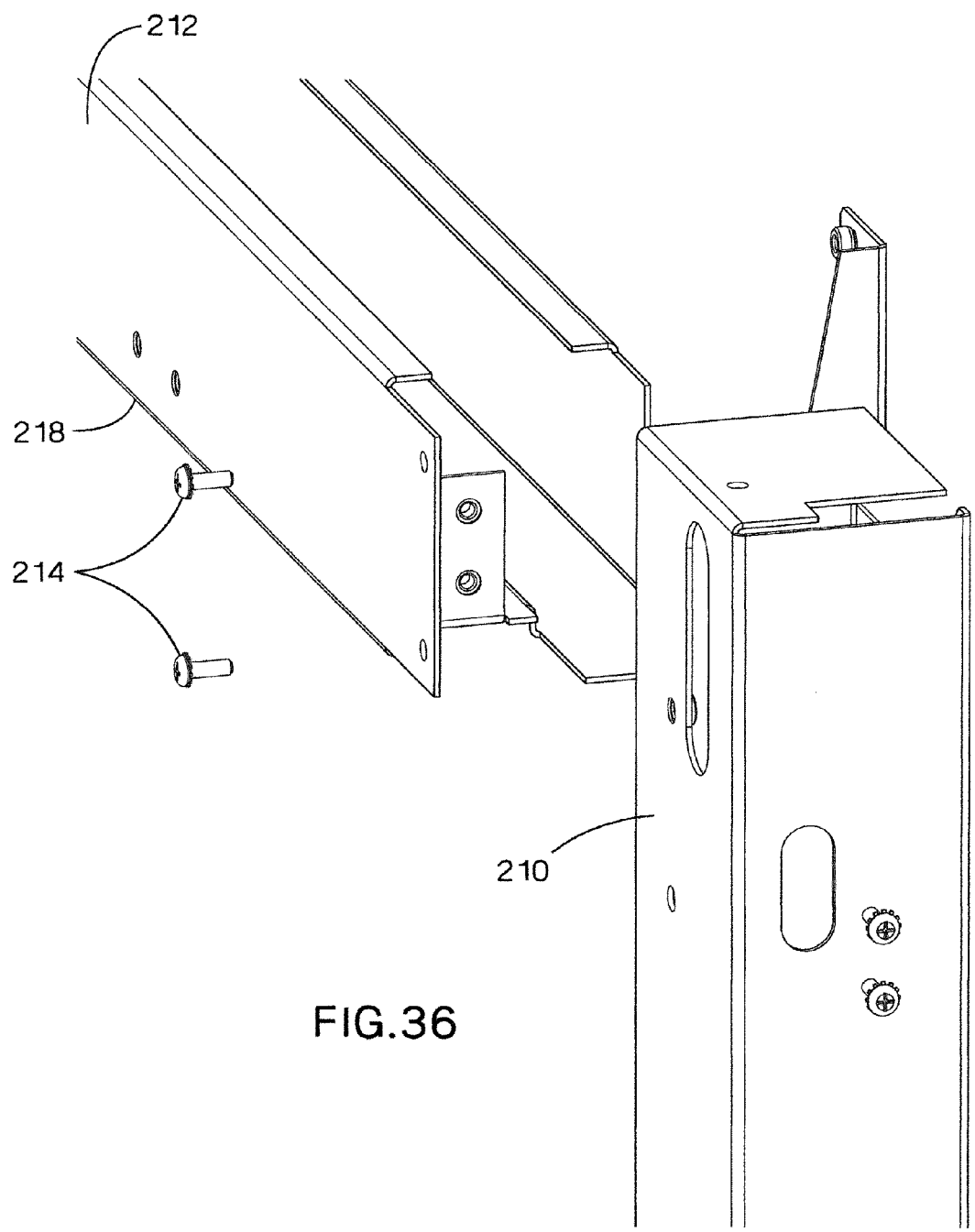
FIG. 36 is an exploded front perspective view of a portion of the door frame of FIG. 35.
Figure 37:
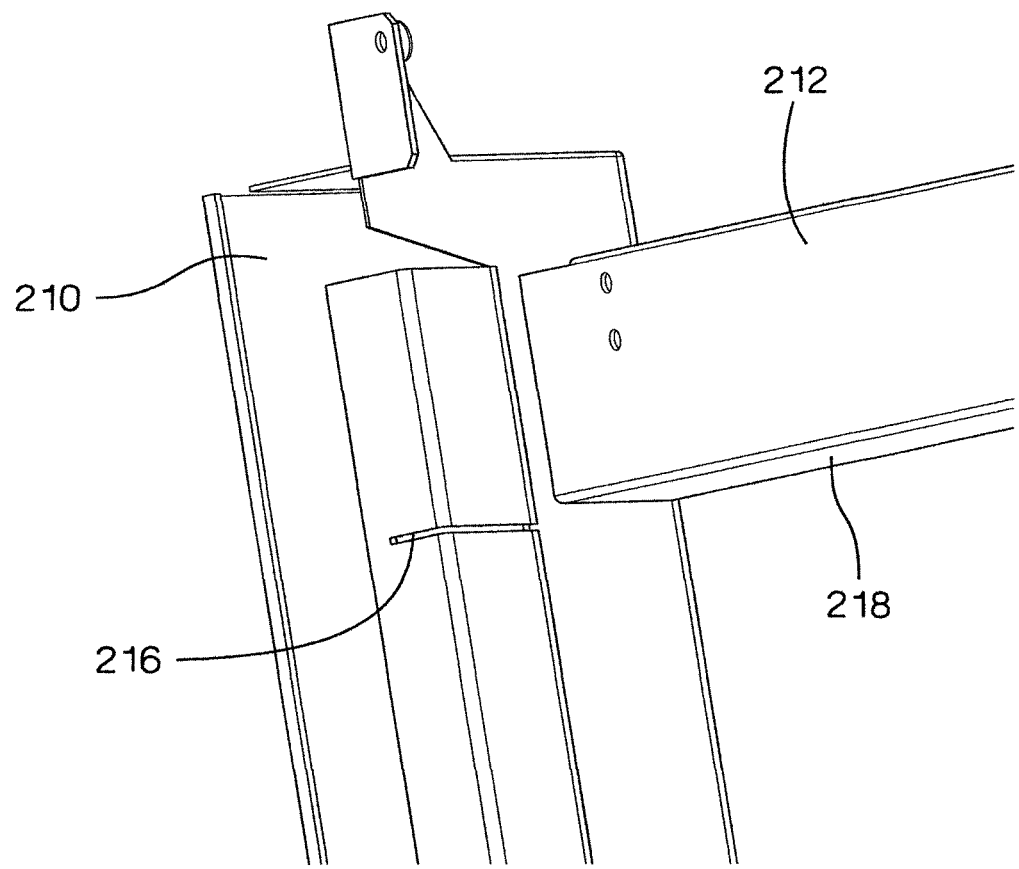
FIG. 37 is an exploded rear perspective view of a portion of the door frame of FIG. 35.

FIG. 35-37 shows door frame 208. Door frame 208 includes two door posts 210 and header 212. Each post 210 is attached to header 212 using screws 214, as shown in FIG. 36. Post 210 has horizontal slot 216 to provide a location for header 212. As shown in FIG. 37, bottom 218 of header 212 slides into slot 216 to ensure that header 212 is at the correct height. Foam seals may be attached to flanges on the back side of door posts 210, and the foam seals would press against the cabinet side panels.

Figure 38:
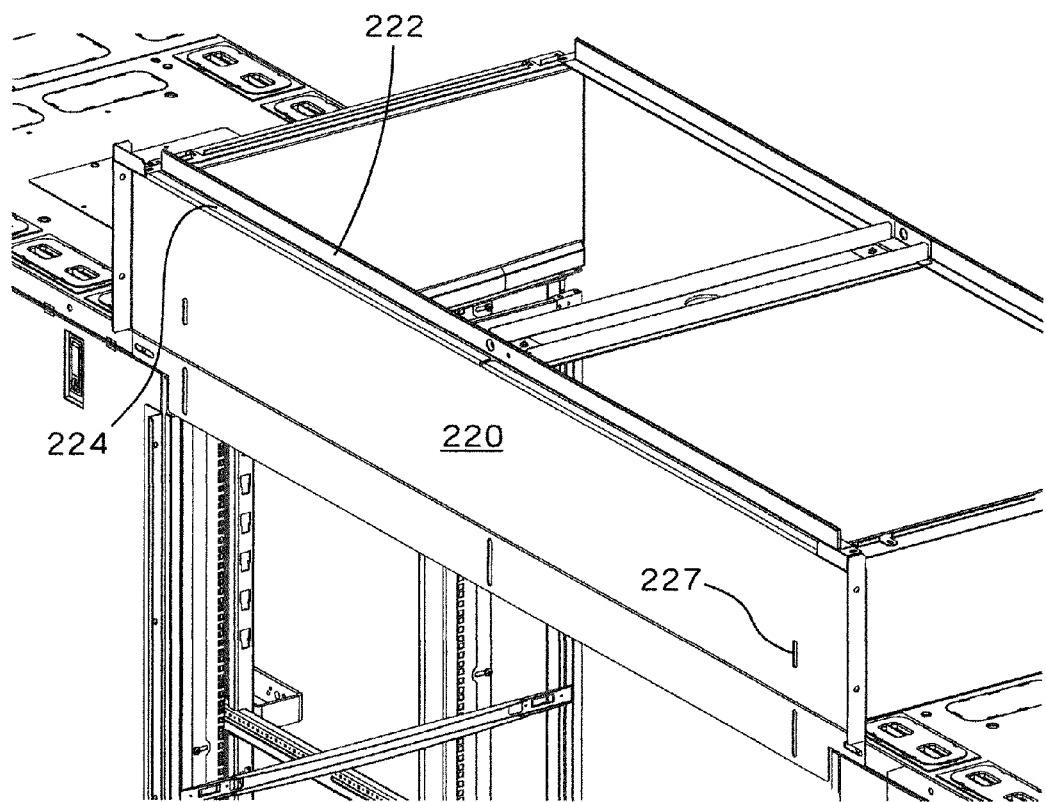
FIG. 38 is an enlarged perspective view of a transom for the door assembly of FIG. 34.
Figure 39:
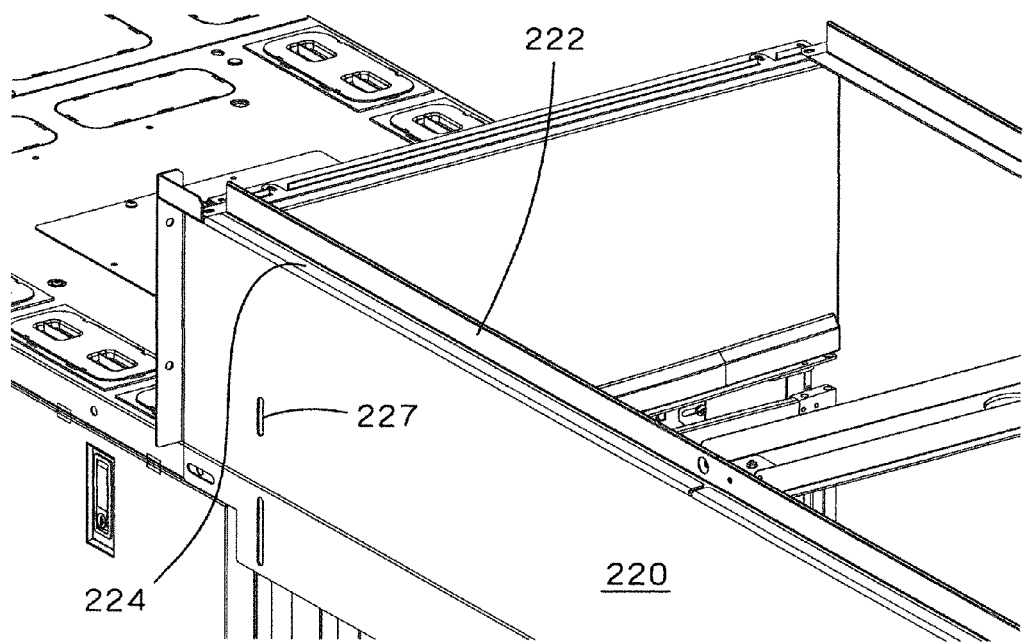
FIG. 39 is a perspective view of a portion of the transom of FIG. 38.
Figure 40:
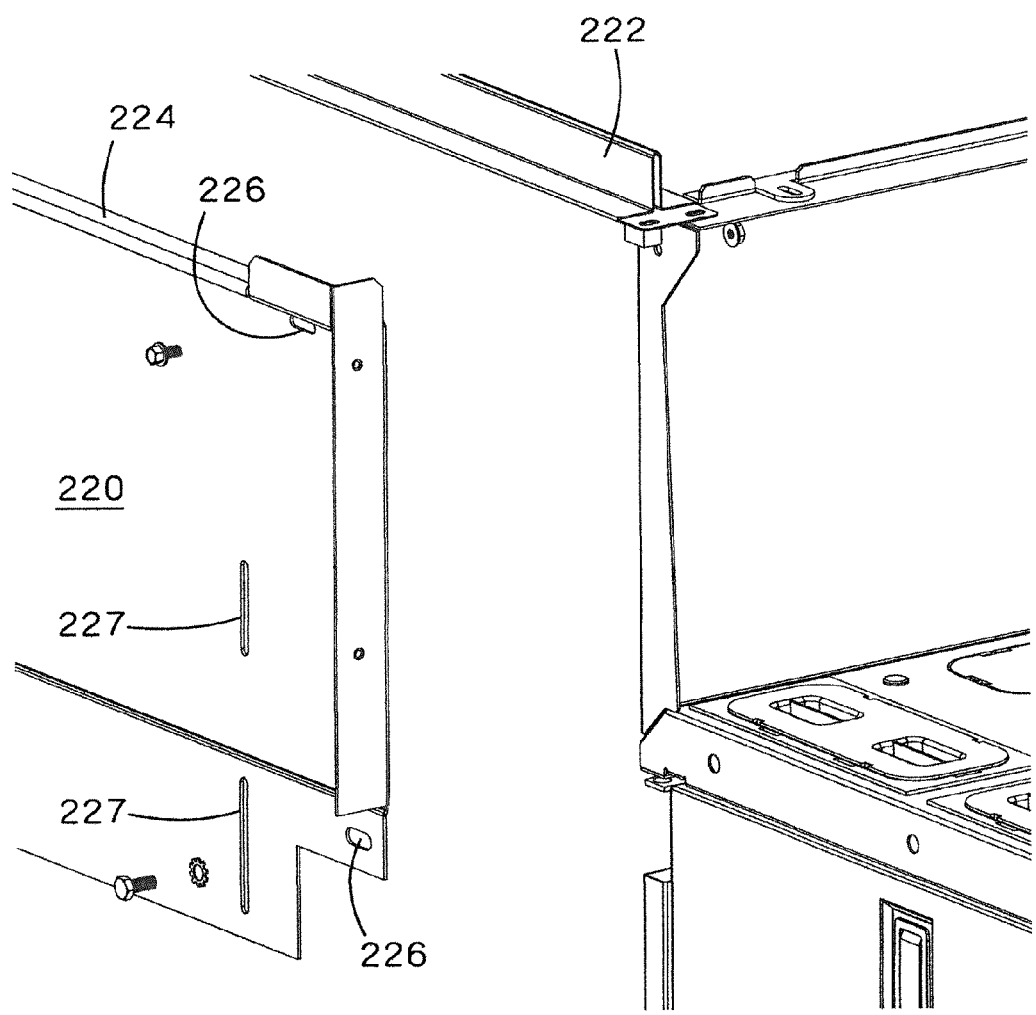
FIG. 40 is an exploded perspective view of a portion of the transom of FIG. 38, before the transom is attached to the top cap of the network cabinet.
Figure 41:
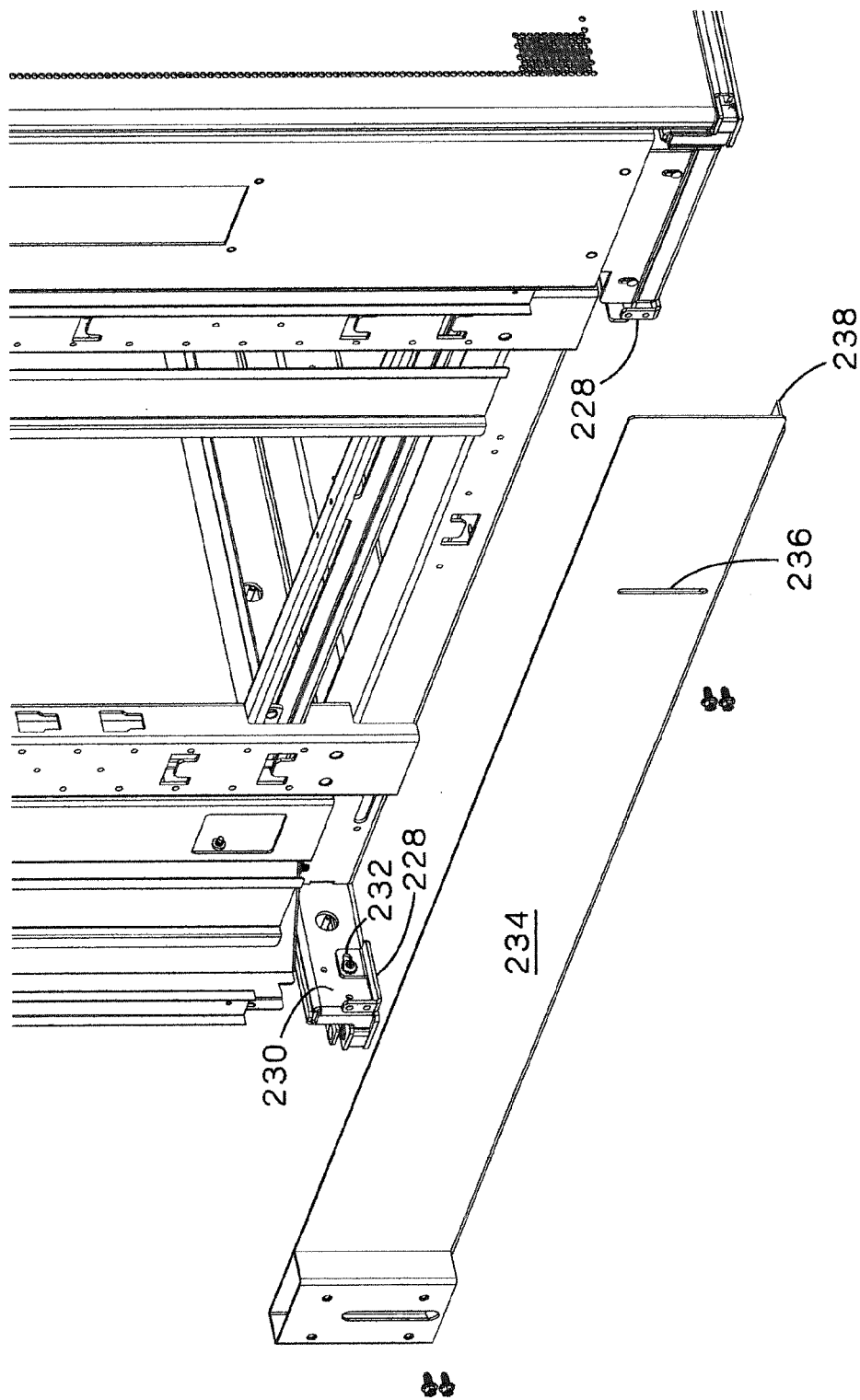
FIG. 41 is an exploded perspective view of a side skirt for the door assembly of FIG. 34, before the side skirt is attached to the bottom of the network cabinet.

FIGS. 38-40 show transom 220. Transom 220 is a panel that fills the area above door frame 208 up to the containment ceiling. Transom 220 attaches to the vertical containment walls and the cabinet top cap. Because transom 220 is attached to the cabinet and walls, it moves up and down with the cabinet as the leveling legs are adjusted. As shown in FIG. 39, cross-aisle tee beam 222 attaches to the top of transom 220 and an open hem 224 across the top of transom 220 hooks over one leg of tee beam 222. Open hem 224 provides an assembly aid when attaching transom 220 to holes in the cabinet top cap (see FIG. 40). Horizontal slots 226 in transom 220 provide adjustability, so that transom 220 can be adjusted left or right to ensure that door posts 210 are vertical.

Figure 42:
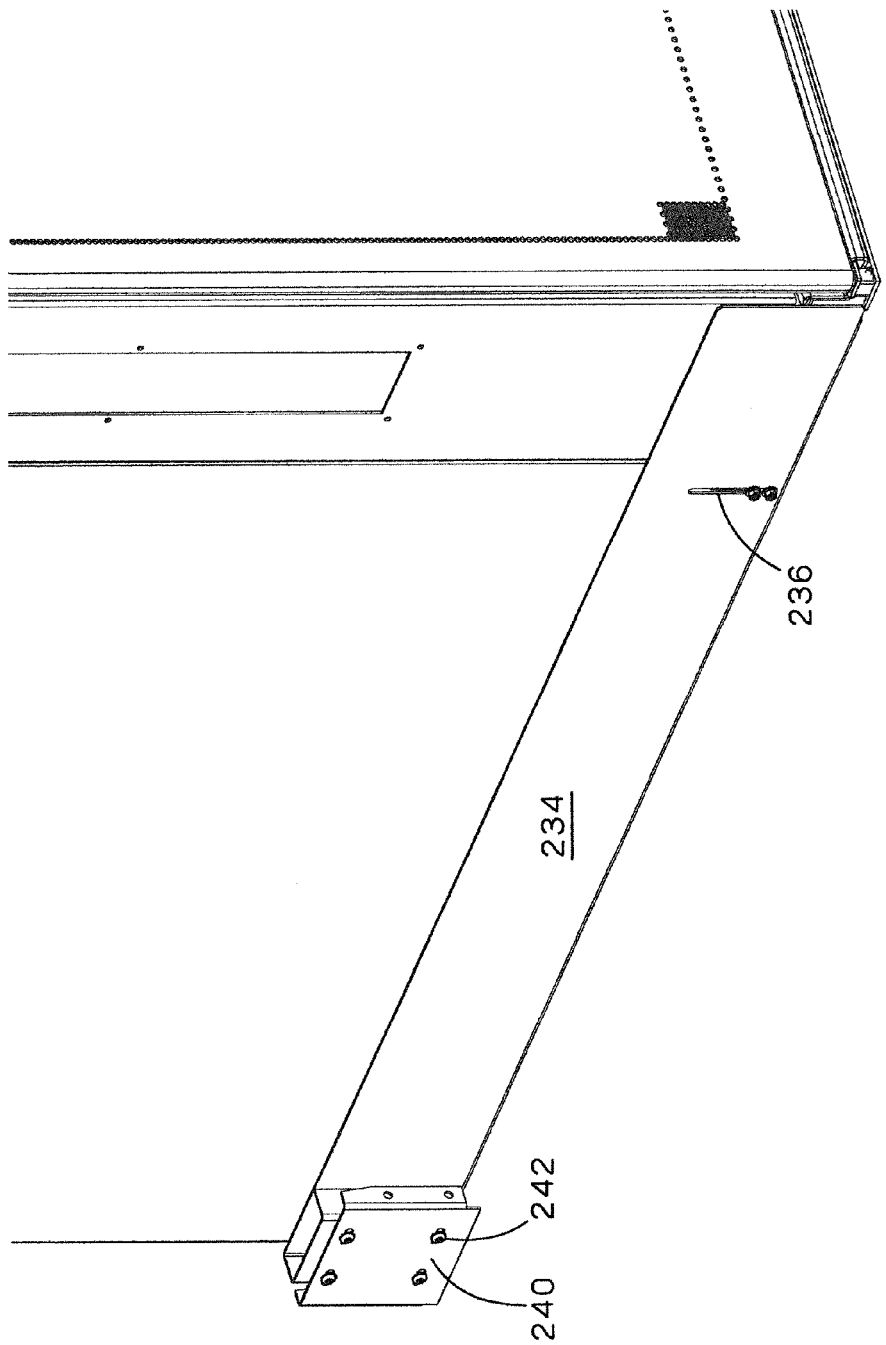
FIG. 42 is a perspective view of the side skirt of FIG. 41, after the side skirt is attached to the bottom of the network cabinet.
Figure 43:
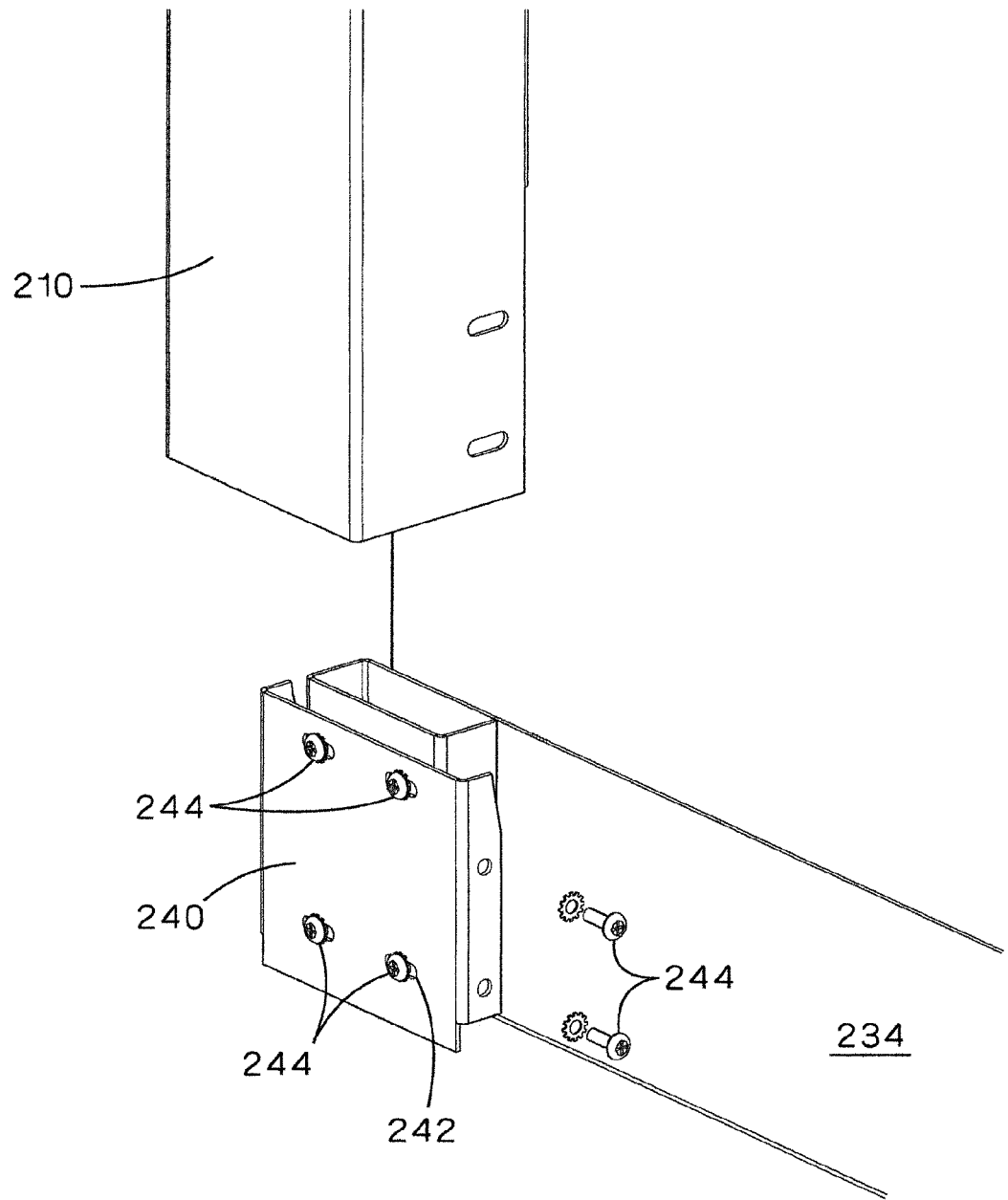
FIG. 43 is an exploded perspective view of a portion of the door assembly of FIG. 34, before the door frame is attached to the lower post support and the side skirt.
Figure 44:
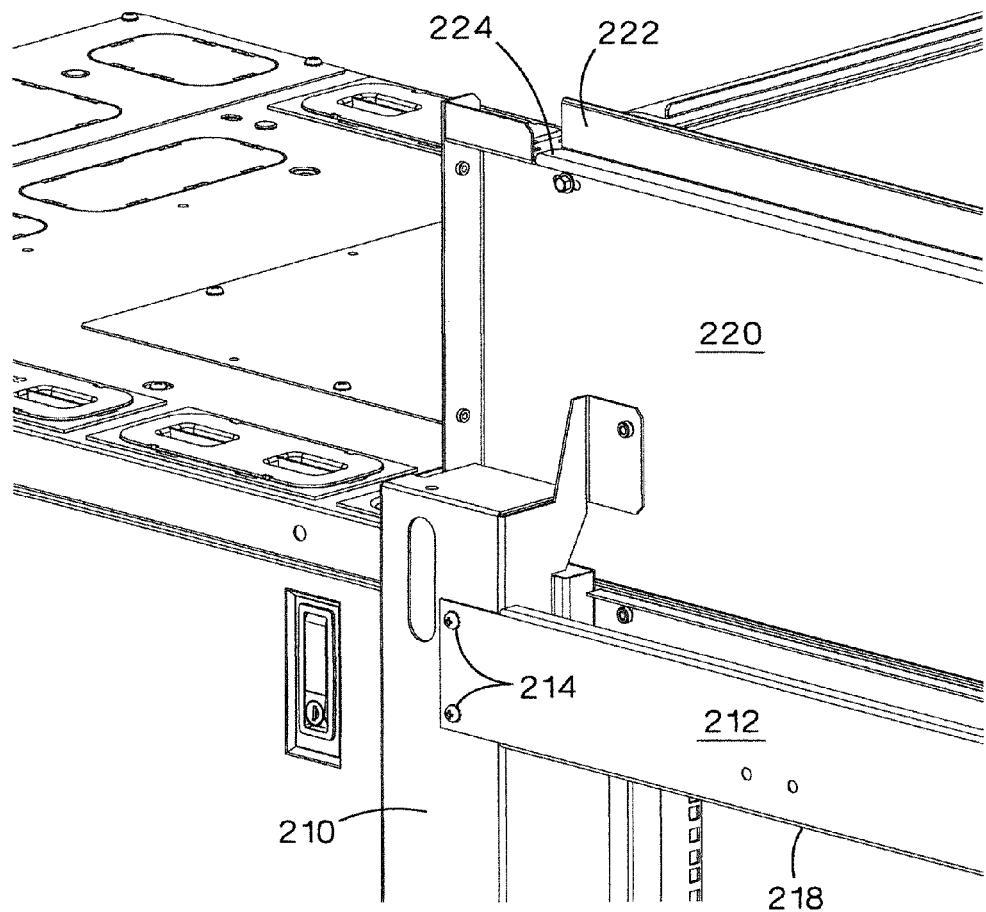
FIG. 44 is a front perspective view of a portion of the door assembly of FIG. 34, after the door frame is attached to the transom.

FIGS. 41-46 show the steps for attaching door assembly 200 to one end of two rows of network cabinets. First, brackets 228 attach to door shoe 230, and slots 232 in brackets 228 allow for in and out adjustment of door posts 210 to ensure that they are vertical. The cabinet side panel may be removed to ease installation of brackets 228, but the side panel must be installed before attaching side skirt 234. Next, side skirt 234 attaches to brackets 228. Side skirt 234 rests on the floor and is held against the cabinet side panel to prevent air leakage, as shown in FIG. 42. Vertical slots 236 in side skirt 234 allow for the cabinet to be raised off the floor by casters or leveling legs, while side skirt 234 remains in contact with the floor. Flange 238 on the bottom of side skirt 234 tucks under the cabinet.

Figure 45:
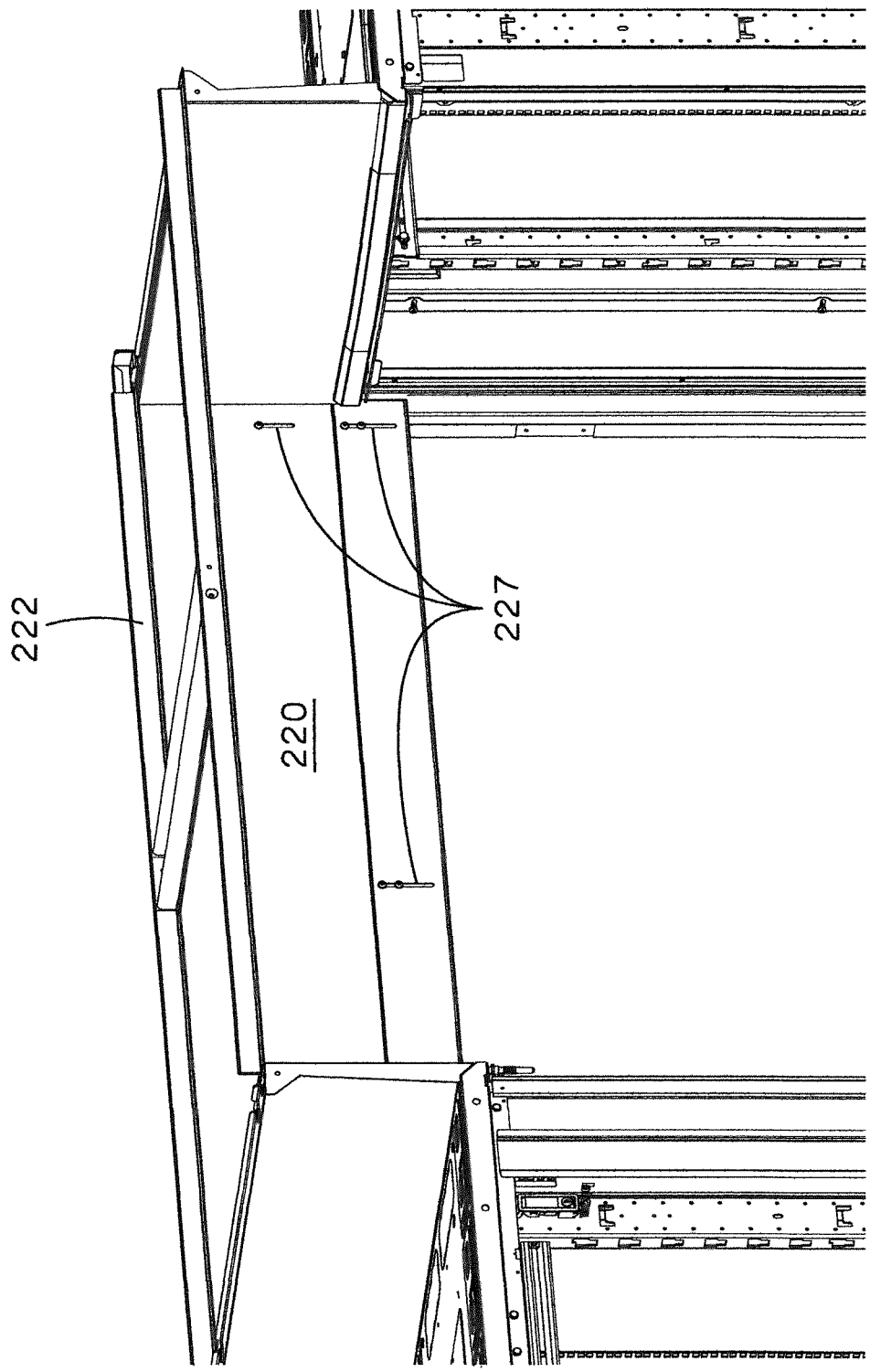
FIG. 45 is a rear perspective view of the transom of FIG. 44, after the door frame is attached to the transom.

As shown in FIG. 42, lower post support 240 attaches to side skirt 234. Support 240 has slots 242 which allows it to adjust horizontally. This adjustment allows door posts 210 to be mounted 6 feet apart, even if the cabinets are spaced slightly more or less than 6 feet apart. Next, door post 210 is placed over lower post support 240 and attached with screws 244 as shown in FIG. 14. Then, door frame 208 is aligned with transom 220 and attached to transom 220 from inside the containment aisle as shown in FIG. 45. Because transom 220 has vertical adjustment slots 227, the height of transom 220 is adjustable as the leveling legs are adjusted on the cabinets. However, door frame 208 remains on the floor.

Figure 46:
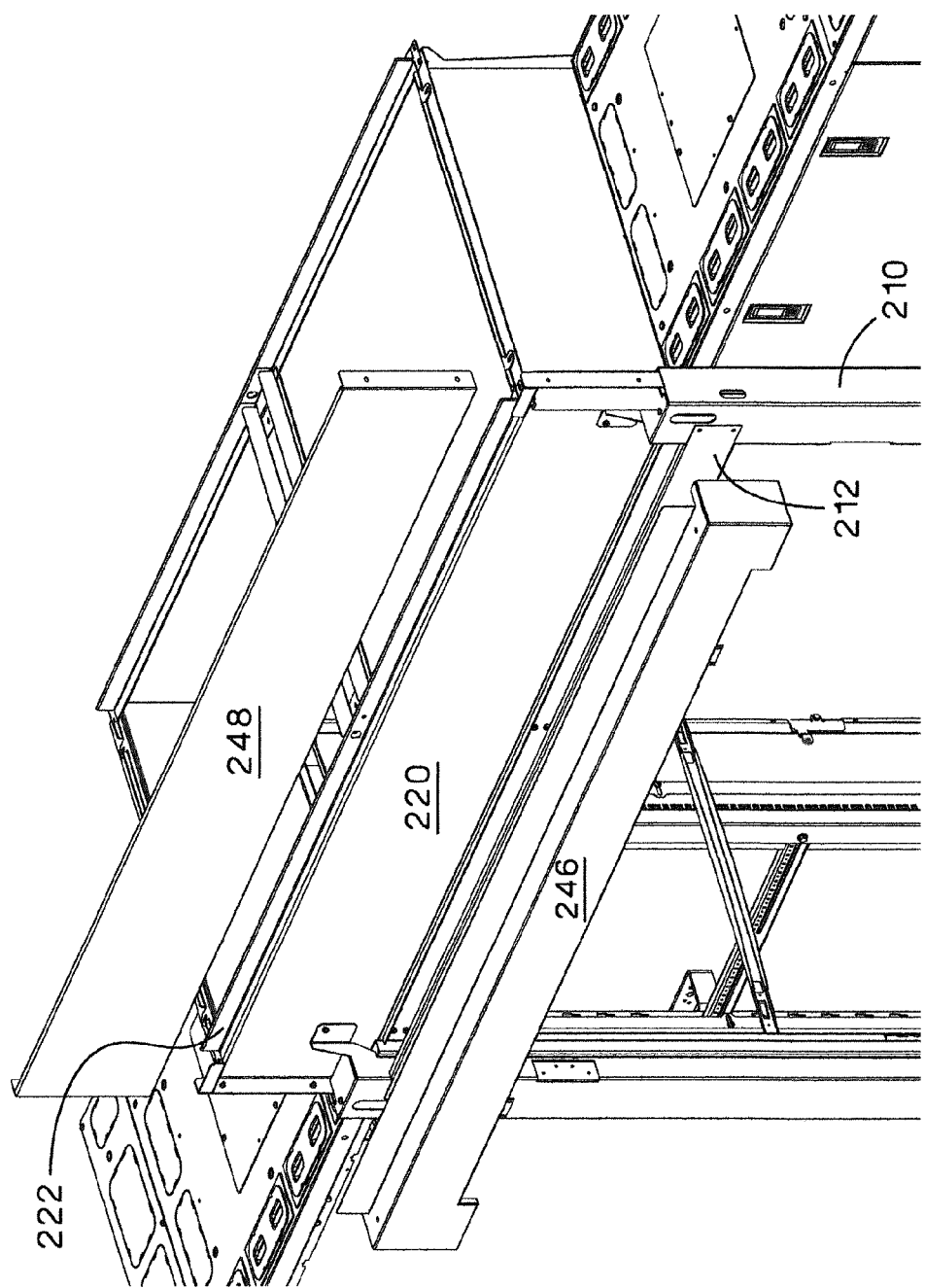
FIG. 46 is a partially exploded perspective view of the door assembly of FIG. 34, before covers are placed over the transom and the header.
Figure 47:
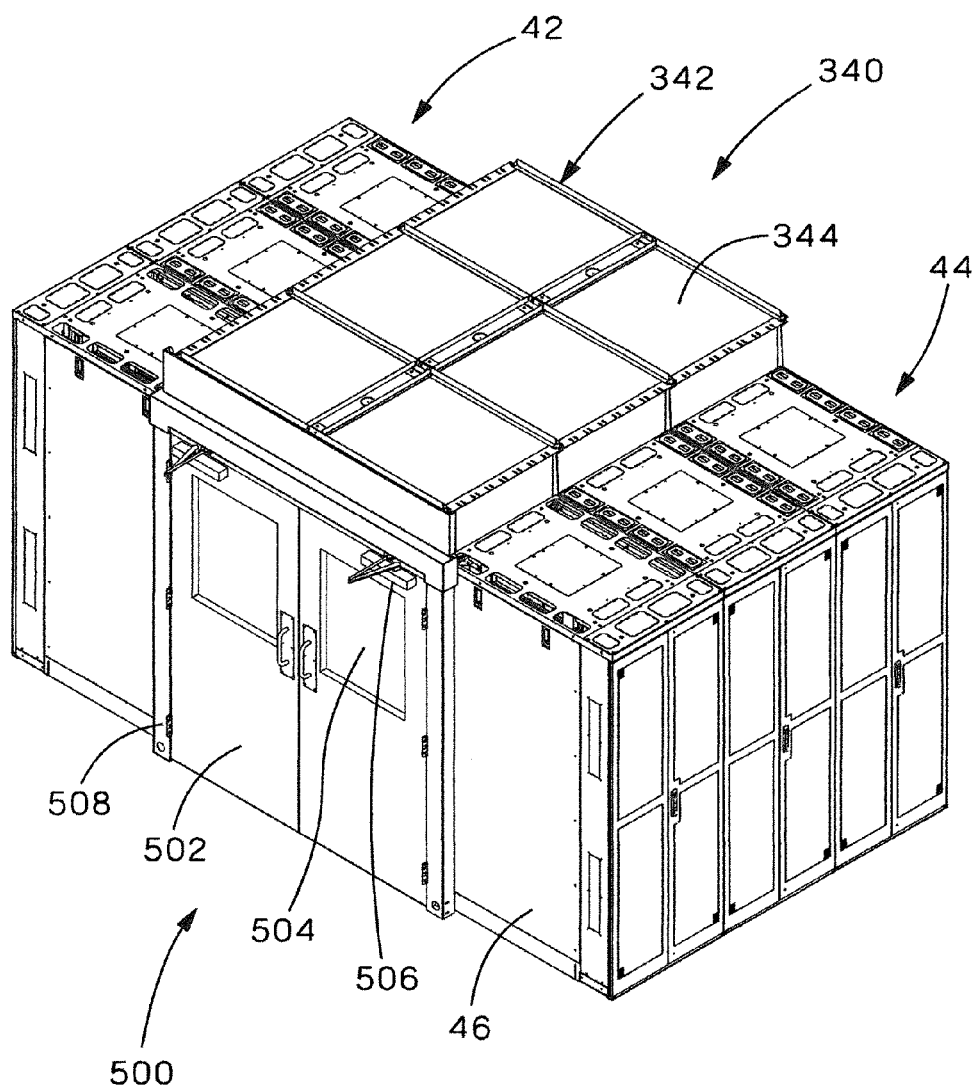
FIG. 47 is a perspective view of an alternative embodiment of the aisle containment system.
Figure 48:
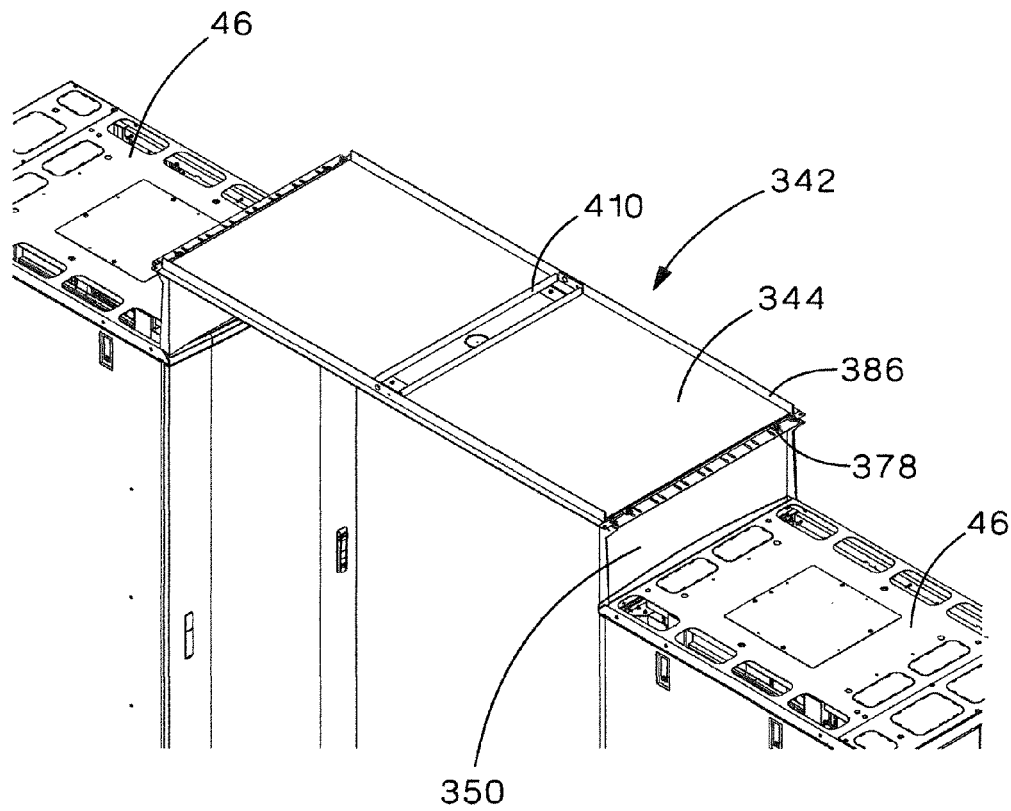
FIG. 48 is a perspective view of the ceiling structure of the aisle containment system of FIG. 47.

As shown in FIG. 46, covers 246, 248 are attached over header 212 and transom 220 to provide a clean, aesthetic look to door assembly 200. Finally, doors 202, closers 206 and perimeter seals for doors 202 are attached to door frame 208 to complete door assembly 200. Door assembly 200 can be attached to the other end of the containment aisle in a similar manner.

FIGS. 47-77 illustrate an alternative embodiment of the aisle containment system 340 of the present invention. The aisle containment system 340 can be used with any combination of 600, 700 and 800 mm cabinets.

FIGS. 48-63 illustrate an alternative ceiling structure 342 for the aisle containment system 340. Similar to the ceiling structure illustrated and described above, the ceiling structure 342 includes vertical panels 350 mounted to a cabinet 46, right angle spacer bars 378, cross aisle tee beams 386, ceiling panels 344 and fire suppression cross brackets 410.

Figure 49:
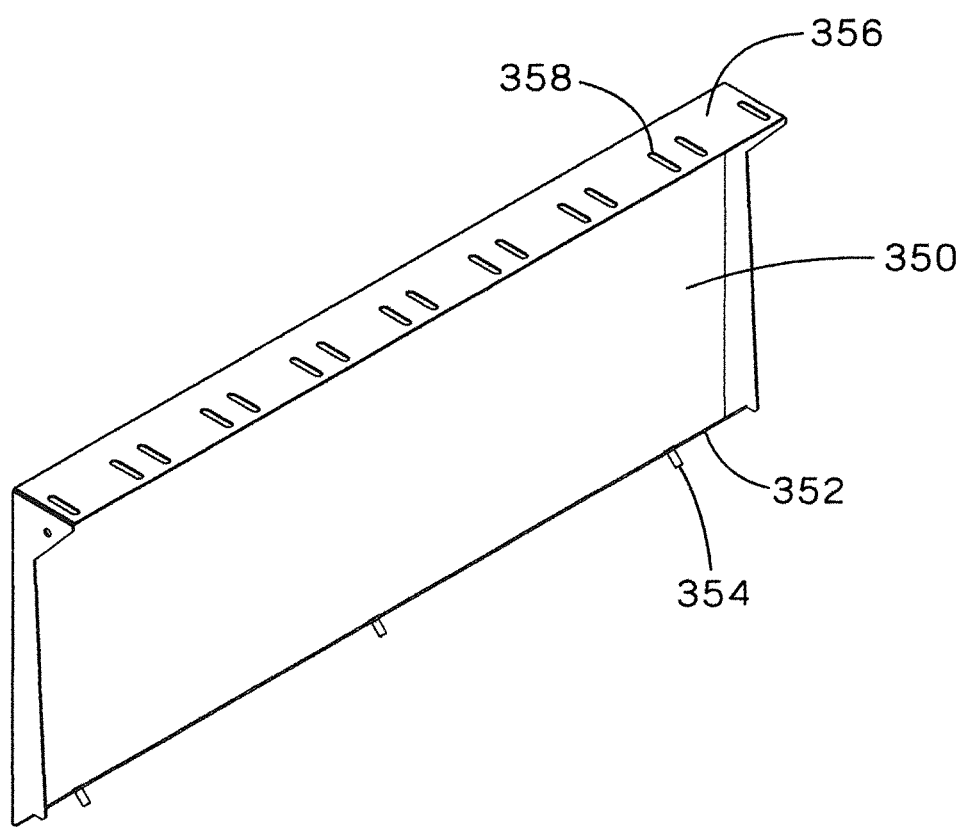
FIG. 49 is a perspective view of a vertical panel for the aisle containment system of FIG. 47.

FIG. 49 illustrates one of the vertical panels 350 that attaches to the Panduit Net-Access™ cabinet. The vertical panel 350 includes three threaded mounting studs 354 on the bottom surface 352. The threaded studs 354 match the standard mounting holes on the top of the cabinet. The vertical panel 350 includes a top flange 356 with pairs of slots 358 positioned along the top flange 356. The pairs of slots 358 are spaced at 100 mm increments, while the slots 358 are placed 30 mm apart. The 100 mm increment allows opposing cabinets to be different widths and still be able to connect to the cabinet across the aisle.

Figure 53:
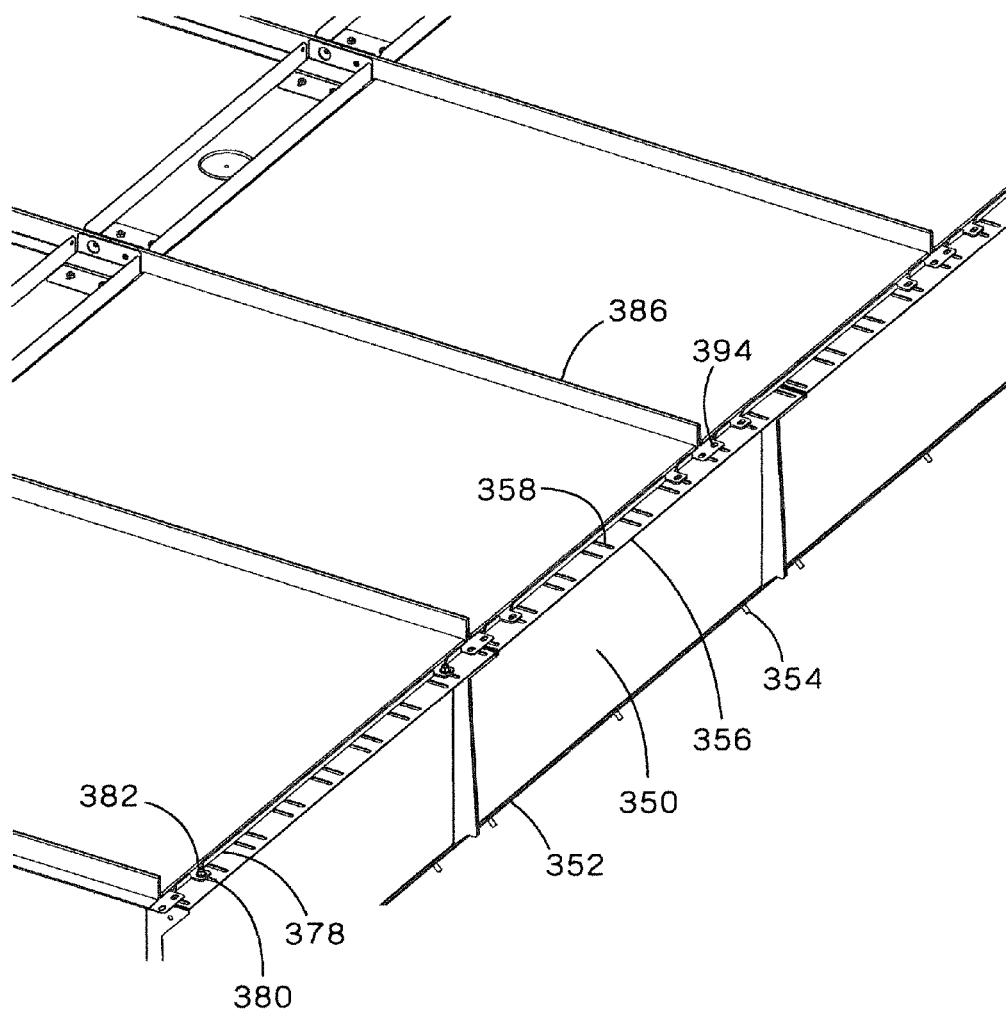
FIG. 53 is a perspective view of the right angle spacer bar and the cross aisle tee beam mounted to the aisle containment system of FIG. 47.
Figure 54:
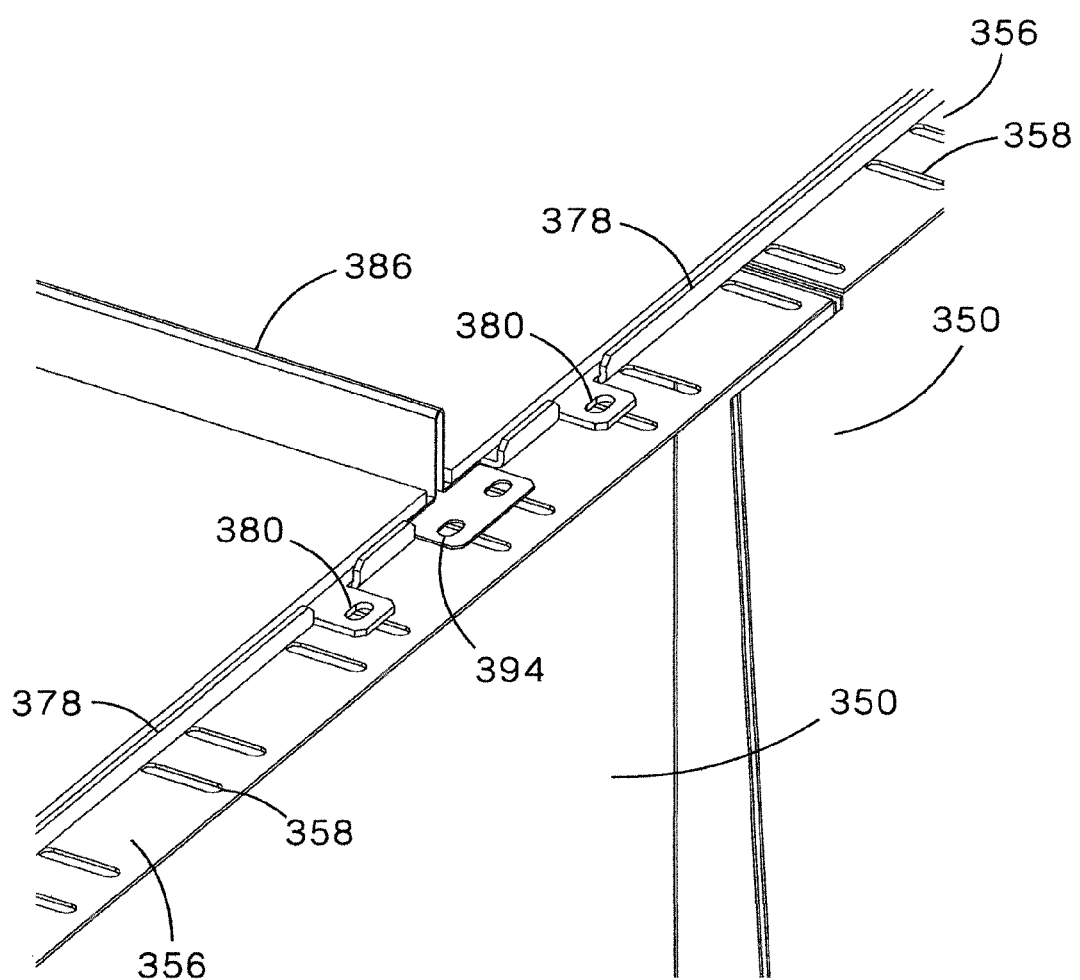
FIG. 54 is a partial perspective view of the right angle spacer bar and the cross aisle tee beam of the aisle containment system of FIG. 53.

As illustrated in FIGS. 53 and 54, the 30 mm spacing is dictated by the spacing of mounting slots 394 on the cross aisle tee beam 386. The slots 358 on the vertical panel 350 allow the cross aisle tee beams 386 to be mounted so that they form a 72" or an 1800 mm (70.866") aisle.

Figure 50:
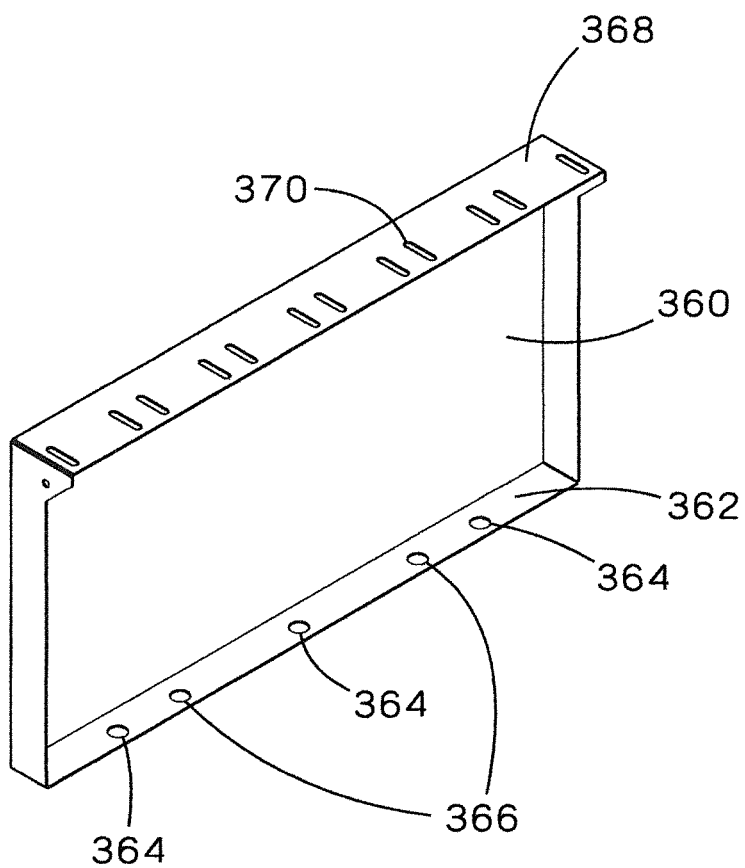
FIG. 50 is a perspective view of a vertical panel for the aisle containment system of FIG. 47 to be used with a Net-Serv™ cabinet.

FIG. 50 illustrates a vertical panel 360 that attaches to a Net-Serv™ cabinet. The vertical panel 360 includes a bottom flange 362 with clearance holes 364 for providing clearance around the head of screws that attach the top of the cabinet to the frame and mounting holes 366 for receiving bolts to secure the vertical panel 360 to the cabinet. The vertical panel 360 also includes a top flange 368 with a plurality of slots 370. The slots 370 are identical to the slots 358 described above with respect to the vertical panel 350 illustrated in FIG. 49.

Figure 51:
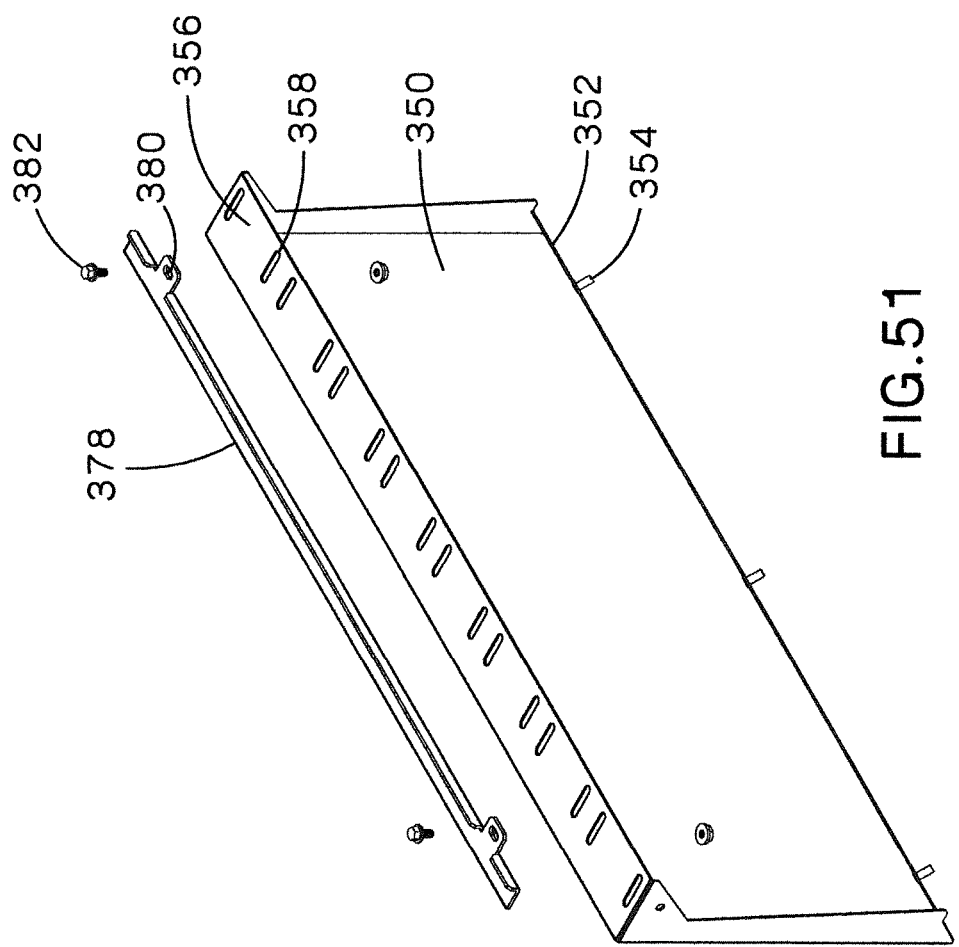
FIG. 51 is a perspective view of the vertical panel of FIG. 49, before a right angle spacer bar is mounted to the vertical panel.
Figure 52:
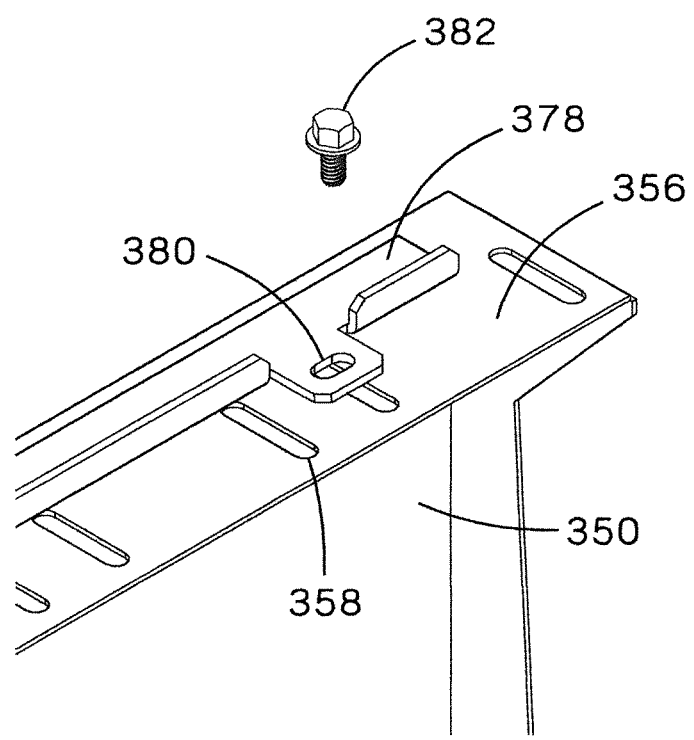
FIG. 52 is a partial perspective view of the vertical panel of FIG. 49, showing the right angle spacer bar being mounted to the vertical panel.

FIGS. 51-52 illustrate the right angle spacer bar 378 to be mounted to the vertical panel 350. The right angle spacer bar 378 fills the gap along the vertical panel 350 that is created when a ceiling panel 344 is placed on the cross aisle tee beam 386 (see FIGS. 53 and 54). As discussed above with respect to FIGS. 5 and 6, the right angle spacer bar 378 provides a stop that contains the ceiling panel 344 in the proper position. The right angle spacer bar 378 can be slid to allow the right angle spacer bar 378 to adjust for a 72" or a 1800 mm (70.866") aisle width. The slot 380 in the right angle spacer bar 378 receives a fastener 382 to connect the right angle spacer bar 378 to the vertical panel 350. The slot 380 helps account for any tolerance issues if the right angle spacer bar 378 has to span over two adjacent vertical panels 350, e.g. when opposing cabinets are different widths.

FIGS. 53-54 illustrate right angle spacer bars 378 mounted to the vertical panels 350 and the cross aisle tee beam 386 positioned on the vertical panels 350. The right angle spacer bar 378 may span between two vertical panels 350.

Figure 55:
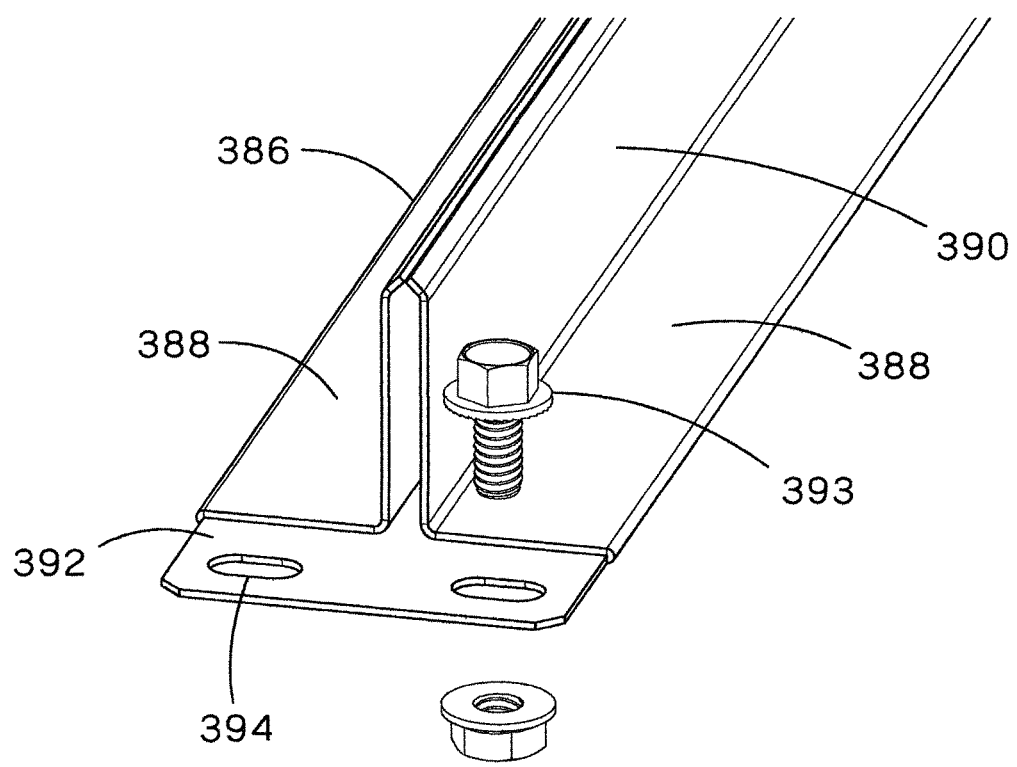
FIG. 55 is a perspective view of an end of the cross aisle tee beam of FIG. 54.

FIGS. 55-58 illustrate the cross aisle tee beam 386. The cross aisle tee beam 386 is similar to the cross aisle tee described above with respect to FIGS. 7-10. The cross aisle tee beam 386 includes two flanges 388 and a center vertical web 390. The flanges 388 support the ceiling panels 344 and the center vertical web 390 provides strength and stiffness to minimize deflection of the cross aisle tee beam 386 under a load. FIG. 55 illustrates an end 392 of the cross aisle tee beam 386. The ends 392 of the cross aisle tee beam 386 include slots 394 for receiving fasteners 393 to mount the cross aisle tee beam 386 to the vertical panels 350.

Figure 56:
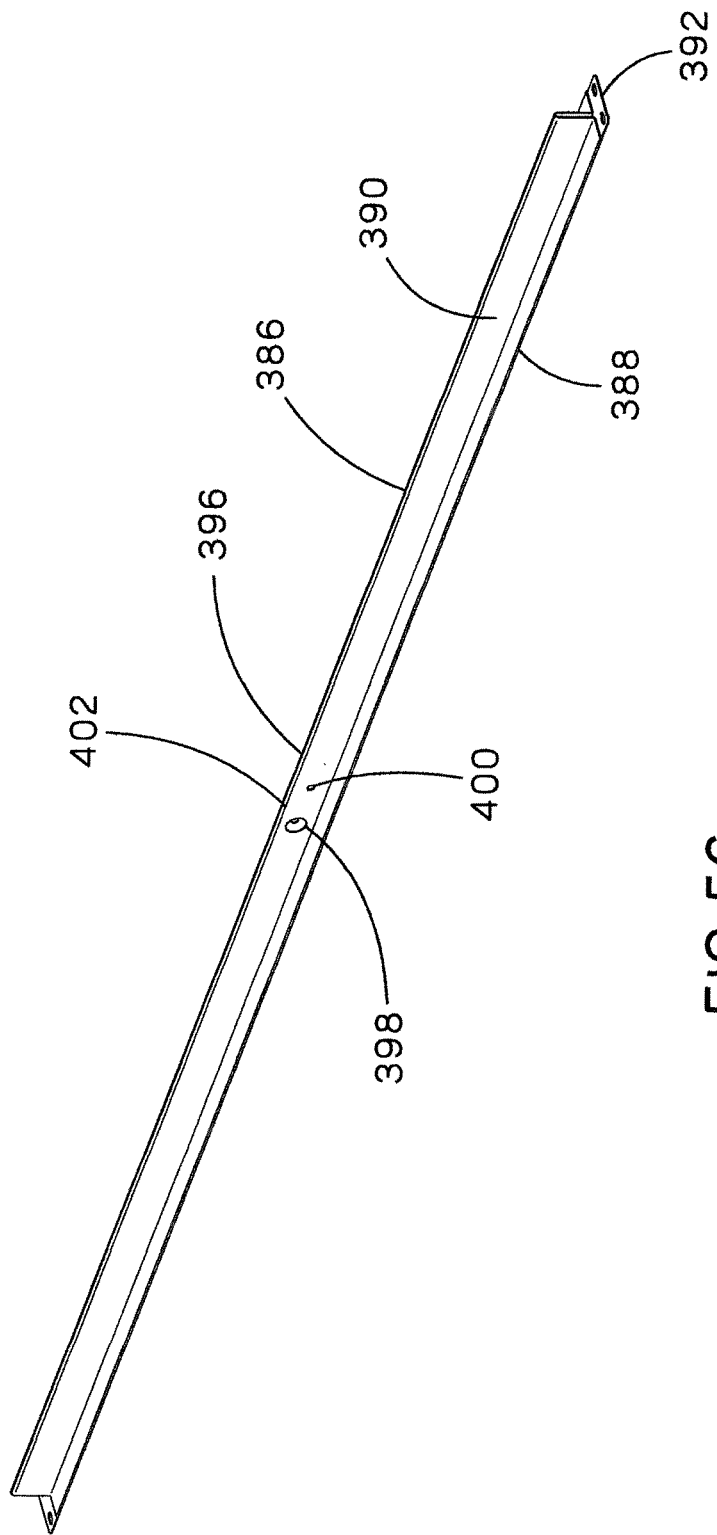
FIG. 56 is a perspective view of a cross aisle tee beam for the aisle containment system of FIG. 47.
Figure 57:
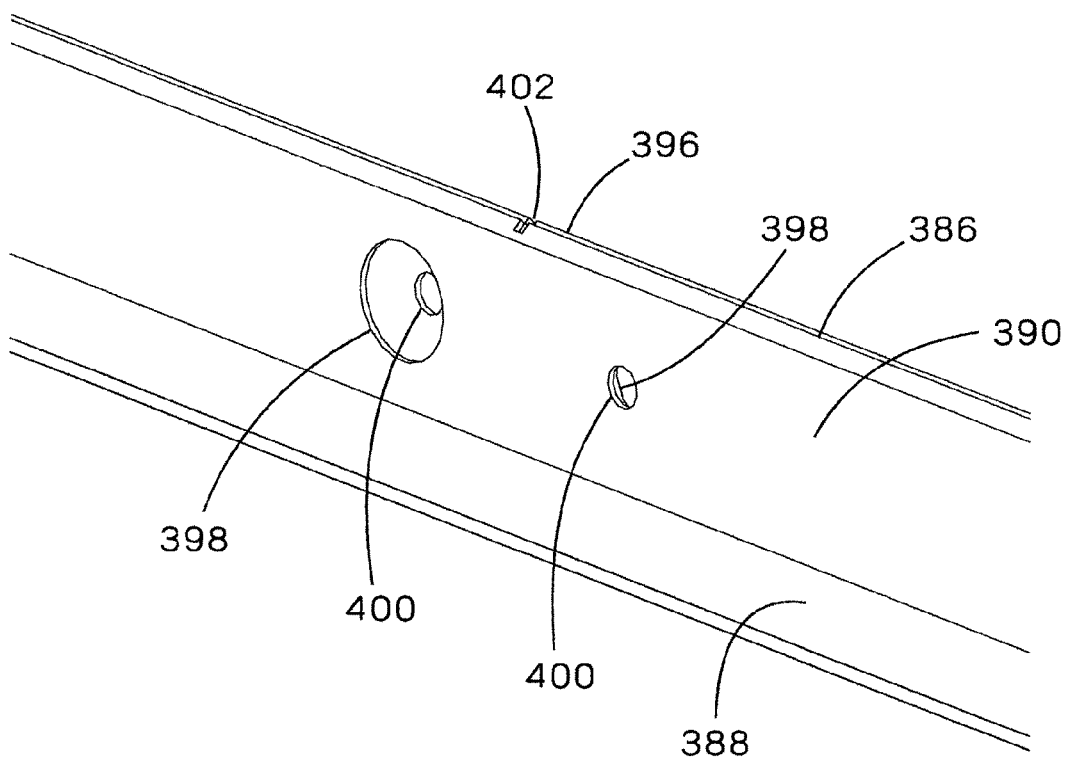
FIG. 57 is a partial perspective view of the center of the cross aisle tee beam of FIG. 56.
Figure 58:
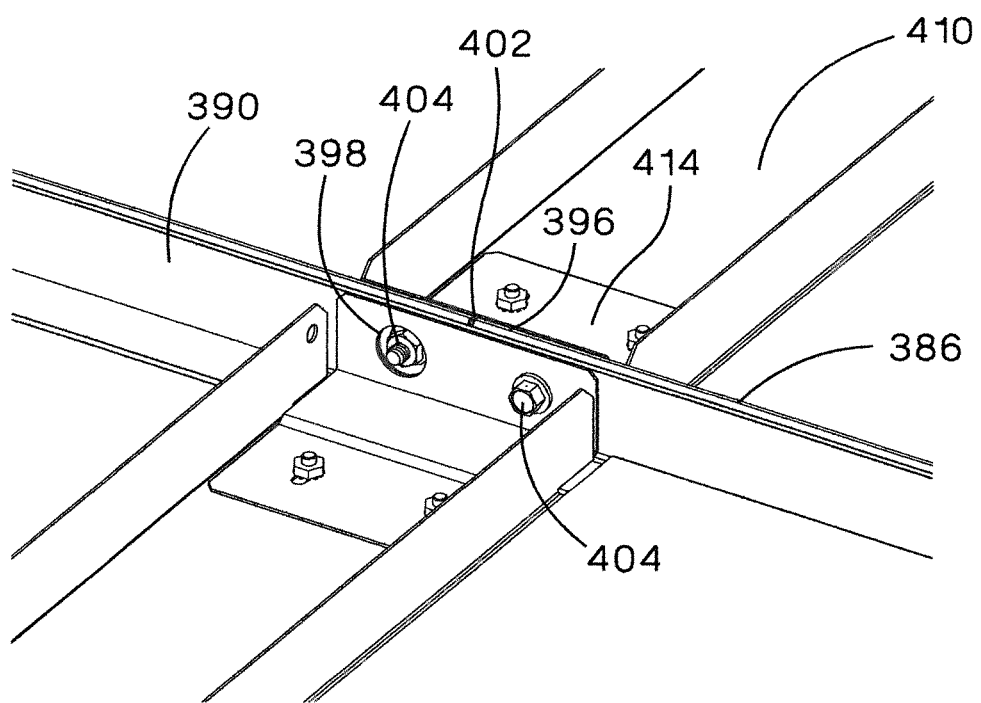
FIG. 58 is a partial perspective view of the cross aisle tee beam and the fire suppression cross bracket mounted to the aisle containment system of FIG. 53.

FIGS. 56-58 illustrate the cross aisle tee beam 386 with holes 398, 400 punched near the center 396 of the cross aisle tee beam 386 to enable fire suppression cross brackets 410 to be attached. As illustrated in FIG. 57, the cross aisle tee beam 386 includes at least one large hole 398 on one side and a smaller hole 400 on the opposite side. As illustrated in FIG. 58, the large hole 398 and the small hole 400 provide clearance for the fastener 404 used to secure the fire suppression cross bracket to pass through the vertical web 390 of the cross aisle tee beam 386 and be secured against a solid metal face. This prevents the cross aisle tee beam 386 from being crushed if the fastener 404 is over tightened. The cross aisle tee beam 386 also includes a notch 402 punched into the center 396 of the cross aisle tee beam 386. The notch 402 enables the installer to center the cross aisle tee beam 386 relative to the cabinets 46. The notches 402 keep the cross aisle tee beams aligned so that all fire suppression cross brackets 410 are positioned at the center of the aisle.

Figure 59:
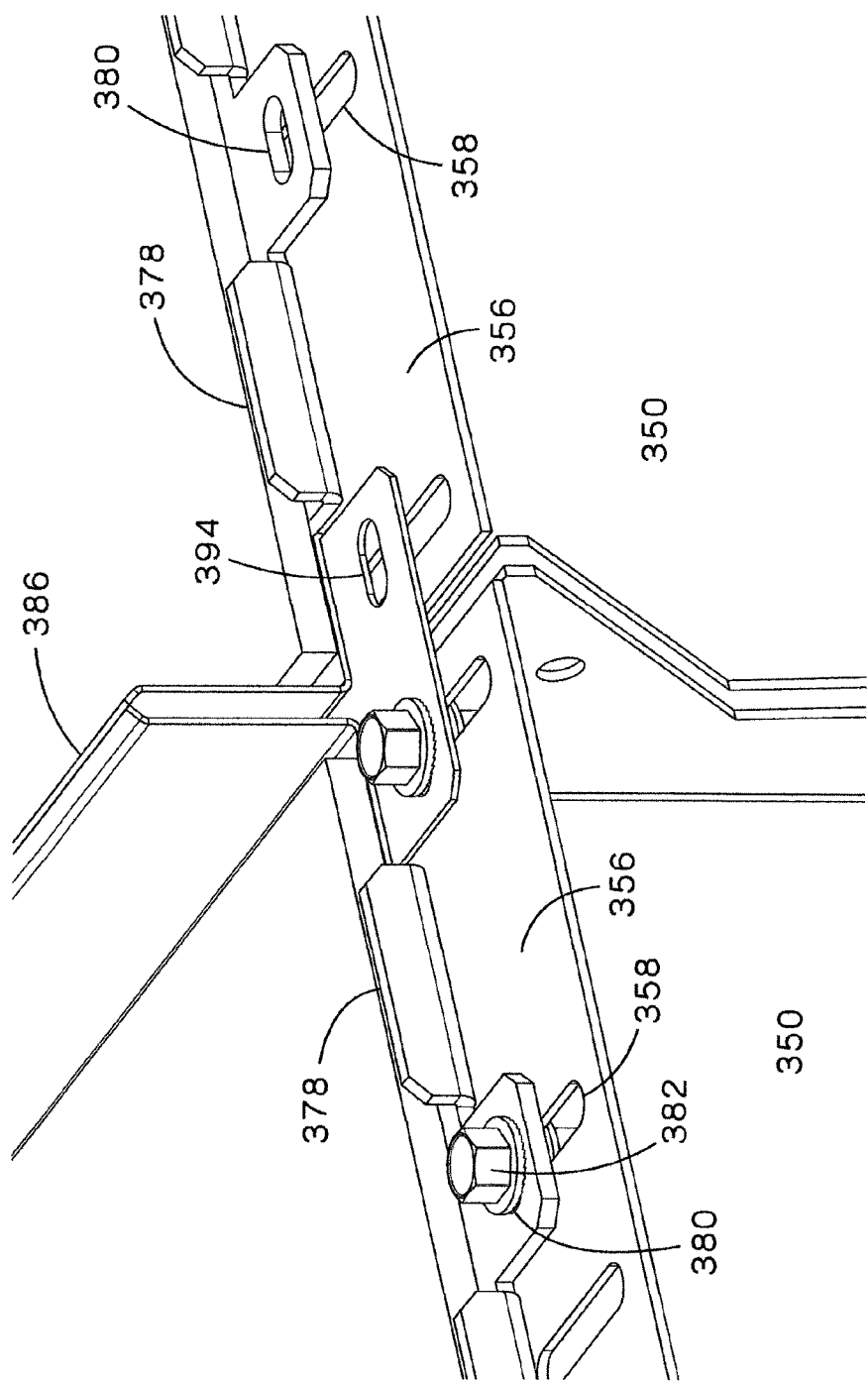
FIG. 59 is a partial perspective view of a cross aisle tee beam mounted on the vertical panels of FIG. 49.
Figure 60:
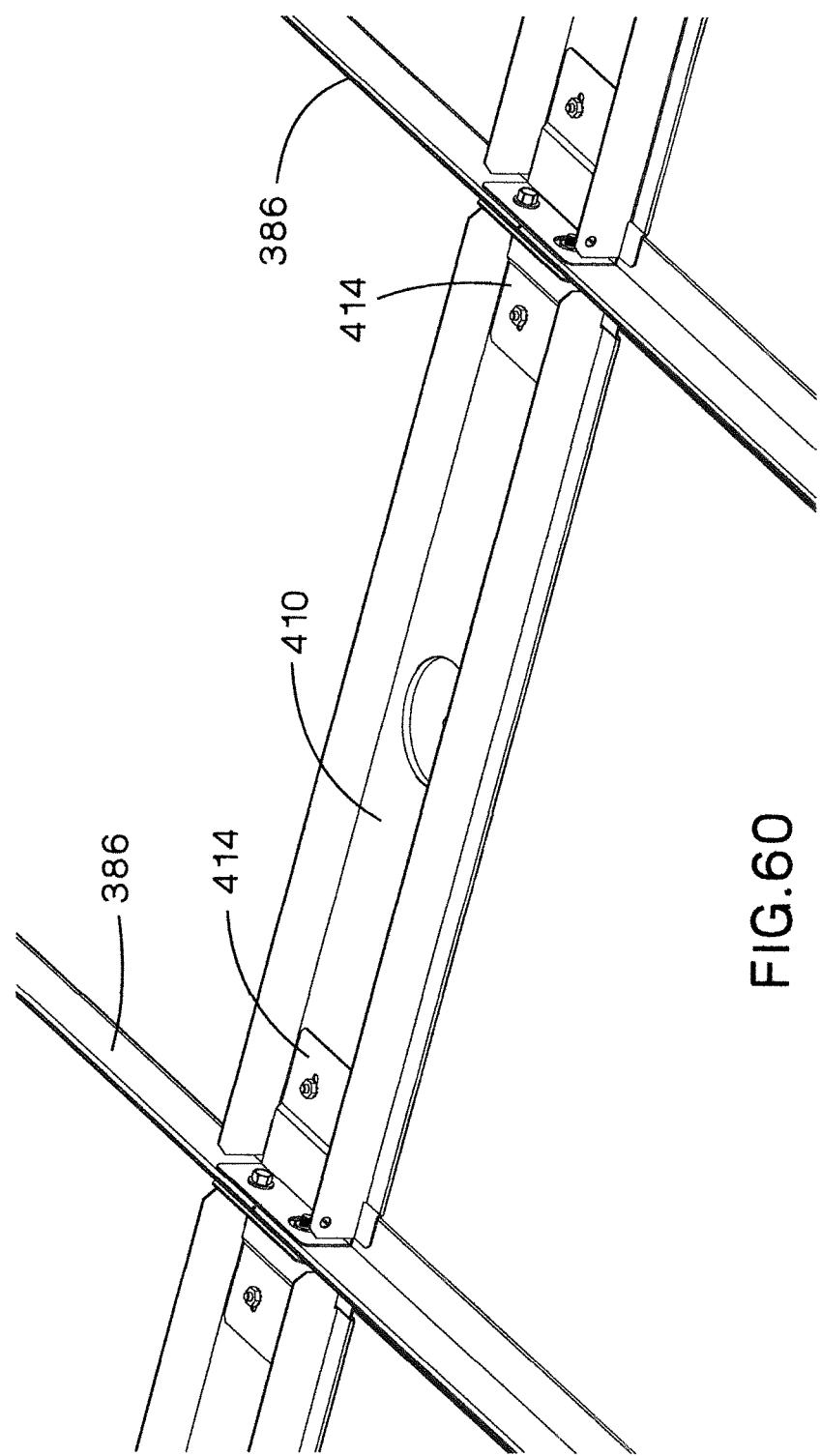
FIG. 60 is a partial perspective view of cross aisle tee beams and the fire suppression cross brackets mounted to the aisle containment system of FIG. 53.
Figure 61:
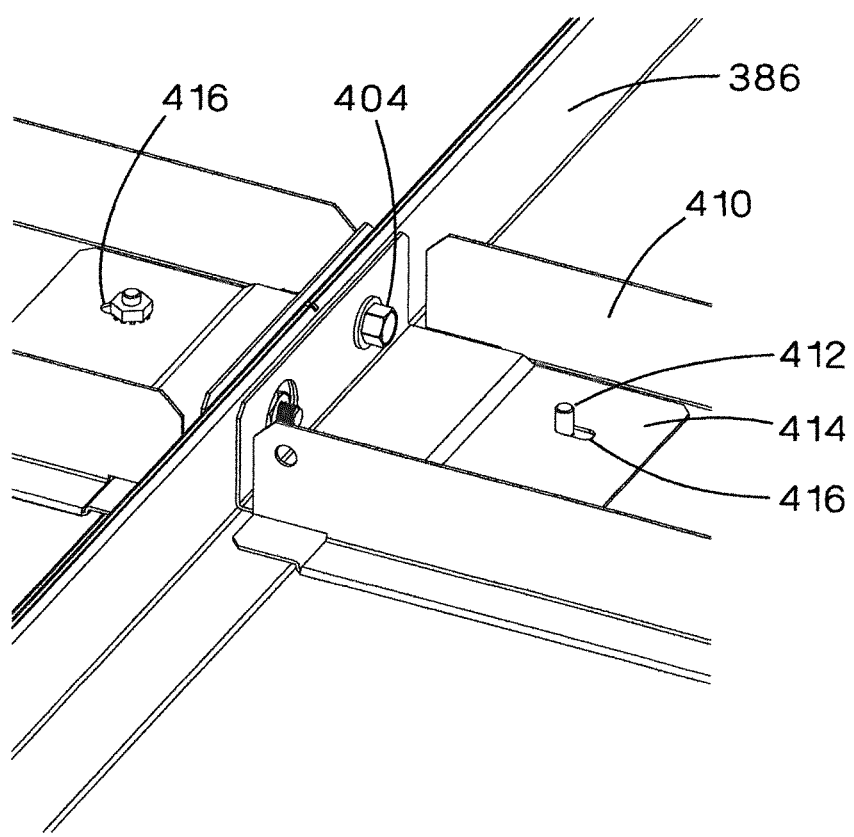
FIG. 61 is an enlarged perspective view of the fire suppression cross bracket mounted to a cross aisle tee beam of FIG. 53.

FIGS. 59-63 illustrate the slots in the aisle containment system that account for tolerance variations when installing various sized cabinets in the system. For example, FIG. 59 illustrates the slots 394, 380 in the cross aisle tee beam 386 and the right angle spacer bracket 378, respectively, that are parallel to the aisle to account for tolerance gaps that might occur during cabinet placement. FIGS. 60-61 illustrate the fire suppression cross bracket 410 secured to the cross aisle tee beams 386 with adjustable brackets 414. Each adjustable bracket 414 has slots 416 that threaded studs 412 extending from the fire suppression cross bracket 410 pass through. The adjustable bracket 414 can be adjusted to account for variations in the placement of the cross aisle tee beams 386 due to various sized cabinets.

Figure 62:
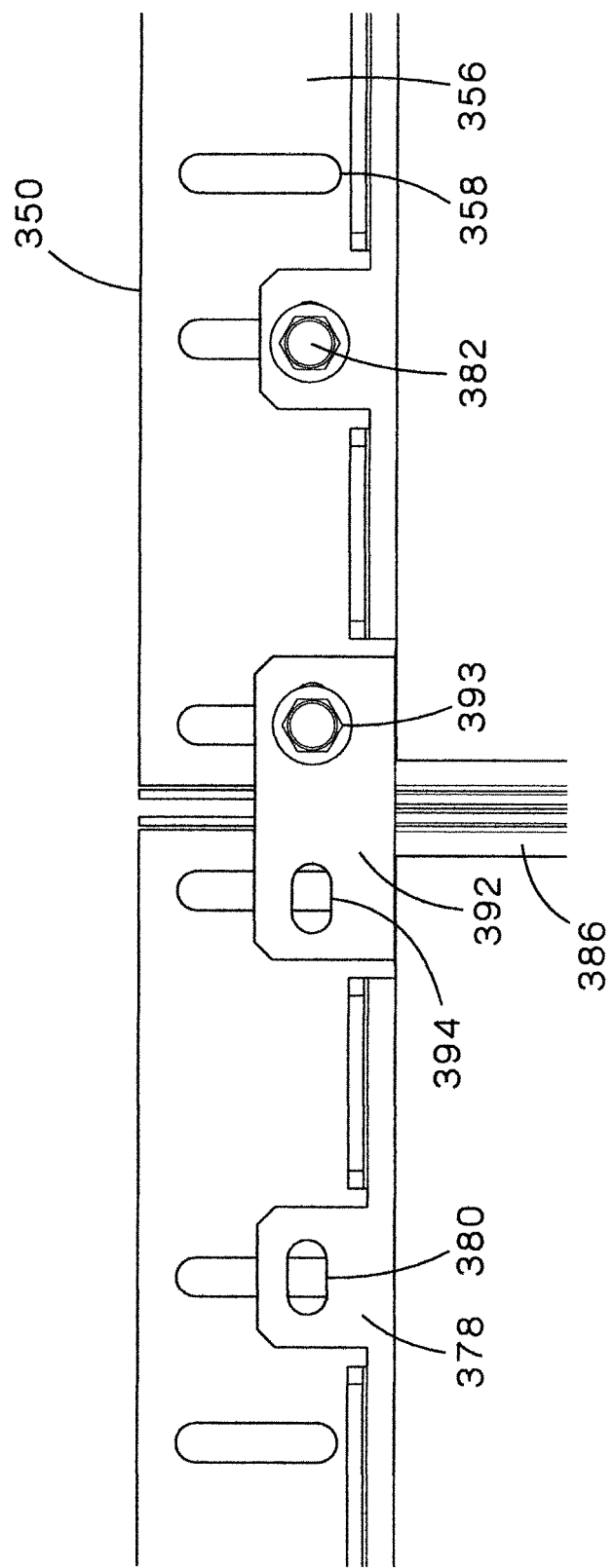
FIG. 62 is a top view of the aisle containment system of FIG. 53 with the aisle containment components positioned for a maximum aisle width.
Figure 63:
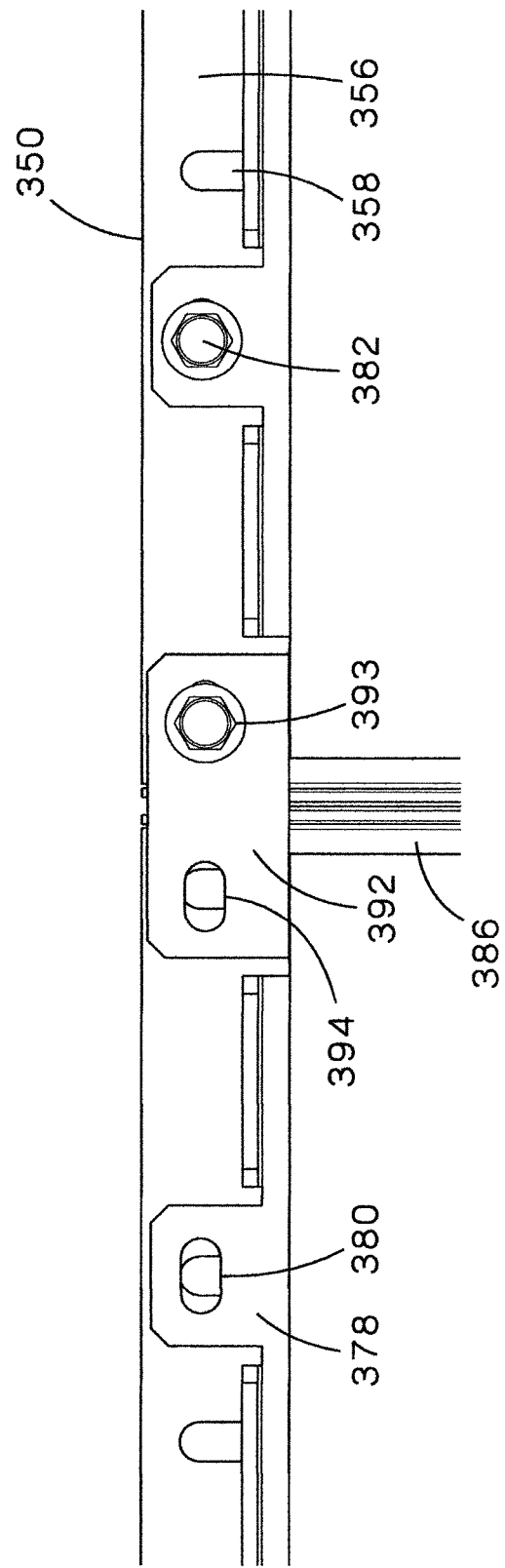
FIG. 63 is a top view of the aisle containment system of FIG. 53 with the aisle containment components positioned for a minimum aisle width.
Figure 64:
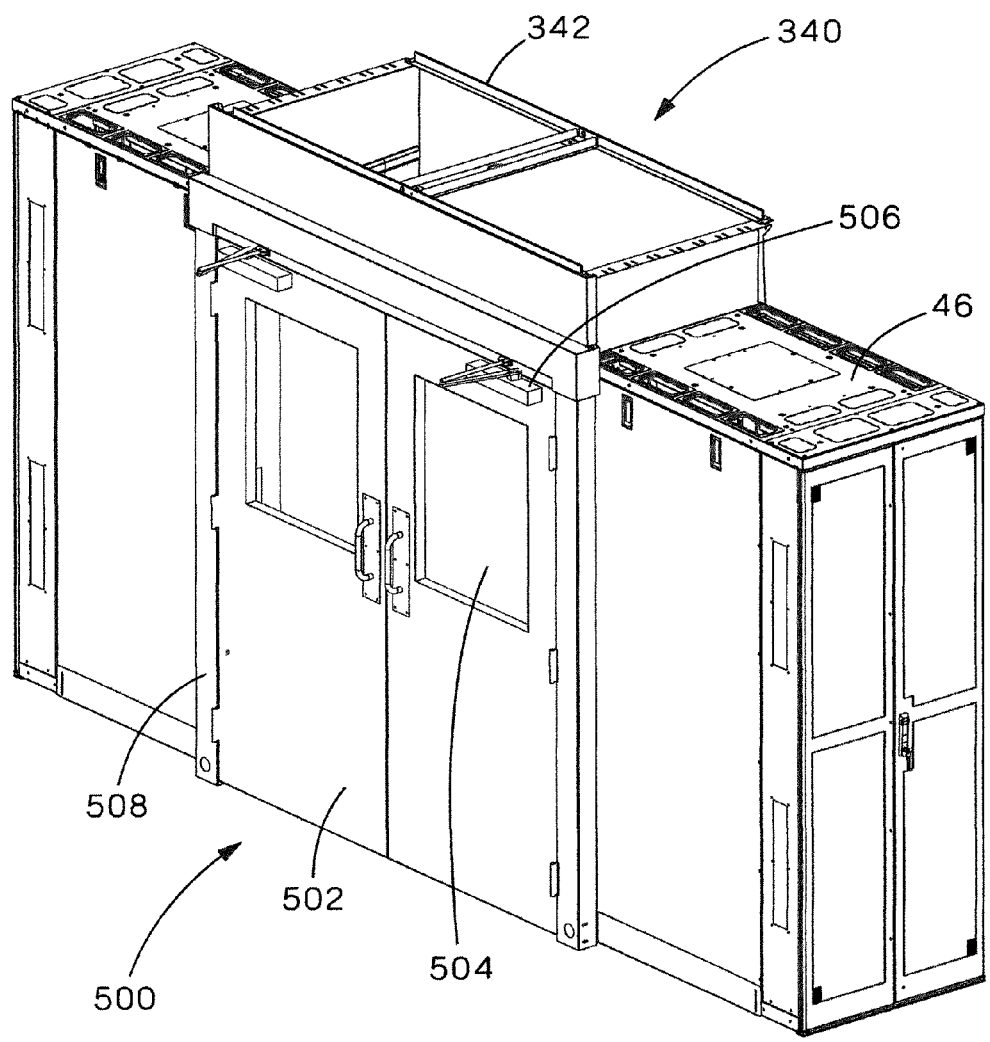
FIG. 64 is a perspective view of an alternate door assembly for the aisle containment system of FIG. 47.

FIGS. 62 and 63 illustrate the slots 358 in the vertical panels 350 accounting for different aisle widths. FIG. 62 illustrates the aisle containment components positioned for the widest aisle. The cross aisle tee beam 386 and the right angle spacer bars 378 are positioned near the front of the slot 358 in the vertical panel 350. FIG. 63 illustrates the aisle containment components positioned for the narrowest aisle. For the narrowest aisle, the cross aisle tee beams 386 and the right angle spacer bar 378 are positioned near the rear of the slot 358 in the vertical panel 350. The same ceiling panels 344 are used for both the narrow and wide aisles.

FIGS. 64-77 illustrate an alternate door assembly 500 for the aisle containment system 340. The door assembly 500 is similar to the door assembly 200 described above with respect to FIGS. 34-46. The door assembly 500 includes doors 502 with half windows 504 and closers 506 and a door frame 508.

Figure 65:
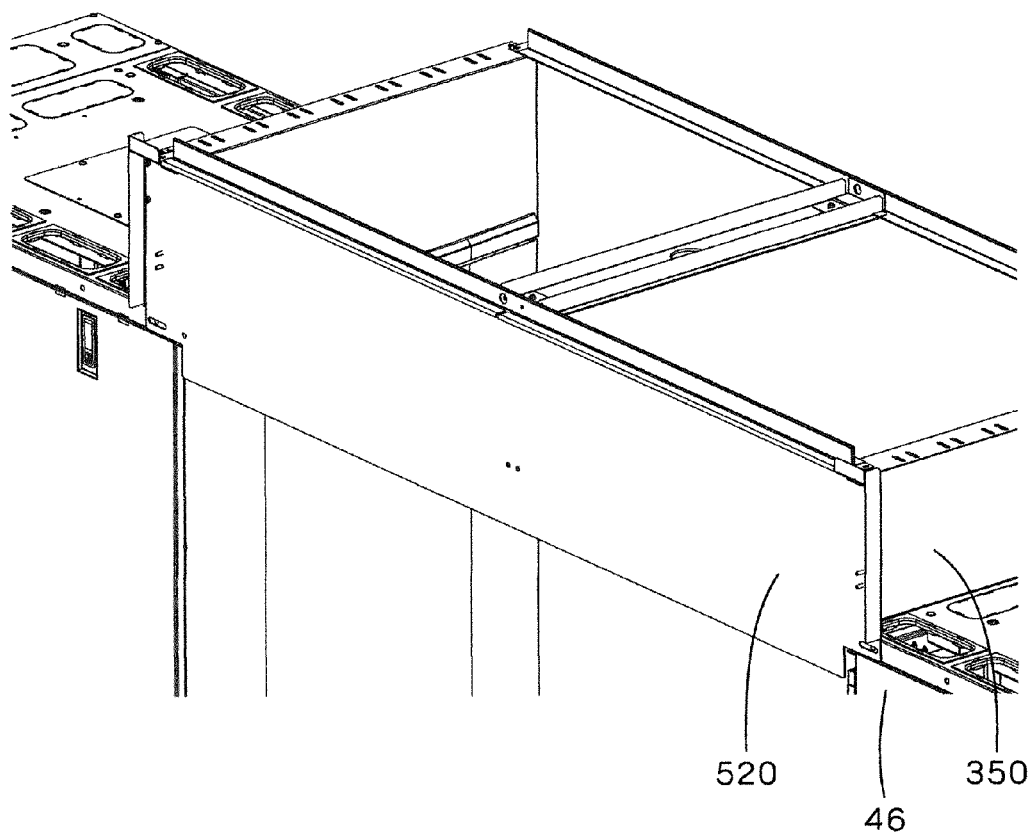
FIG. 65 is an enlarged perspective view of a transom for the door assembly of FIG. 64.

FIG. 65 illustrates a transom 520 that fills the area above the door frame 508 up to the aisle containment ceiling. The transom 520 is attached to a side of the vertical panels 350 and the top of the cabinet 46. The transom 520 moves up and down with the cabinet 46 as the cabinet leveling legs (not illustrated) are adjusted.

Figure 66:
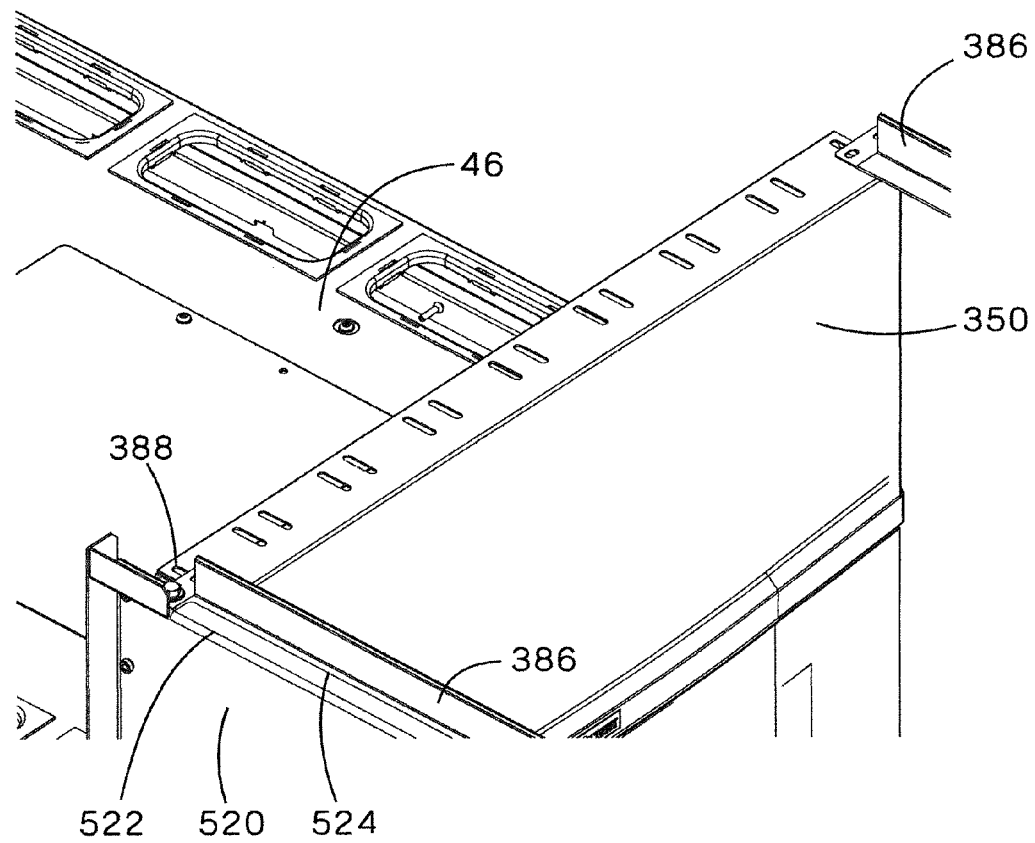
FIG. 66 is a perspective view of a portion of the transom of FIG. 65.

FIG. 66 illustrates a cross aisle tee beam 386 attached to the top 522 of the transom 520. An open hem 524 across the top 522 of the transom 520 hooks over one flange 388 of the cross aisle tee beam 386. The location of the open hem 524 aids in attaching the transom 520 to the cabinets 46.

Figure 67:
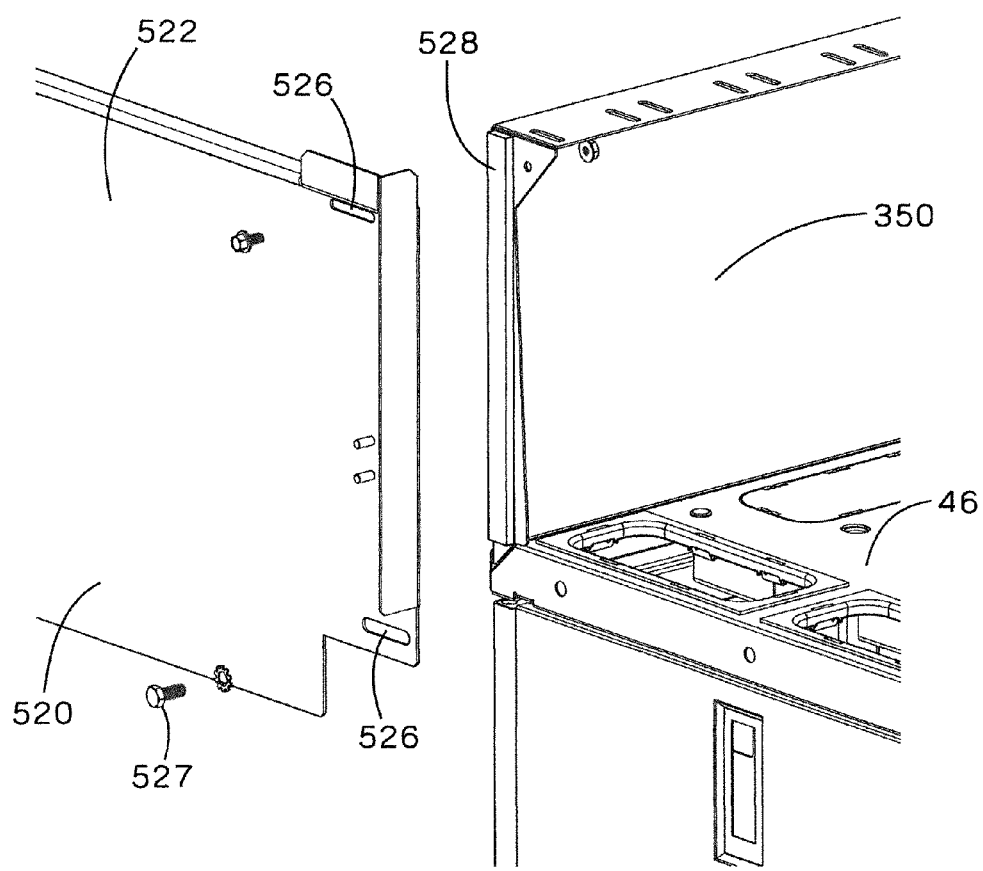
FIG. 67 is an exploded perspective view of a portion of the transom of FIG. 65, before the transom is attached to the top of the network cabinet.

FIG. 67 illustrates the transom 520 to be mounted to the side of the vertical panel 350 and the top of the cabinet 46. The transom 520 includes slots 526 that receive fasteners 527 to enable the transom 520 to be mounted over either a 72" or a 1800 mm (70.866") aisle width. The slots 526 also allow the transom 520 and the attached door frame (see FIGS. 73 and 74) to be adjusted left and right to ensure that the door posts 510 are vertical. FIG. 67 also illustrates a foam seal 528 that is positioned between the transom 520 and the vertical panel 350.

Figure 68:
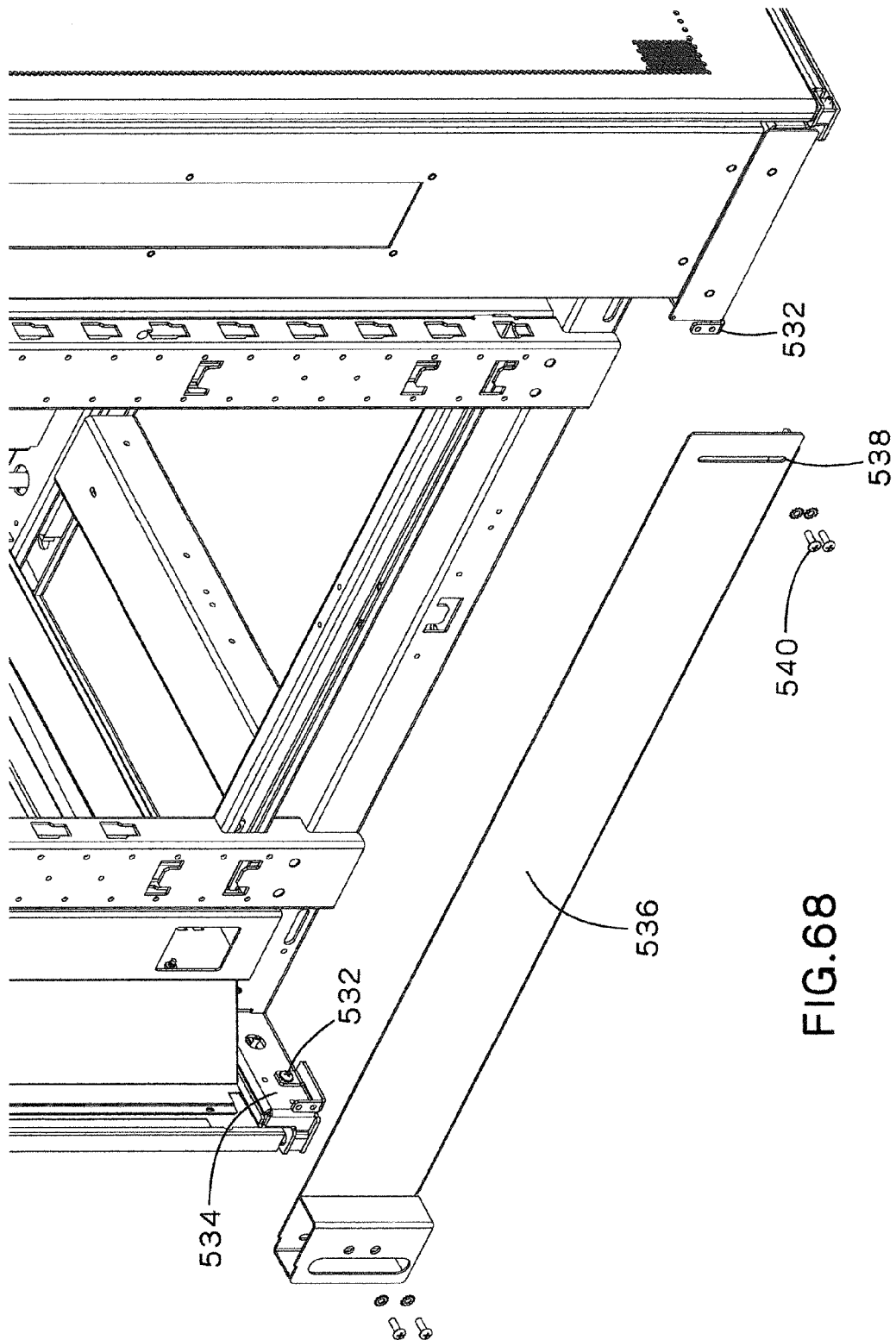
FIG. 68 is an exploded perspective view of a side skirt of the door assembly of FIG. 64, before the side skirt is attached to the bottom of the network cabinet.
Figure 69:
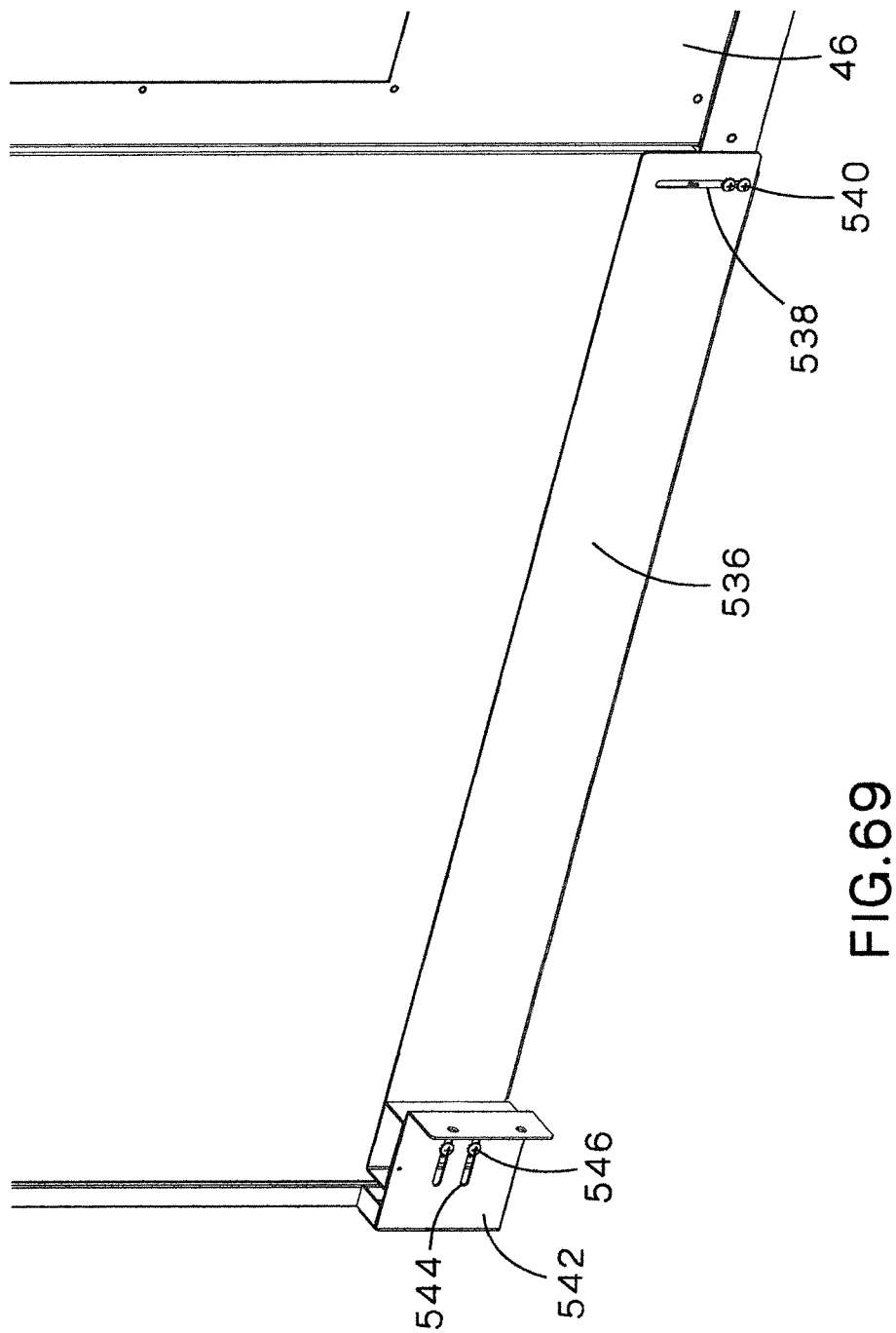
FIG. 69 is a perspective view of the side skirt of FIG. 68, after the side skirt is attached to the bottom of the network cabinet.

FIGS. 68-69 illustrate lower brackets 532 and a side skirt 536 that are used to attach the door frame 508 to the bottom of the cabinets. Lower brackets 532 are attached to the door shoes 534. The cabinet side panels are removed to ease installation of the lower brackets 532, but the cabinet side panels are reinstalled before the side skirt 536 is installed.

A side skirt 536 is attached to the lower brackets 532. The side skirt 536 rests on the floor and is held against the cabinet side panel to prevent air leakage. The bottom of the side skirt 536 includes a flange (not illustrated) that tucks under the cabinet 46. The side skirt 536 also includes slots 538 that receive fasteners 540 for mounting the side skirt 536. The slots 538 enable the side skirt 536 to remain on the floor when the cabinet 46 is raised off the floor by casters or leveling legs.

Figure 72:
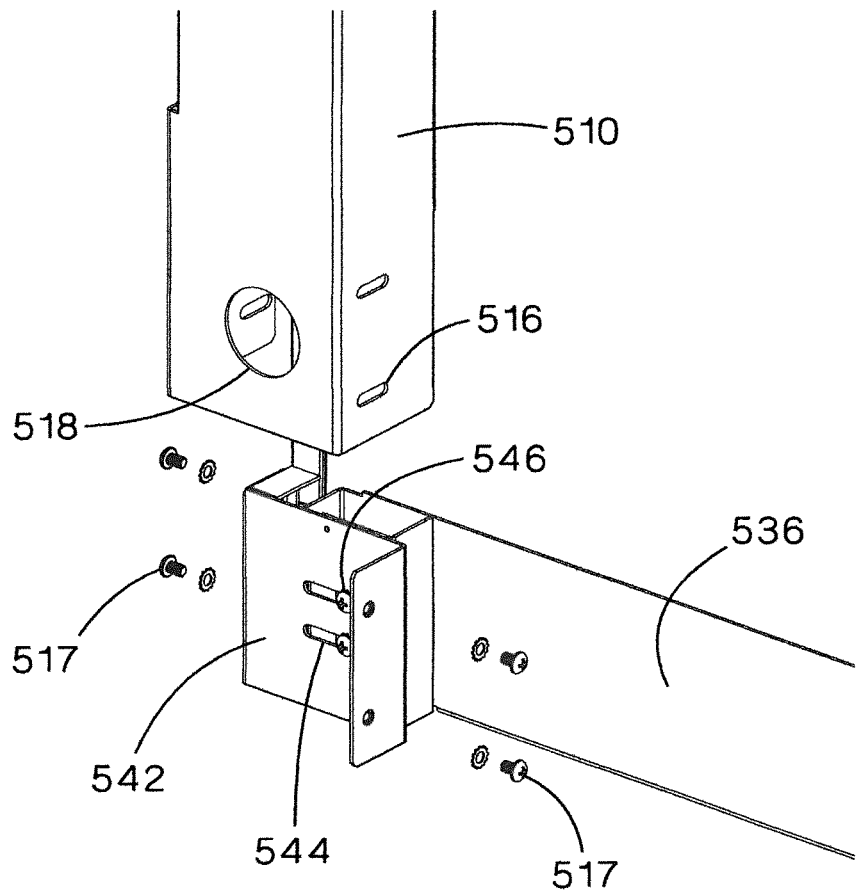
FIG. 72 is an exploded perspective view of a portion of the door assembly of FIG. 64, before the door frame is attached to the lower post support and the side skirt.

FIG. 69 illustrates lower post support 542 attached to the side skirt 536. The lower post support 542 has slots 544 that receive fasteners 546 and that allow the lower post support 542 to be horizontally adjusted. As illustrated in FIG. 72, the door post 510 slips over and is attached to the lower post support 542. Thus, the slots 544 in the lower post support 542 provide horizontal adjustment to allow the door posts 510 to be mounted 72" apart when the aisle width is either 72" or 1800 mm (70.866").

Figure 70:
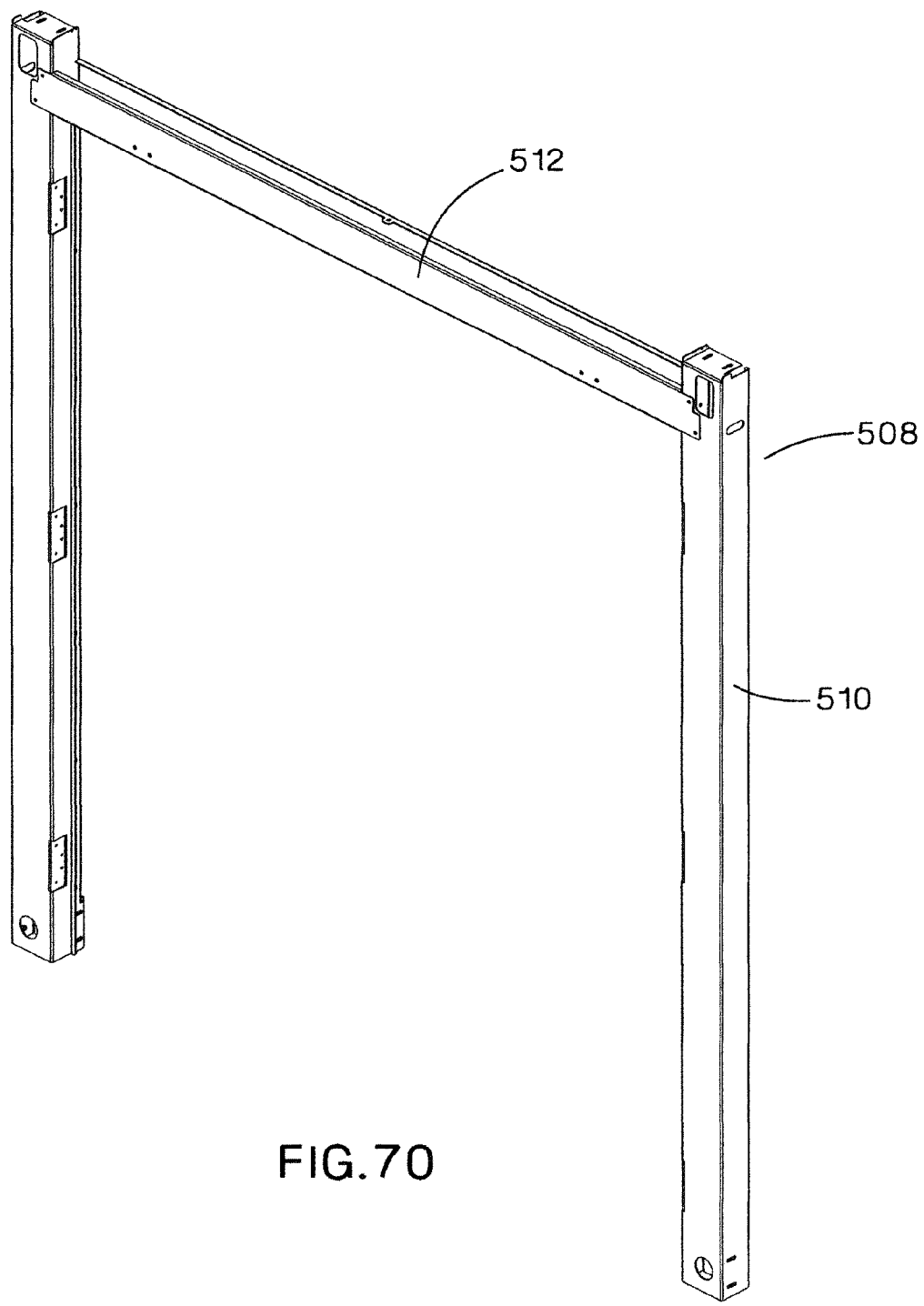
FIG. 70 is a perspective view of a door frame of the door assembly of FIG. 64.
Figure 71:
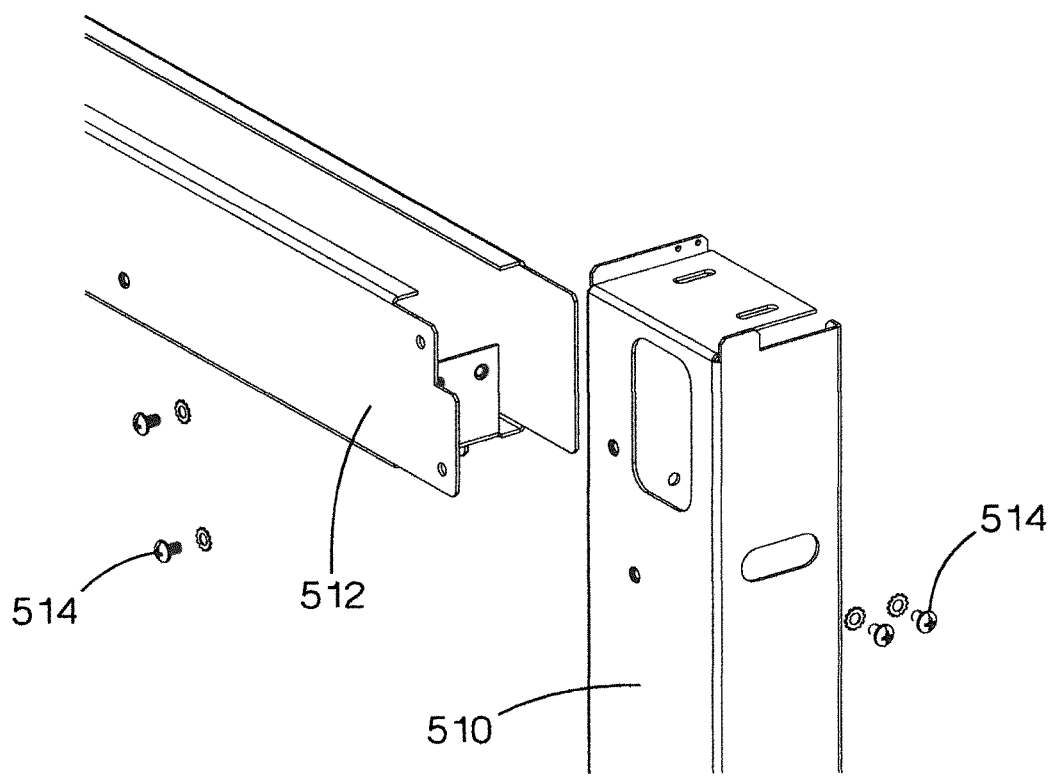
FIG. 71 is an exploded front perspective view of a portion of the door frame of FIG. 70.

FIGS. 70-71 illustrate the door frame 508. The door frame 508 includes two door posts 510 and a header 512 bolted to the top of the door posts 510. Typically, the header 512 is fastened to the door posts 510 at the job site to facilitate shipping of the parts of the door assembly 500. As illustrated in FIG. 71, the header 512 is attached to the top of the door post 510 using fasteners 514 in the front and on the side of the door post 510. The header 512 includes a foam seal (not illustrated) attached along the back of the header 512 to press against the transom 520 when the door assembly is completely assembled. Foam seals (not illustrated) are also placed on the back of the door posts. The foam seals press against the cabinet side panels.

FIG. 72 illustrates a door post 510 to be installed over the lower post supports 542. The door post 510 includes slots 516 that receive fasteners 517 to secure the door post 510 to the lower post support 542. The slots 544 enable the door post 510 to be adjusted front-to-back to ensure that the door posts 510 are vertical. The front of the door post also includes a hole 518 in the bottom to provide access to the fasteners holding the lower post support 542 to the side skirts 536. The hole 518 also enables side-to-side adjustment of the door post 510 to ensure that the door post 510 is vertical. The hole 518 may be covered via a plastic plug (not illustrated).

Figure 73:
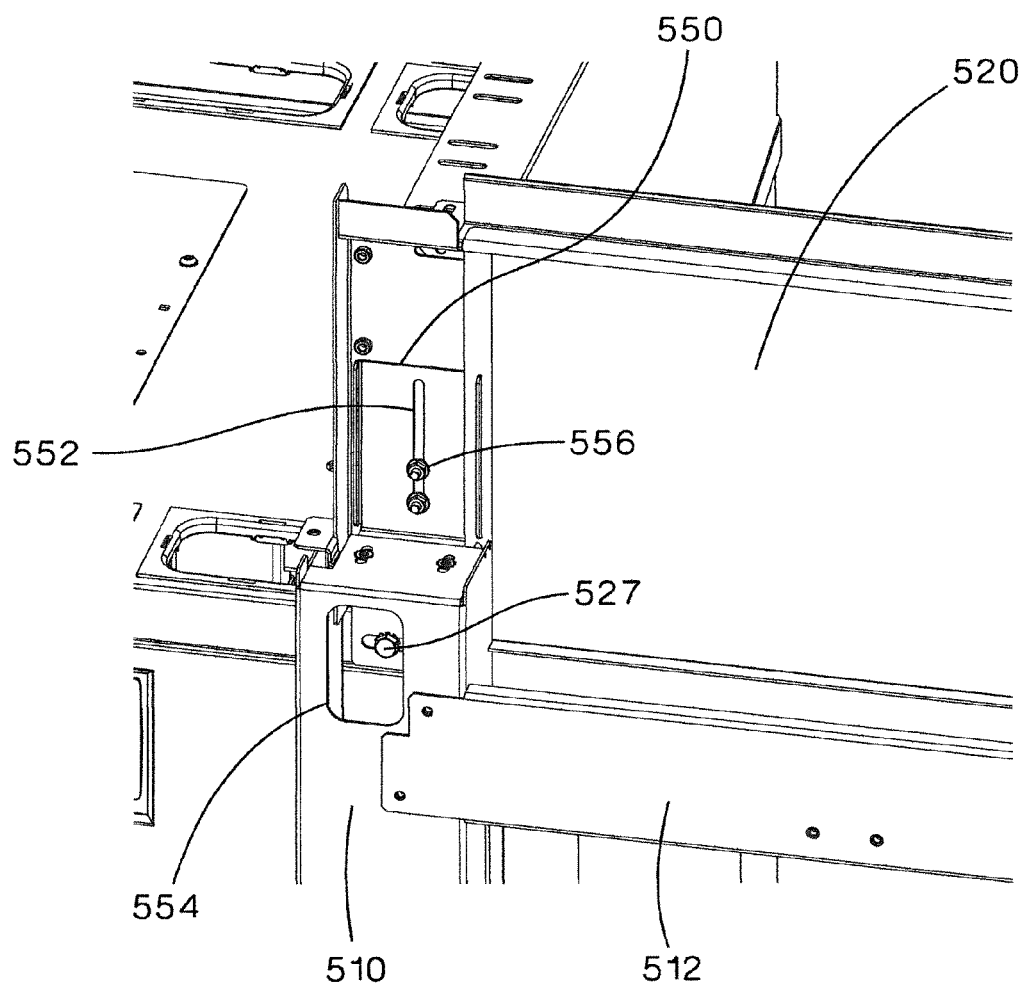
FIG. 73 is a front perspective view of a portion of the door assembly of FIG. 64, after the door frame is attached to the transom.

FIG. 73 illustrates a top post bracket 550 that is used to attach the door posts 510 and attached header 512 to a transom 520. Each top post bracket 550 includes a slot 552 for receiving fasteners 556 to allow front to back adjustment of the door posts 510. The slot 552 also accommodates the vertically adjusted cabinets 46. The top of the door posts 510 includes an access hole 554 to provide access to the fasteners 527 that attach the transom 520. The door posts 510 may be adjusted to the left or right to ensure that the door frame 508 is vertical.

Figure 74:
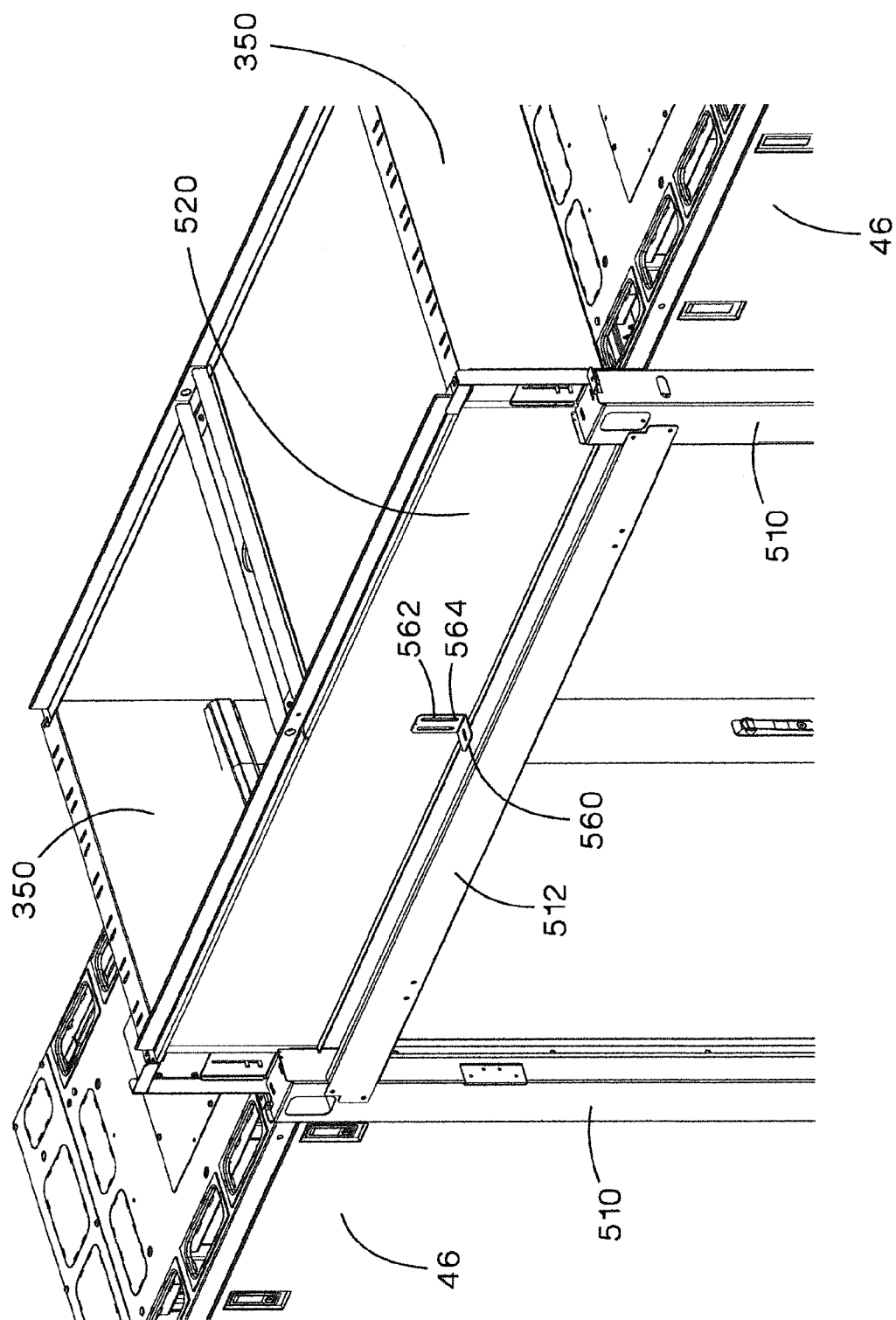
FIG. 74 is a perspective view of the door assembly of FIG. 64, after the header is attached to the transom.
Figure 75:
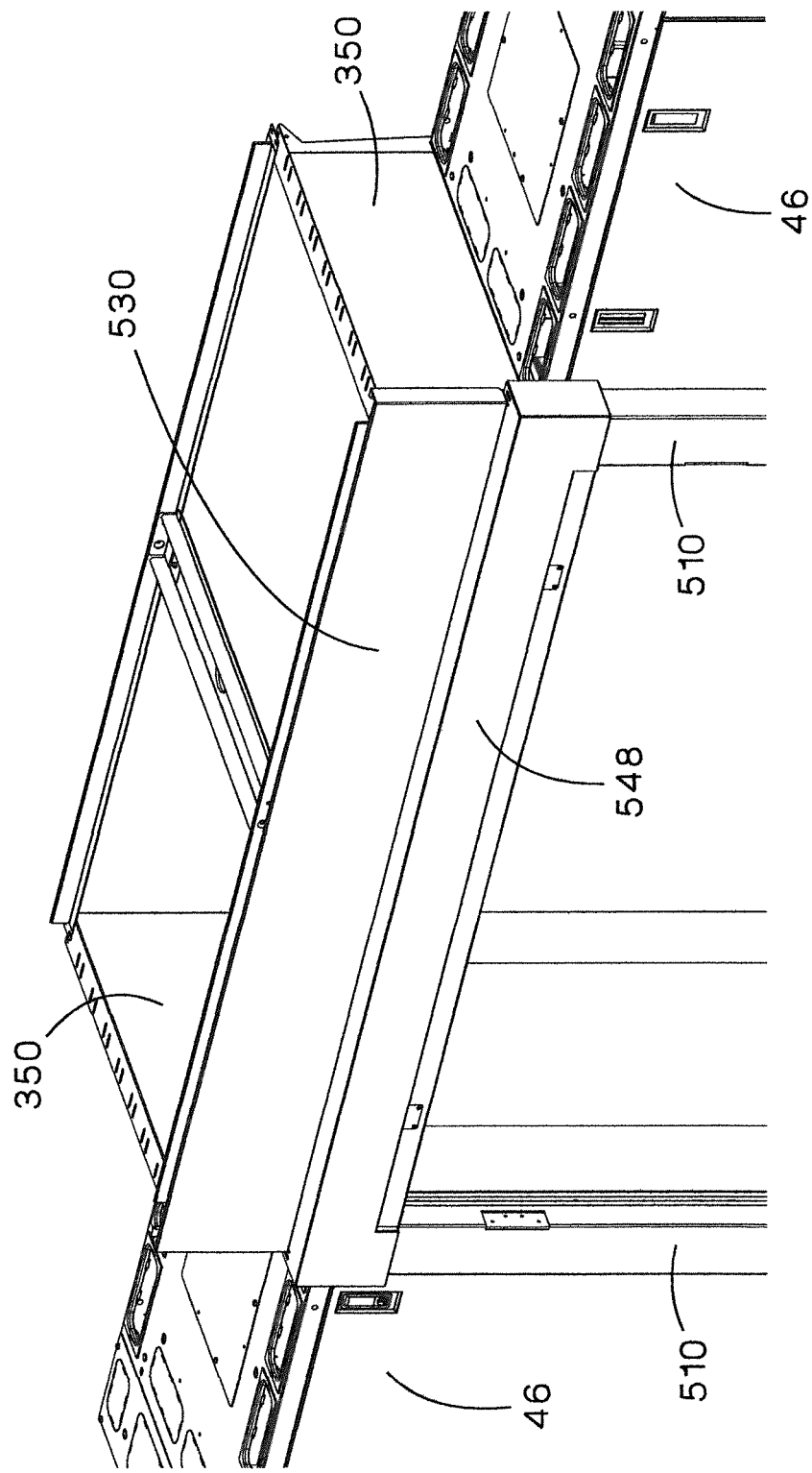
FIG. 75 is a perspective view of the door assembly of FIG. 64, after covers are placed over the transom and the header.

FIG. 74 illustrates the door posts 510 and the header 512 of the aisle containment system secured to two cabinets 46. The transom 520 and vertical panels 350 are secured to the top of the cabinets 46. A center bracket 560 is used to attach the center of the header 512 to the center of the transom 520. The center bracket 560 prevents the transom 520 from deforming due to the pressure from the foam seal between the header 512 and the transom 520. The center bracket 560 also includes slots 562 for receiving fasteners 564 to provide vertical and front-to back adjustments. FIG. 75 illustrates a cover 548 placed over the header 512 and a cover 530 placed over the transom 520 to enhance the aesthetics of the aisle containment system 340. The transom cover 530 attaches to the transom 520. The header cover 548 attaches to the door posts 510.

Figure 76:
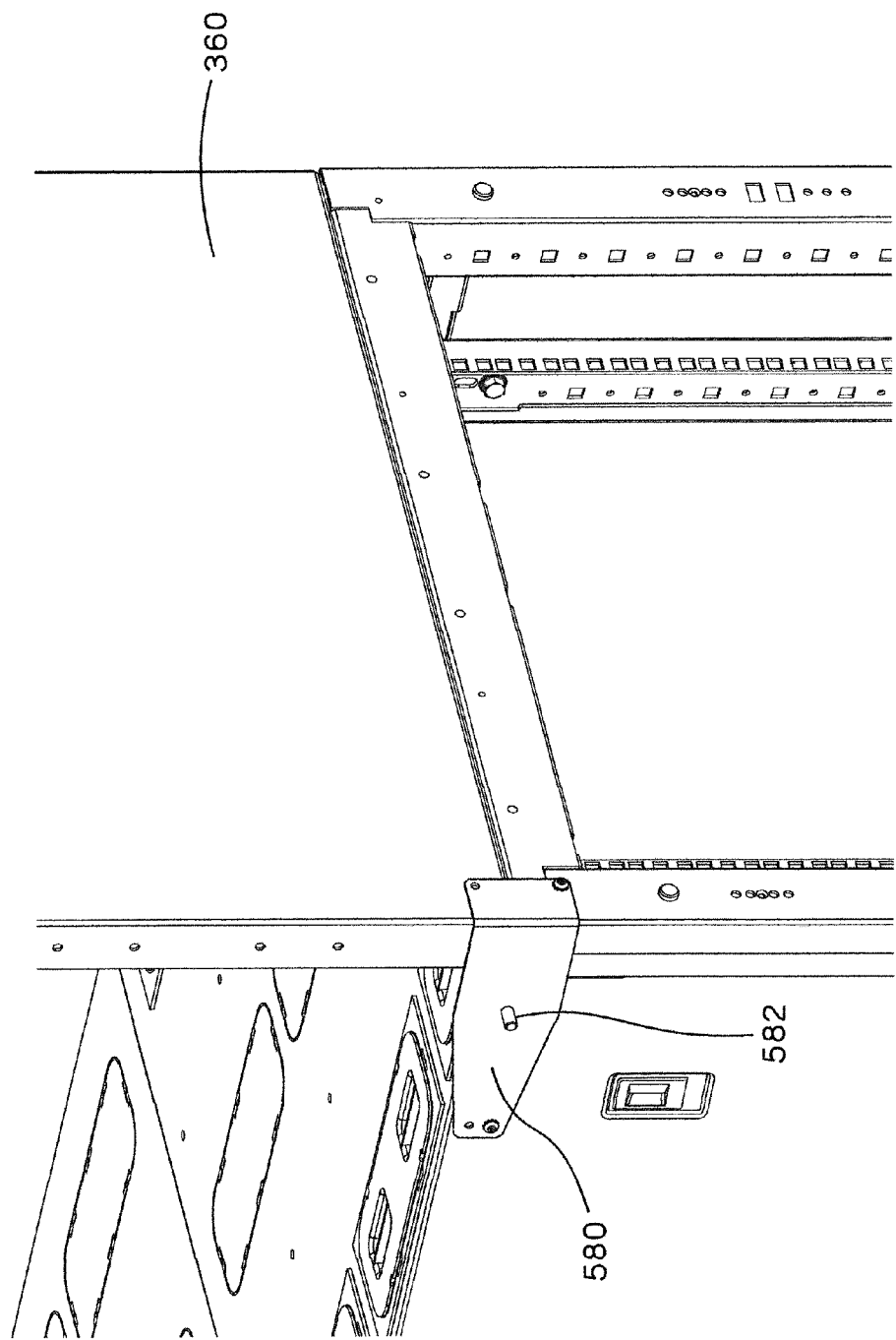
FIG. 76 is a perspective view of an upper bracket attached to the transom for securing the door frame of FIG. 70 to a Net-Serv™ cabinet.
Figure 77:
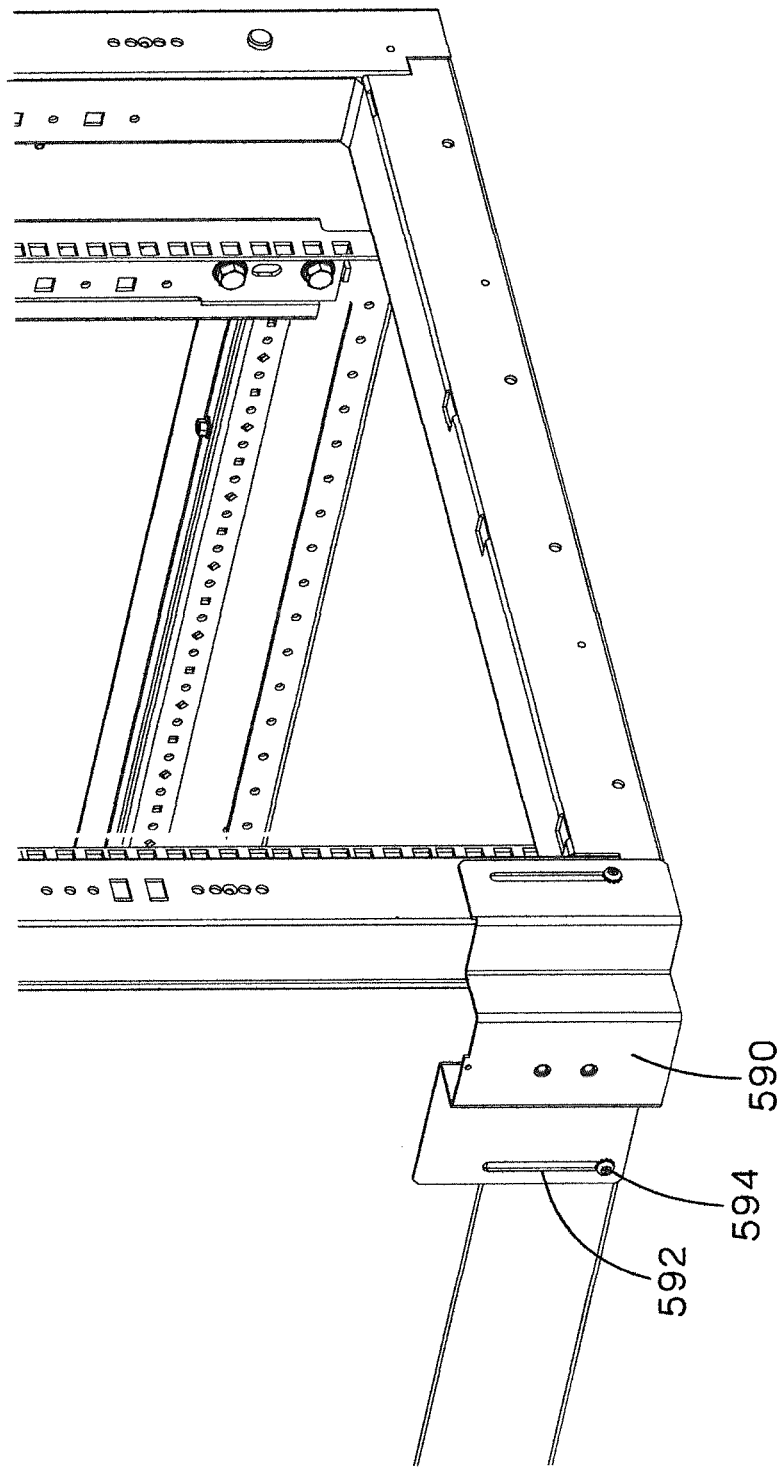
FIG. 77 is a perspective view of a lower bracket for securing the door frame of FIG. 70 to a Net-Serv™ cabinet.

The door frame illustrated and described above with respect to FIG. 64-75 may also be used with Net-Serv™ cabinets. FIG. 76 illustrates an upper bracket 580 and FIG. 77 illustrates a lower bracket 590 used to secure the door frame 508 to a Net-Serv™ cabinet. The upper bracket 580 includes a protruding stud 582 which passes through the slot 526 in the transom 520. The lower bracket 590 is used instead of the side skirt 536 that is illustrated in FIGS. 68-69. The lower bracket 590 includes slots 592 for receiving fasteners 594 to accommodate vertical adjustment of the cabinet via leveling legs or casters. The remainder of the door frame for the Net-Serv™ cabinet is identical to the door frame described above with respect to the Net-Access™ cabinet.

The invention claimed is:

1. An aisle containment system comprising:
a plurality of cabinets having a front, a back, sides, a bottom and a top, wherein the cabinets are arranged in a first row and a second row across from the first row defining an aisle therebetween;
a ceiling structure secured to a front edge of the top of each cabinet, wherein the ceiling structure includes a plurality of vertical panels, each vertical panel having a top flange and a bottom flange, the bottom flange secured to one of the cabinets;
cross aisle tee beams extending across the aisle, wherein at least one end of each cross aisle tee beam is fastened to the top flange of one of the vertical panels, and
a door assembly secured to the end of a cabinet in the first row and the end of a cabinet in the second row, wherein the door assembly extends across the aisle,
whereby the ceiling structure and the door assembly are adjustable for placement with cabinets having varying widths.

2. The aisle containment system of claim 1, wherein the top flange having a plurality of slots that extend a length of the vertical panel, whereby the slots are positioned to enable opposing cabinets to have different widths.

3. The aisle containment system of claim 2, further comprising L-shaped spacer bars having a length and two ends with an extension proximate each end, each extension including a slot for receiving a fastener to secure the spacer bar to the top flange of the vertical panel.

4. The aisle containment system of claim 2, wherein the cross aisle tee beams include a vertical web with flanges extending outwardly therefrom and ends with mounting slots for receiving a fastener to secure the cross aisle tee beam to the top flange of the vertical panel.

5. The aisle containment system of claim 4, further comprising a ceiling panel positioned adjacent each cross aisle tee beam to cover the aisle.

6. The aisle containment system of claim 5, further comprising L-shaped spacer bars secured to the vertical panels, wherein each L-shaped spacer bar fills a gap along the vertical panel between the ceiling panel and the cross aisle tee beam.

7. The aisle containment system of claim 1, further comprising at least one cross aisle tee beam with holes at a center of the cross aisle tee beam and at least one fire suppression cross bracket secured to the cross aisle tee beam at the center holes, wherein the fire suppression cross bracket includes an adjustable bracket with slots for receiving a fastener extending from the fire suppression cross bracket.

8. The aisle containment system of claim 1, wherein the width of the plurality of cabinets is equal.

9. The aisle containment system of claim 1, wherein the width of the plurality of cabinets varies; and vertical blank panels are secured to the ends of the cabinets for equalizing the length of the rows of cabinets.

10. The aisle containment system of claim 1, wherein the door assembly includes a frame secured to the sides of the cabinets at the end of the aisle, a transom secured to the ceiling structure at the end of the aisle and doors secured to the frame for sealing the end of the aisle.

11. The aisle containment system of claim 10, wherein the frame includes a header with a first end and a second end and door posts secured to the ends of the header.

12. The aisle containment system of claim 11, wherein the door posts include a top and a bottom, wherein the bottom having horizontal slots for receiving fasteners to secure the door posts to a lower post support and side skirt, whereby the slots enable the door posts to be adjusted to ensure the door posts are vertical.

13. The aisle containment system of claim 11, further comprising a top post bracket, wherein the top post bracket includes a slot for receiving fasteners to secure the door post to the transom.

14. The aisle containment system of claim 11, further comprising a center bracket with slots for receiving fasteners to secure the transom to the header.

15. The aisle containment system of claim 10, wherein the transom includes a top, bottom and sides, the sides of the transom include horizontal slots for receiving fasteners to mount the transom to the vertical panel secured to the cabinets, whereby the slots enable the transom to be adjusted to extend over the aisle.

16. The aisle containment system of claim 15, further comprising a foam seal positioned between the transom and the vertical panel.

17. The aisle containment system of claim 1, further comprising a side skirt, wherein the side skirt includes a first end and a second end, the second end having a vertical slot for receiving a fastener to mount the side skirt to one of the cabinets.

18. The aisle containment system of claim 17, further comprising a lower post support, the lower post support having horizontal slots for receiving fasteners to secure the lower post support to the first end of the side skirt, whereby the horizontal slots enable the lower post support to be horizontally adjusted.

19. An aisle containment system comprising:
a plurality of cabinets having a front, a back, sides, a bottom and a top, wherein the cabinets are arranged in a first row and a second row across from the first row defining an aisle therebetween;
a ceiling structure secured to a front edge of the top of each cabinet;
at least one cross aisle tee beam with holes at a center of the cross aisle tee beam and at least one fire suppression cross bracket secured to the cross aisle tee beam at the center holes, wherein the fire suppression cross bracket includes an adjustable bracket with slots for receiving a fastener extending from the fire suppression cross bracket; and a door assembly secured to the end of a cabinet in the first row and the end of a cabinet in the second row, wherein the door assembly extends across the aisle, whereby the ceiling structure and the door assembly are adjustable for placement with cabinets having varying widths.

\* \* \* \* \*